US010657893B2

(12) United States Patent
Mitani et al.

(10) Patent No.: US 10,657,893 B2
(45) Date of Patent: May 19, 2020

(54) DISPLAY DEVICE

(71) Applicant: Sharp Kabushiki Kaisha, Sakai, Osaka (JP)

(72) Inventors: Masahiro Mitani, Sakai (JP); Fumiyuki Kobayashi, Sakai (JP); Makoto Yokoyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/477,560

(22) PCT Filed: Jun. 19, 2017

(86) PCT No.: PCT/JP2017/022532
§ 371 (c)(1),
(2) Date: Jul. 12, 2019

(87) PCT Pub. No.: WO2018/235130
PCT Pub. Date: Dec. 27, 2018

(65) Prior Publication Data
US 2019/0371240 A1 Dec. 5, 2019

(51) Int. Cl.
*G01R 31/28* (2006.01)
*G06F 3/038* (2013.01)
(Continued)

(52) U.S. Cl.
CPC ......... *G09G 3/3233* (2013.01); *G09G 3/3266* (2013.01); *G09G 3/3291* (2013.01);
(Continued)

(58) Field of Classification Search
None
See application file for complete search history.

(56) References Cited

U.S. PATENT DOCUMENTS

2005/0119867 A1 6/2005 Shin
2006/0123293 A1* 6/2006 Kim .................... G09G 3/3291 714/724
(Continued)

FOREIGN PATENT DOCUMENTS

JP 2005-157331 A 6/2005
JP 2006-146158 A 6/2006
(Continued)

OTHER PUBLICATIONS

Official Communication issued in International Patent Application No. PCT/JP2017/022532, dated Sep. 19, 2017.

*Primary Examiner* — Carl Adams
(74) *Attorney, Agent, or Firm* — Keating & Bennett, LLP

(57) ABSTRACT

The present application discloses a display device and a driving method thereof using the SSD method capable of charge with the data voltage in the pixel circuit and sufficient internal compensation even if the high resolution of a display image is improved.

m demultiplexers corresponding to m sets of data signal line groups with k data signal lines being one set are provided. Each demultiplexer sets a prescribed period in a period after a time point when to start supplying a data signal output last in each of horizontal intervals among m data signals to a time point before a time point when to end supplying the data signal is set in advance as a delay period, and a scanning line drive circuit starts to select a scanning line corresponding to the pixel circuit to which the prescribed number of data signals are supplied, when the delay period of each of the horizontal intervals ends.

20 Claims, 23 Drawing Sheets

(51) Int. Cl.

| | |
|---|---|
| ***G09G 3/20*** | (2006.01) |
| ***G09G 3/3233*** | (2016.01) |
| ***G09G 3/3266*** | (2016.01) |
| ***G09G 3/3291*** | (2016.01) |

(52) U.S. Cl.
CPC ............... *G09G 2310/0297* (2013.01); *G09G 2320/0626* (2013.01)

(56) References Cited

U.S. PATENT DOCUMENTS

| | | | | |
|---|---|---|---|---|
| 2006/0125738 | A1 | 6/2006 | Kim et al. | |
| 2007/0118781 | A1 | 5/2007 | Kim | |
| 2007/0242016 | A1 | 10/2007 | Choi | |
| 2008/0150844 | A1 | 6/2008 | Choi | |
| 2012/0162185 | A1* | 6/2012 | Park ..................... | G09G 3/3611 345/212 |
| 2016/0125798 | A1 | 5/2016 | Park et al. | |
| 2017/0154562 | A1 | 6/2017 | Hwang et al. | |

FOREIGN PATENT DOCUMENTS

| | | | |
|---|---|---|---|
| JP | 2007-079580 | A | 3/2007 |
| JP | 2007-286572 | A | 11/2007 |
| JP | 2008-158475 | A | 7/2008 |
| JP | 2016-91003 | A | 5/2016 |
| JP | 2016-148710 | A | 8/2016 |

* cited by examiner

DISPLAY DEVICE

TECHNICAL FIELD

The present disclosure relates to a display device and a driving method thereof, and more specifically, relates to a display device including a display element driven by current such as an organic EL display device, and a driving method thereof.

BACKGROUND ART

In recent years, an organic Electro Luminescence (EL) display device has attracted attention as a display device having features such as a thin type, high display quality, and low power consumption, and development thereof has been vigorously advanced. In a display portion of the organic EL display device, arranged in a matrix are pixel circuits including organic EL elements (also referred to as "Organic Light Emitting Diodes") that are self-luminosity type display elements driven by current and drive transistors. As for various display devices including the organic EL display device, as one driving method, a driving method in which data signals generated by a data line driver are demultiplexed and supplied to the predetermined number, that is two or more, of data lines (hereinafter, referred to as a "Source Shared Driving (SSD) method" or a "Demultiplexer method"), is known. Accordingly, in the following description, an organic EL display device as a display device adopting the SSD method is described as an example.

FIG. 22 is a circuit diagram illustrating a connection relationship between pixel circuits and various wiring lines in an organic EL display device adopting the SSD method disclosed in PTL 1. The organic EL display device adopting the SSD method (hereinafter, referred to as an "example in the related art") performs color display of RGB three-primary colors. m×k×n pixel circuits corresponding to intersections between m×k data lines (each of m and k is an integer equal to or more than 2) and n scanning lines (n is an integer equal to or more than 2) are provided. Note that the pixel circuits illustrated in FIG. 22 include a pixel circuit 11*r* corresponding to R (red), pixel circuit 11*g* corresponding to G (green), and a pixel circuit 11*b* corresponding to B (blue).

Respective m output lines di (i=1 to m) connected to an output terminal of a data driver not illustrated correspond to m demultiplexers 41*i*. Each output line di corresponding to each demultiplexer 41*i* is connected to three data lines Dri, Dgi, and Dbi via three selecting transistors Mr, Mg, and Mb, respectively, included in the demultiplexer 41*i*. The selecting transistors Mr, Mg, and Mb all are P-channel type transistors. The selecting transistor Mr turns to an on state in response to a data selection signal ASr when a data signal corresponding to R (hereinafter, referred to as a "R data signal") is to be supplied to the data line Dri. The selecting transistor Mg turns to an on state in response to a data selection signal ASg when a data signal corresponding to G (hereinafter, referred to as a "G data signal") is to be supplied to the data line Dgi. The selecting transistor Mb turns to an on state in response to a data selection signal ASb when a data signal corresponding to B (hereinafter, referred to as a "B data signal") is to be supplied to the data line Dbi. As a result, if the R data signal, the G data signal, and the B data signal are time-divisionally supplied to the output line di, the R data signal, the G data signal, and the B data signal are supplied by the demultiplexer 41*i* to the data line Dri, data line Dgi, and the data line Dbi, respectively. Adopting the SSD method like this can reduce a circuitry scale of the data driver.

In the example in the related art (the organic EL display device disclosed in PTL 1), as illustrated in FIG. 22, data capacitors Cdri, Cdgi, and Cdbi for holding a voltage of the data signal (hereinafter, also referred to as a "data voltage") are connected to the data line Dri, the data line Dgi, and the data line Dbi, respectively. Each pixel circuit includes one organic EL element OLED, six transistors M1 to M6, and two capacitors C1 and C2. The transistors M1 to M6 all are P-channel type transistors. The transistor M1 is a drive transistor for controlling a current to be supplied to the organic EL element OLED. The transistor M2 is a write transistor for writing a voltage of a data signal (data voltage) into the pixel circuit. The transistor M3 is a compensation transistor for compensating variation in a threshold voltage of the driving transistor M1 which causes a luminance unevenness. The transistor M4 is an initialization transistor for initializing a gate voltage Vg of the driving transistor M1. The transistor M5 is a current supply transistor for controlling supply of a H level voltage ELVDD to the pixel circuit. The transistor M6 is a light emission control transistor for controlling a light emission period of the organic EL element OLED. The capacitors C1 and C2 are capacitors for holding a source-gate voltage Vgs of the driving transistor M1. Any of gate terminals of the write transistors M2 in the pixel circuits 11*r*, 11*g*, and 11*b* is connected to a scanning line Sj (j=1 to n).

FIG. 23 is a timing chart illustrating a driving method of a pixel circuit illustrated in FIG. 22. From a time point t1 to a time point t2, the initialization transistor M4 is in the on state so that the gate voltage Vg of the driving transistor M1 is initialized. From the time point t2 to a time point t3, a data signal is supplied to the data line Dri and a voltage of the data signal is held in the data capacitor Cdri. From the time point t3 to a time point t4, a data signal is supplied to the data line Dgi and a voltage of the data signal is held in the data capacitor Cdgi. From a time point t4 to the time point t5, a data signal is supplied to the data line Dbi and a voltage of the data signal is held in the data capacitor Cdbi. At a time point t5, the write transistor M2 and the compensation transistor M3 in each pixel circuit turns to the on state so that the data voltage is given to the gate terminal of the driving transistor M1 via the write transistor M2, the driving transistor M1, and the compensation transistor M3. At this time, the driving transistor M1 turns to a diode-connected state, and the gate voltage Vg of the driving transistor M1 is obtained by Equation (1) below.

$$Vg=V\text{data}-|Vth| \quad (1)$$

where, Vdata represents the data voltage, Vth represents the threshold voltage of the driving transistor M1, Vth<0 holds for the P-channel type transistor, and Vth>0 holds for an N-channel type transistor. Note that the driving transistor M1 in an example in the related art illustrated in FIG. 21 is a P-channel type transistor.

At a time point t6, the write transistor M2 and the compensation transistor M3 turns to an off state, and the current supply transistor M5 and the light emission control transistor M6 turns to the on state. For this reason, a drive current I expressed by Equation (2) below is supplied to the organic EL element OLED so that the organic EL element OLED emits light according to a current value of the drive current I.

$$I=(\beta/2)\cdot(Vgs-Vth)^2 \quad (2)$$

where, β represents a constant, and Vgs represents a source-gate voltage of the driving transistor M1. The source-gate voltage Vgs of the driving transistor M1 is obtained by Equation (3) below.

$$Vgs=(Vdata-|Vth|)-ELVDD=Vdata+Vth-ELVDD \tag{3}$$

Equation (4) below is derived from Equation (2) and Equation (3).

$$I=\beta/2\cdot(V\text{data}-ELVDD)^2 \tag{4}$$

In Equation (4), a term of the threshold voltage Vth is absent. For this reason, the variation in the threshold voltage Vth of the driving transistor M1 is compensated. In this way, in example in the related art, the variation in the threshold voltage of the driving transistor M1 is compensated by a configuration in the pixel circuit. Note that it has been known that the longer a period is set during which the threshold voltage Vth is compensated by putting the driving transistor M1 into the diode-connected state, that is, a scanning line select period SCN during which a scanning signal is in a low level, the more the variation in the threshold voltage Vth of the driving transistor M1 is suppressed.

CITATION LIST

Patent Literature

PTL 1: JP 2007-79580 A
PTL 2: JP 2008-158475 A
PTL 3: JP 2007-286572 A

SUMMARY

Technical Problem

In the above example in the related art (the organic EL display device disclosed in PTL 1), the R data signal, the G data signal, and the B data signal are sequentially supplied to the data line Dri, the data line Dgi, and the data line Dbi, respectively. As illustrated in FIG. 22, a connection destination of the gate terminal of the write transistor M2 is the scanning line Sj in any of the pixel circuit 11*r*, the pixel circuit 11*g*, and the pixel circuit 11*b*. For this reason, if the scanning line Sj is in a select state before starting any of the supply of the R data signal to the data line Dri, the supply of the G data signal to the data line Dgi, and the supply of the B data signal to the data line Dbi, any of the data voltages held in the data line Dri, the data line Dgi, and the data line Dbi may not be able to be written into the capacitor C1.

For example, as illustrated in FIG. 24, if the scanning line Sj is in the select state (the scanning signal is in the low level) before starting the supply of the R data signal to the data line Dri, a voltage of the R data signal (hereinafter, referred to as the "R data voltage in last scanning") which is supplied to the data line Dri when a previous scanning line Sj−1 (referred to as a "preceding scanning line Sj−1") is selected is written into the capacitor C1 via the driving transistor M1. As is seen from FIG. 22, when the scanning line Sj is in the select state, the data line Dri is electrically connected to the capacitor C1 via the driving transistor M1 in the diode-connected state. For this reason, in a case where the voltage of the R data signal (hereinafter, referred to as the "R data voltage in present scanning") which is supplied to the data line Dr when the scanning line Sj is in the select state is lower than the R data voltage in last scanning, the R data voltage in present scanning cannot be written into the capacitor C1. For example, in a case where the R data voltage in last scanning is a voltage corresponding to a luminance close to a minimum luminance (black display), the voltage corresponding to a luminance closed to the minimum luminance, that is, a voltage close to a maximum value is written into the capacitor C1 in the pixel circuit 11*r* from when the scanning line Sj is selected to when the selecting transistor Mr in the demultiplexer 41 is turned on (from when a signal of the scanning line Sj changes to the L level to when the data selection signal ASr changes to the L level) as illustrated in FIG. 24. For this reason, if a voltage corresponding to a relatively high luminance, that is, a voltage Vd2 sufficiently smaller than a maximum value Vd1 is applied as the R data voltage in present scanning to the pixel circuit 11*r*, the driving transistor M1 in the pixel circuit 11*r* turns to the off state, and a voltage of the capacitor C1 thereof (the gate voltage Vg of the driving transistor M1) is maintained at a voltage close to the maximum value.

In order to avoid a data writing failure caused by such a diode-connection, the above example in the related art is configured such that, as illustrated in FIG. 23, the scanning line Sj is in a non-select state in a data period DT during which the R, G, and B data signals are supplied to the data lines Dri, Dgi, and Dbi (i=1 to m), respectively, and after the data period DT elapses, the scanning line Sj turns to the select state (the L level in the example in FIG. 23).

In this way, in the above example in the related art, the R, G, and B data signals are written into the corresponding pixel circuits 11*r*, 11*g*, and 11*b*, respectively, by providing the scanning line select period SCN during which the scanning line Sj is in the select state after the R, G, and B data signals are sequentially written into the data lines Dri, Dgi, and Dbi based on the SSD method. Specifically, in the organic EL display device using the SSD method in which the diode-connection is used to perform internal compensation like the example in the related art, unless after sequentially writing the data signals into a data signal line group such a set of data lines Dri, Dgi, and Dbi is completed, gray scale data (data voltage) indicated by those data signals cannot be written into the pixel circuits 11*r*, 11*g*, and 11*b*, respectively. For this reason, the data voltage may be unlikely to be sufficiently charged to the data-holding capacitor C1 in the pixel circuit If a horizontal interval is shortened with improvement in high resolution of a display image in recent years, a period for writing the data into the data signal line and a select period of the scanning line in the horizontal interval are also shortened, and therefore, such charge shortage is particularly problematic. If the select period of the scanning line is shortened, the luminance unevenness also cannot be sufficiently suppressed by compensating the variation in the threshold voltage of the drive transistor in the pixel circuit.

Therefore, it has been desired to provide a display device and a driving method thereof using the SSD method capable of charge with the data voltage in the pixel circuit and sufficient internal compensation even if the high resolution of a display image is improved.

Solution to Problem

A display device according to an aspect is a display device including a plurality of data lines configured to transmit a plurality of data signals indicating an image to be displayed, a plurality of scanning lines intersecting the plurality of data lines, and a plurality of pixel circuits arranged in a matrix along the plurality of data lines and the plurality of scanning lines, the display device including:

a data line drive circuit including a plurality of output terminals respectively corresponding to a plurality of sets of data line groups, the data line group being obtained by grouping the plurality of data lines with a prescribed number of two or more data lines being used as a set, the data line drive circuit being configured to time-divisionally output a prescribed number of data signals to be transmitted from each output terminal through a prescribed number of data lines corresponding to the output terminal;

an output selecting circuit including a plurality of demultiplexers respectively connected to the plurality of output terminals of the data line drive circuit and respectively corresponding to the plurality of sets of data line groups; and a scanning line drive circuit selectively configured to drive the plurality of scanning lines, wherein each of the plurality of pixel circuits corresponds to any one of the plurality of data lines and corresponds to any one of the plurality of scanning lines, a prescribed period included in a period after a time point when to start supplying a data signal output in each of horizontal intervals last among the prescribed number of data signals to a time point before a time point when to end supplying the data signal is set in advance as a delay period, each demultiplexer demultiplexes the prescribed number of data signals output in each of the horizontal intervals during the horizontal interval and supplies the demultiplexed data signals respectively to the prescribed number of data lines, and the scanning line drive circuit starts to select a scanning line corresponding to the pixel circuit to which the prescribed number of data signals are supplied, when the delay period of each of the horizontal intervals ends.

A driving method according to another aspect is a driving method of a display device, the display device including a plurality of data lines configured to transmit a plurality of data signals indicating an image to be displayed, a plurality of scanning lines intersecting the plurality of data lines, and a plurality of pixel circuits arranged in a matrix along the plurality of data lines and the plurality of scanning lines, the display device including:

a data line drive circuit including a plurality of output terminals respectively corresponding to a plurality of sets of data line groups, the data line group being obtained by grouping the plurality of data lines with a prescribed number of two or more data lines being used as a set, the data line drive circuit being configured to time-divisionally output a prescribed number of data signals to be transmitted from each output terminal through a prescribed number of data lines corresponding to the output terminal;

an output selecting circuit including a plurality of demultiplexers respectively connected to the plurality of output terminals of the data line drive circuit and respectively corresponding to the plurality of sets of data line groups; and a scanning line drive circuit selectively configured to drive the plurality of scanning lines, each of the plurality of pixel circuits corresponding to any one of the plurality of data lines and corresponding to any one of the plurality of scanning lines, each pixel circuit including a display element driven by a current, a holding capacitor configured to hold a voltage controlling a drive current for the display element, and a driving transistor configured to apply the drive current corresponding to the voltage held by the holding capacitor to the display element, and being configured to apply a voltage of a corresponding data line via the driving transistor to the holding capacitor due to the driving transistor in a diode-connected state in a case where a corresponding scanning line is in a select state, the driving method including:

setting a prescribed period included in a period after a time point when to start supplying a data signal output in each of horizontal intervals last among the prescribed number of data signals to a time point before a time point when to end supplying the data signal in advance as a delay period, selecting the prescribed number of data signals output in each of the horizontal intervals during the horizontal interval and supplying the demultiplexed data signals respectively to the prescribed number of data lines, and starting to select a scanning line corresponding to the pixel circuit to which the prescribed number of data signals are supplied, for each timing when the delay period of each of the horizontal intervals ends.

Advantageous Effects of Disclosure

According to an aspect, in the display device adopting the SSD method, for each one horizontal interval, a prescribed number of data signals are sequentially selected and supplied respectively to the prescribed number of data lines, and selecting of the corresponding scanning line is started at a time point which is after a time point when to start supplying the data signal supplied last among a prescribed number of data signals to the corresponding data line and which is before a time point when to end supplying the data signal supplied last. This can avoid the problem of a data writing failure caused by such a diode-connection in the pixel circuit so that an image signal can be written into the pixel circuit, regardless of the level of the image signal to be written. The data period overlaps the scanning line select period, which makes it possible to sufficiently ensure a time for supplying the data signal to the data line. Therefore, the drive current is larger and the luminance of the image is improved when the supplied data signal is the low level, and the drive current decreases and a graver black can be expressed when the supplied data signal is the high level. The scanning line select periods as the compensating periods are the same in the pixels adjacent to each other, and therefore, the luminance unevenness generated between the pixel circuits adjacent to each other can be suppressed.

According to another aspect, effects the same as that of the first aspect are exerted.

BRIEF DESCRIPTION OF DRAWINGS

FIG. 11A is a diagram illustrating a simulation result when the data signal changes from a high level to a low level, and FIG. 11B is a diagram illustrating a simulation result when the data signal changes from the low level to the high level.

FIG. 12A is a diagram illustrating a simulation result when the data signal changes from the high level to the low level, and FIG. 12B is a diagram illustrating a simulation result when the data signal changes from the low level to the high level.

FIG. 13A is a diagram illustrating a simulation result in a case where the data signal changes from the high level to the low level, and FIG. 13B is a diagram illustrating a simulation result in a case where the data signal changes from the low level to the high level.

FIG. 15A is a diagram illustrating a length of a delay period in a case where a data signal is written into a data line connected to a pixel circuit arranged at a position the closest to a demultiplexer, FIG. 15C is a diagram illustrating a length of a delay period in a case where a data signal is written into a data line connected to a pixel circuit arranged at a position the farthest from the demultiplexer, and FIG. 15B is a diagram illustrating a length of a delay period in a case where a data signal is written into a data line connected to a pixel circuit positioned midway between the positions illustrated in FIGS. 15A and 15C.

FIG. 16A is a diagram illustrating a length of a delay period in a case where a data signal is written into a data line connected to a pixel circuit arranged at a position the closest to a demultiplexer, FIG. 16C is a diagram illustrating a length of a delay period in a case where a data signal is written into a data line connected to a pixel circuit arranged at a position the farthest from the demultiplexer, and FIG. 16B is a diagram illustrating a length of a delay period in a case where a data signal is written into a data line connected to a pixel circuit positioned midway between the positions illustrated in FIGS. 16A and 16C.

DESCRIPTION OF EMBODIMENTS

1. Base Study

Before describing an organic EL display device according to the present embodiment, a description is given of a result of a study, as a base study, on an organic EL display device including a pixel circuit which is constituted by a drive transistor diode-connected in response to the scanning signal or the like and adopts an SSD method, a length of a data period that is a period during which a data signal is supplied to a data line, a length of a scanning line select period that is a period during which a scanning signal supplied to a scanning line is active, and an anteroposterior relationship of start time points of those periods. First, configurations of the pixel circuit and a multiplexer are described, and next, a driving method of the pixel circuit is described separately for a driving method in a first base study and a driving method in a second base study. Note that the base study includes the first base study and the second base study which are different in the driving method, but the same pixel circuit and multiplexer of the organic EL display device is used in each base study.

A transistor described below is a P-channel type unless otherwise specifically described, but is not limited to a P-channel type and may be an N-channel type. The transistor is, for example, a Thin Film Transistor (TFT), but is not limited to a TFT. A transistor of P-channel type turns to an on state when a low level potential is applied to a gate terminal and turns to an off state when a high level potential is applied.

1.1 Circuit Configuration of Demultiplexer Portion

Figure 1:
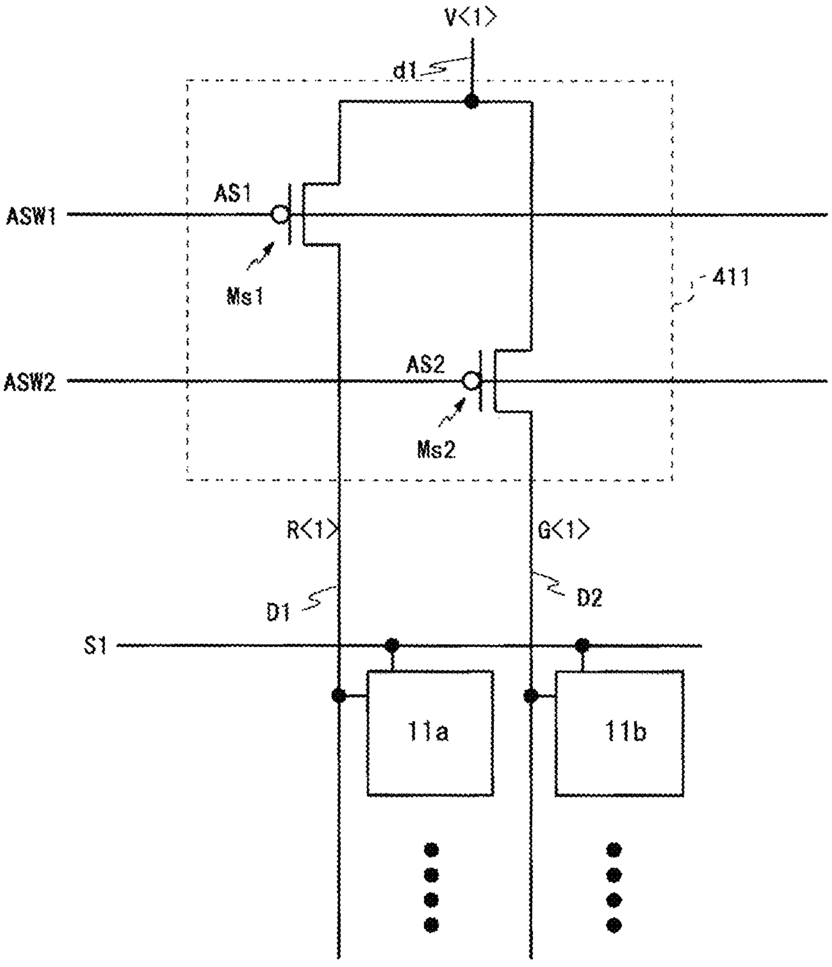
FIG. 1 is a diagram illustrating a connection relationship between a demultiplexer and two pixel circuits.

A description is given of a configuration and action of a demultiplexer achieving the SSD method. An organic EL display device includes generally multiple demultiplexers, but one multiplexer of them is described as an example. FIG. 1 is a diagram illustrating a connection relationship between a demultiplexer 411 and two pixel circuits 11*a* and 11*b*. As illustrated in FIG. 1, the demultiplexer includes two selecting transistors Ms1 and Ms2. A gate terminal of the selecting transistor Ms1 is connected to a data control line ASW1, and a gate terminal of the selecting transistor Ms2 is connected to a data control line ASW2. After an initialization period ends, a data signal V<1> including a data signal to be written into the pixel circuit 11*a* and a data signal to be written into the pixel circuit 11*b* which are time-divided is input to the demultiplexer 411 from a data line driver (not illustrated) via an output line dl. At this time, a data selection signal AS1 applied to the data control line ASW1 changes from a H level to a L level. This allows the data selection signal AS1 of the L level to be applied to the gate terminal of the selecting transistor Ms1 so that the selecting transistor Ms1 turns to the on state and selects the data signal which is included in the data signal V<1> and is to be written into the pixel circuit 11*a* to output the selected signal to the data line D1.

Herein, as for a signal having any of two values of the high level and the low level such as the scanning signal and the data selection signal, the high level is described as the "H level" and the low level is described as the "L level". As for the data signal or data voltage for displaying an image, similarly a low level voltage is referred to as a "low level" and a high level voltage is referred to as a "high level". Herein, the pixel circuit constituted by the P-channel type transistor is mainly described, and therefore, a data voltage level of a 255 gray scale that is a maximum gray scale or a gray scale close thereto (an image of white or having a gray scale value close to white) is referred to as a "low level", and a data voltage level of a 0 gray scale that is a minimum gray scale or a gray scale close thereto (an image of black or having a gray scale value close to black) is referred to as a "high level". On the other hand, in a case of the pixel circuit constituted by the N-channel type transistor, a data voltage level of the 0 gray scale that is the minimum gray scale or a gray scale close thereto (an image of black or having a gray scale value close to black) is referred to as a "low level", and a data voltage level of the 255 gray scale that is the maximum gray scale or a gray scale close thereto (an image of white or having a gray scale value close to white) is referred to as a "high level".

Next, the data selection signal AS1 changes from the L level to the H level, and the data selection signal AS2 to be applied to the data control line ASW2 changes from the H level to the L level. This allows the data selection signal AS2 of the L level to be applied to the gate terminal of the selecting transistor Ms2 so that the selecting transistor Ms2 turns to the on state and selects the data signal which is included in the data signal V<1> and is to be written into the pixel circuit 11*b* to supply the selected signal to the data line D2. Next, when the scanning signal SCAN to be applied to the scanning line changes from the H level to the L level, the data signals supplied to the data lines D1 and D2 are written to the pixel circuits 11*a* and 11*b* connected to the data lines D1 and D2, respectively. Note that the demultiplexer 411 illustrated in FIG. 1 includes two selecting transistors Ms1 and Ms2, but may include three or more selecting transistors.

1.2 Configuration of Pixel Circuit

Figure 2:
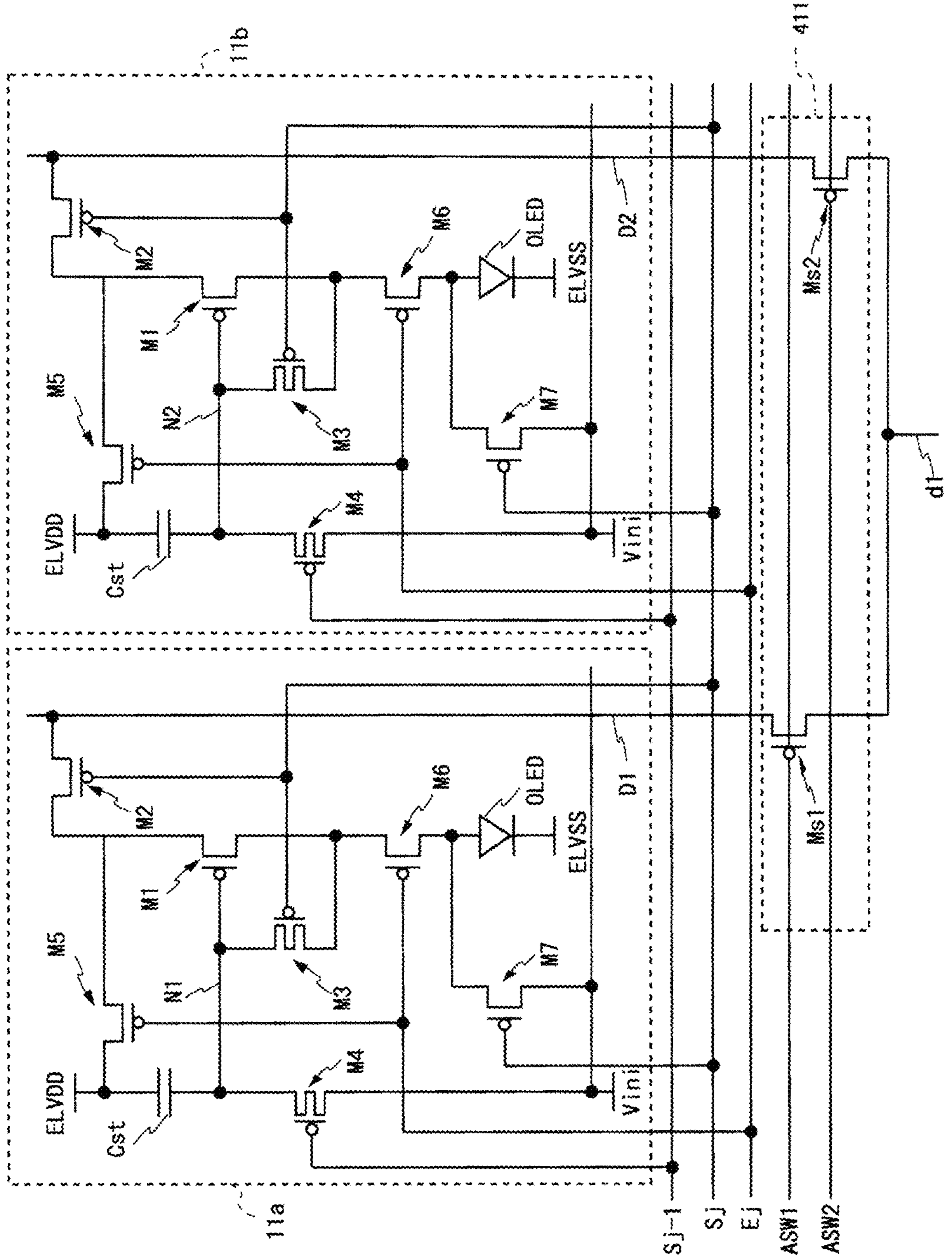
FIG. 2 is a circuit diagram illustrating a connection relationship between two pixel circuits connected to the demultiplexer and various wiring lines.

Next, a description is given of configurations of the pixel circuit 11*a* and the pixel circuit 11*b*. FIG. 2 is a circuit diagram illustrating a connection relationship between two pixel circuits 11*a* and 11*b* connected to the demultiplexer and various wiring lines. As illustrated in FIG. 2, a drain terminal of the selecting transistor Ms1 is connected to the pixel circuit 11*a* via the data line D1, and a drain terminal of the selecting transistor Ms2 is connected to the pixel circuit 11*b* via the data line D2. The pixel circuit 11*a* and the pixel circuit 11*b* have the same configuration, and therefore, the pixel circuit 11*a* is described below unless otherwise specifically described.

The pixel circuit 11*a* includes one organic EL element OLED, seven transistors M1 to M7, and one storage capacitor Cst. To be more specific, the pixel circuit 11*a* includes an organic EL element OLED, a driving transistor M1, a write transistor M2, a compensation transistor M3, a first initialization transistor M4, a current supply transistor M5, a light emission control transistor M6, and a second initialization transistor M7.

The driving transistor M1 includes a gate terminal, a first conduction terminal, and a second conduction terminal. The first conduction terminal of the driving transistor M1 is a conduction terminal connected to a H level power source line ELVDD via the current supply transistor M5, and the second conduction terminal is a conduction terminal connected to the organic EL element OLED via the light emission control transistor M6. In the driving transistor M1, the first conduction terminal and the second conduction terminal respectively serve as a source terminal and a drain terminal, or a drain terminal and a source terminal depending on a flow of a carrier. In the following description, since a hole that is a carrier of the P-channel type transistor flows from the first conduction terminal to the second conduction terminal, the first conduction terminal serves as a source terminal and the second conduction terminal serves as a drain terminal.

On a substrate with the pixel circuits 11*a* and 11*b* formed thereon, a scanning line Sj, a preceding scanning line Sj−1 (also referred to as a "discharge line"), an emission line Ej, a data line Di, a H level power source line ELVDD, a L level power source line ELVSS, and an initialization line Vini, are arranged. The write transistor M2 includes a gate terminal connected to the scanning line Sj and a source terminal connected to the data line Di, and supplies a data signal supplied to the data line Di depending on selection of the scanning line Sj to the first conduction terminal of driving transistor M1.

The first conduction terminal of the driving transistor M1 is connected to the drain terminal of the write transistor M2, and the gate terminal is connected to a node N1. The node N1 is a node point at which the second conduction terminal of the compensation transistor M3 described later is connected to a first terminal of the storage capacitor Cst, and the storage capacitor Cst is charged with a voltage (data voltage) of a data signal applied to the node N1. The driving transistor M1 supplies a drive current I determined depending on the data voltage with which the storage capacitor Cst is charged to the organic EL element OLED.

The compensation transistor M3 is provided between the gate terminal and the second conduction terminal of the driving transistor M1. A gate terminal of the compensation transistor M3 is connected to the scanning line Sj. The compensation transistor M3 is electrically conducted when the scanning line Sj is activated to diode-connect the driving transistor M1. With this configuration, a potential Vn1 of the node N1 is smaller than the data voltage by an absolute value |Vth| of a threshold voltage of the driving transistor M1 as expressed by Equation (5) below. The potential Vn1 of the node N1 is applied as a gate voltage Vg to the gate terminal of the driving transistor M1.

$$Vn1 = Vdata - |Vth| \tag{5}$$

where, Vdata represents the data voltage, Vth represents the threshold voltage of the driving transistor M1, $Vth<0$ holds for the P-channel type transistor, and $Vth>0$ holds for an N-channel type transistor. Note that in the present embodiment, a P-channel type transistor is used for the driving transistor M1.

The first initialization transistor M4 includes a gate terminal connected to the preceding scanning line Sj−1, and is provided between the gate terminal of the driving transistor M1 and the initialization line Vini. The first initialization transistor M4 is electrically conducted when the preceding scanning line Sj−1 is activated and applies an initialization potential Vini to the node N to initialize the potential of the node N1. This allows the initialization potential Vini to be applied to the gate terminal of the driving transistor M1.

The current supply transistor M5 includes a gate terminal connected to the emission line Ej, and is provided between the H level power source line ELVDD and the first conduction terminal of the driving transistor M1. The current supply transistor M5 supplies the H level voltage ELVDD to the first conduction terminal of the driving transistor M1 depending on selection of the emission line Ej.

The light emission control transistor M6 includes a gate terminal connected to the emission line Ej, and is provided between the driving transistor M1 and the second initialization transistor M7. The light emission control transistor M6 makes the second conduction terminal of the driving transistor M1 electrically conduct with the organic EL element OLED depending on the selection of the emission line Ej. With this configuration, the drive current of which a current value is controlled by the driving transistor M1 flows from the driving transistor M1 to the organic EL element OLED.

The second initialization transistor M7 includes a gate terminal connected to the scanning line Sj, and is provided between an anode of the organic EL element OLED and the initialization line Vini. The second initialization transistor M7 applies an initialization signal DIS to the anode of the organic EL element OLED when the scanning line Sj is selected to initialize a potential of the anode.

The first terminal of the storage capacitor Cst is connected to the node N1, and the second terminal is connected to the H level power source line ELVDD. The storage capacitor Cst holds the potential of the node N1 when the compensation transistor M3 and the first initialization transistor M4 are in the off state.

The organic EL element OLED includes the anode (one end of the organic EL element OLED) connected to the second conduction terminal of the driving transistor M1 via the light emission control transistor M6 and a cathode (the other end of the organic EL element OLED) connected to the L level power source line ELVSS, and emits a light, when the drive current supplied from the driving transistor M1 flows therethrough, with a luminance depending on the current value of the drive current. Note that an action of the pixel circuit **11*b* is also the same as the above action of the pixel circuit 11*a***, and a description thereof is omitted.

1.3 Driving Method in First Base Study

Figure 3:
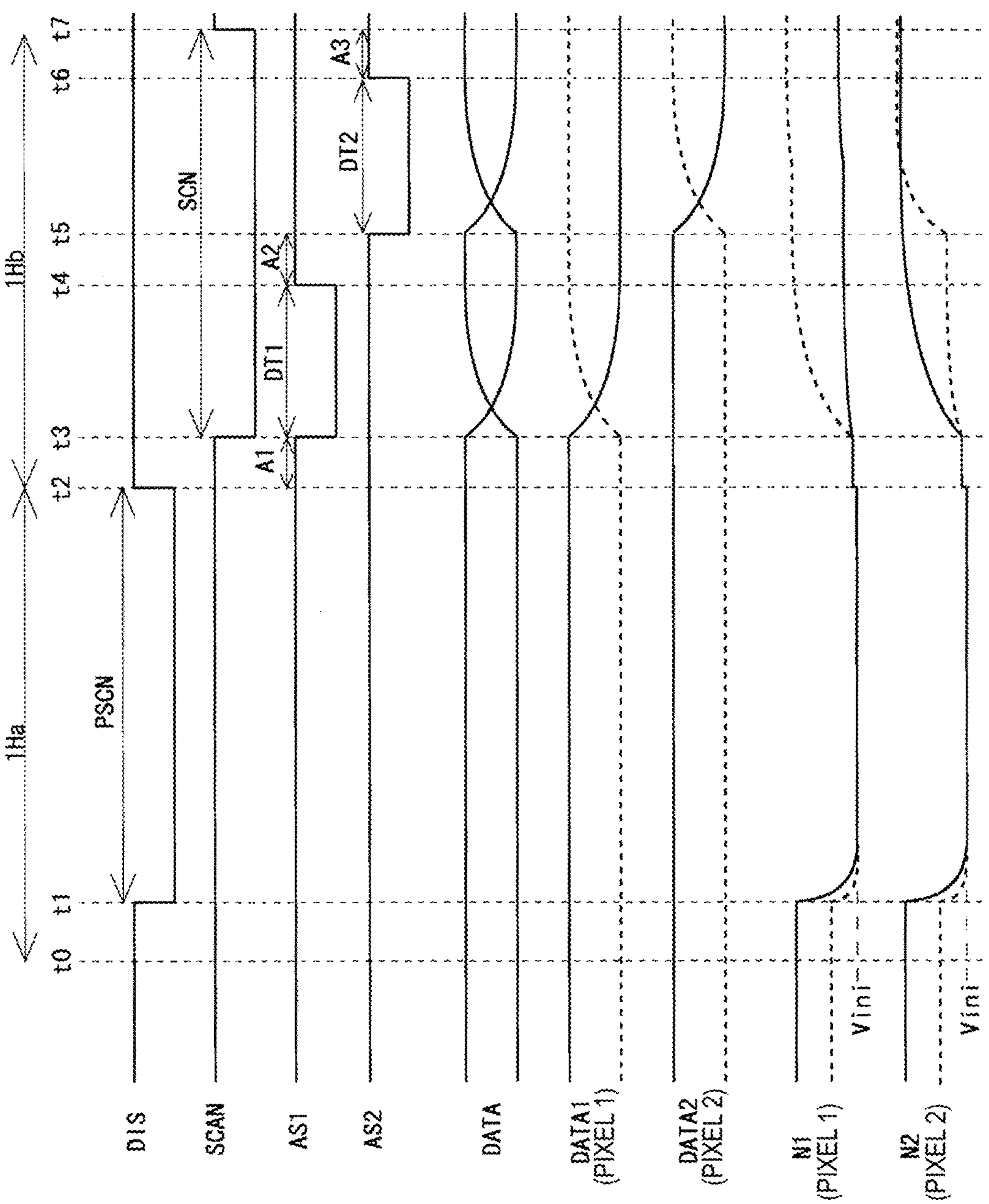
FIG. 3 is a timing chart illustrating a method for driving two pixel circuits in a first base study.

FIG. 3 is a timing chart illustrating a method for driving the pixel circuits **11*a* and 11*b* in the first base study. In the first base study, as illustrated in FIG. 3, the scanning line select period SCN is set to overlap a period during which the data signal is supplied to the data line D1 connected to the pixel circuit 11*a* in the circuit diagram illustrated in FIG. 2 (referred to as a "first data period DT1") and a period during which the data signal is supplied to the data line D2 connected to the pixel circuit 11*b* (referred to as a "second data period DT2"), the scanning line select period SCN being for writing the data signal supplied to the data line D1 into the pixel circuit 11*a* and writing the data signal supplied to the data line D2 into the pixel circuit 11*b***.

In two intervals each being one horizontal interval (1H) described in the timing chart illustrated in FIG. 3, an initialization period PSCN provided to an earlier horizontal interval (referred to as a "first horizontal interval 1Ha") is a period for initializing a potential of the node in the pixel circuit into which the data signal is to be written in a later horizontal interval (referred to as a "second horizontal interval 1Hb"), and is a scanning line select period for writing the data signal in the last scanning.

First, at a time point t1 in the first horizontal interval 1Ha, the initialization signals DIS (also referred to as "discharge signals") supplied to the preceding scanning lines Sj−1 of the pixel circuit **11*a* and the pixel circuit 11*b* change from the H level to the L level. For this reason, the first initialization transistor M4 turns to the on state so that the initialization signal DIS is supplied from the initialization line Vini via the first initialization transistor M4 to the node N1 and applied to the gate terminal of the driving transistor M1. This allows the potential of the node N1 in the pixel circuit 11*a* to be initialized, and therefore, the potential decreases from the data voltage written during the scanning line select period in the last scanning to the initialization potential Vini which is further lower than the low level. Similarly, a potential of a node N2 in the pixel circuit 11*b*** also decreases from the data voltage written in the last scanning to initialization potential Vini which is further lower than the low level. At this time, the initialization signal DIS supplied to the preceding scanning line Sj−1 is a scanning signal applied to the scanning line in the last scanning.

At a time point t2 of transition from the first horizontal interval 1Ha to the second horizontal interval 1Hb, the initialization signal DIS changes from the L level to the H level, and the first initialization transistor M4 turns to the off state. At a time point t3, the scanning signal SCAN supplied to the scanning line Sj changes from the H level to the L level, and maintains the L level until a time point t7. With this configuration, the write transistor M2 and the compensation transistor M3 are in the on state from the time point t3 to the time point t7. At the same time, the data selection signal AS1 supplied to the data control line ASW1 changes from the H level to the L level so that the selecting transistor Ms1 turns to the on state and the data signal to be written into the pixel circuit **11*a*** is supplied to the data line D1.

At this time, the write transistor M2 and the compensation transistor M3 in the pixel circuit **11*a* are in the on state, and thus the data signal supplied to the data line D1 is applied to the node N1 via the write transistor M2, the driving transistor M1, and the compensation transistor M3. This allows the potential of the node N1 in the pixel circuit 11*a* to rise from the initialization potential Vini to a potential Vn1 expressed by Equation (5) described above during a period from the time point t3 to the time point t7 when the scanning line select period SCN ends. On the other hand, from the time point t3 to the time point t5, the data signal written in the last scanning is held in the data line D2 in the pixel circuit 11*b*. For this reason, the data signal held in the data line D2 during a period from the time point t3 to the time point t5 in the scanning line select period SCN is written into the initialized node N2 in the pixel circuit 11*b*. At the time point t4**, the data selection signal AS1 supplied to the data control line ASW1 changes from the L level to the H level so that the selecting transistor Ms1 turns to the off state.

At the time point t5, the data signal to be written into the pixel circuit **11*b* is applied from the data line driver to the demultiplexer 411. The data selection signal AS2 supplied to the data control line ASW2 changes from the H level to the L level so that the selecting transistor Ms2 turns to the on state and data signal to be written into the pixel circuit 11*b*** is supplied from the output line dl via the selecting transistor Ms2 to the data line D2 during the second data period DT2 from the time point t5 to the time point t6.

At this time, the scanning signal SCAN maintains the L level continuously from the time point t3, and therefore, the write transistor M2 and the compensation transistor M3 in the pixel circuit 11*b* continue to be in the on state. However, as described above, during the period from the time point t3 to the time point t5 in the scanning line select period SCN, the potential of the node N2 in the pixel circuit 11*b* rises from the initialization potential Vini. For this reason, in a case where a potential of the data signal to be written into the pixel circuit 11*b* is higher than the potential already written, the data signal corresponding to only a difference of the potentials is written into the node N2 during the period from the time point t5 to the time point t6, and in a case of being lower than the potential already written, the data signal is not written into the node N2 as described later.

At the time point t6, the data selection signal AS2 changes from the L level to the H level so that the selecting transistor Ms2 turns to the off state. This ends the second data period DT2. Furthermore, at the time point t7, the scanning signal SCAN changes from the L level to the H level so that the second horizontal interval 1Hb ends. Note that the data signals supplied to the data line D1 and the data line D2 are held in the data line D1 and the data line D2, respectively, until new data signals to be written in the next scanning are supplied.

1.4 Problem in Case of First Base Study

The driving method described in the first base study has two problems. First, a first problem is described. In the timing chart illustrated in FIG. 3, focusing on the pixel circuit 11*b*, when the scanning signal SCAN changes from the H level to the L level at the time point t3, the data signal written in the last scanning remains in the data line D2. For this reason, during the period from the time point t3 to the time point t4, the data signal is written into the node N1 in the pixel circuit 11*a*, and the data signal written in the last scanning and remaining in the data line D2 is written into the node N2 in the pixel circuit 11*b*. At this time, in a case where the data signal held in the data line D2 is a data signal of the high level (level at which an image of black or having a gray scale value close to black is displayed), that high level data signal is written into the node N2. This causes a voltage of the gate terminal of the driving transistor M1 to be the high level and the driving transistor M1 to turn to the off state.

Furthermore, in a case where the data signal supplied to the data line D2 during the second data period DT2 from the time point t5 to the time point t6 that is a rest of the scanning line select period SCN is a data signal of the low level (level at which an image of black or having a gray scale value close to black is displayed), even if the write transistor M2 turns to the on state and low level data signal is applied from the data line D2 to the first conduction terminal of the driving transistor M1, a voltage of the gate terminal of the driving transistor M1 remains at the high level, and thus, the driving transistor M1 maintains the off state. As a result, since the low level data signal supplied to the data line D2 cannot be written into the node N2, an image in accordance with that data signal cannot be displayed.

Note that in FIG. 3, the data signal is written into the pixel circuit 11*a* at the time point t3 when the scanning signal SCAN changes from the H level to the L level, and therefore, the problem as above does not occur in the pixel circuit 11*a*. However, in a case where the time point when the scanning signal SCAN changes from the H level to the L level is earlier than the time point when the data signal is written into the pixel circuit 11*a*, the similar problem occurs also in the pixel circuit 11*a*.

Next, a second problem is described. At the time point t3 illustrated in FIG. 3, at the same time as when the scanning signal SCAN changes from the H level to the L level, the data signal is written from the data line D1 into the pixel circuit 11*a*, and a "data writing and threshold compensating period" (hereinafter, also referred to as a "compensating period") for compensating a threshold voltage of the driving transistor M1 also starts from the time point t3. In contrast, from the time point t5, the data signal to be written into the pixel circuit 11*b* is written from the data line D2, and therefore, a compensating period for the pixel circuit 11*b* starts from the time point t5.

The scanning signal SCAN maintains the L level until the time point t7. For this reason, a compensating period for the pixel circuit 11*a* is a period from the time point t3 to the time point t7, and is longer as compared with the period from the time point t5 to the time point t7 that is the compensating period for the pixel circuit 11*b*. As a result, a data voltage written into the node N1 in the pixel circuit 11*a* is at or higher than a prescribed level, but a data voltage written into the node N2 in the pixel circuit 11*b* may not be under a prescribed level in some cases. In this case, since current values of a drive current for the pixel circuit 11*a* and a drive current for the pixel circuit 11*b* are different from each other, the luminance unevenness is generated between the pixel circuits adjacent to each other.

1.5 Driving Method in Second Base Study

The problems described in the first base study occur because the scanning line select period is set to overlap both the first data period and the second data period. Then, in the second base study, the first data period, the second data period, and the scanning line select period are set not to overlap each other.

Figure 4:
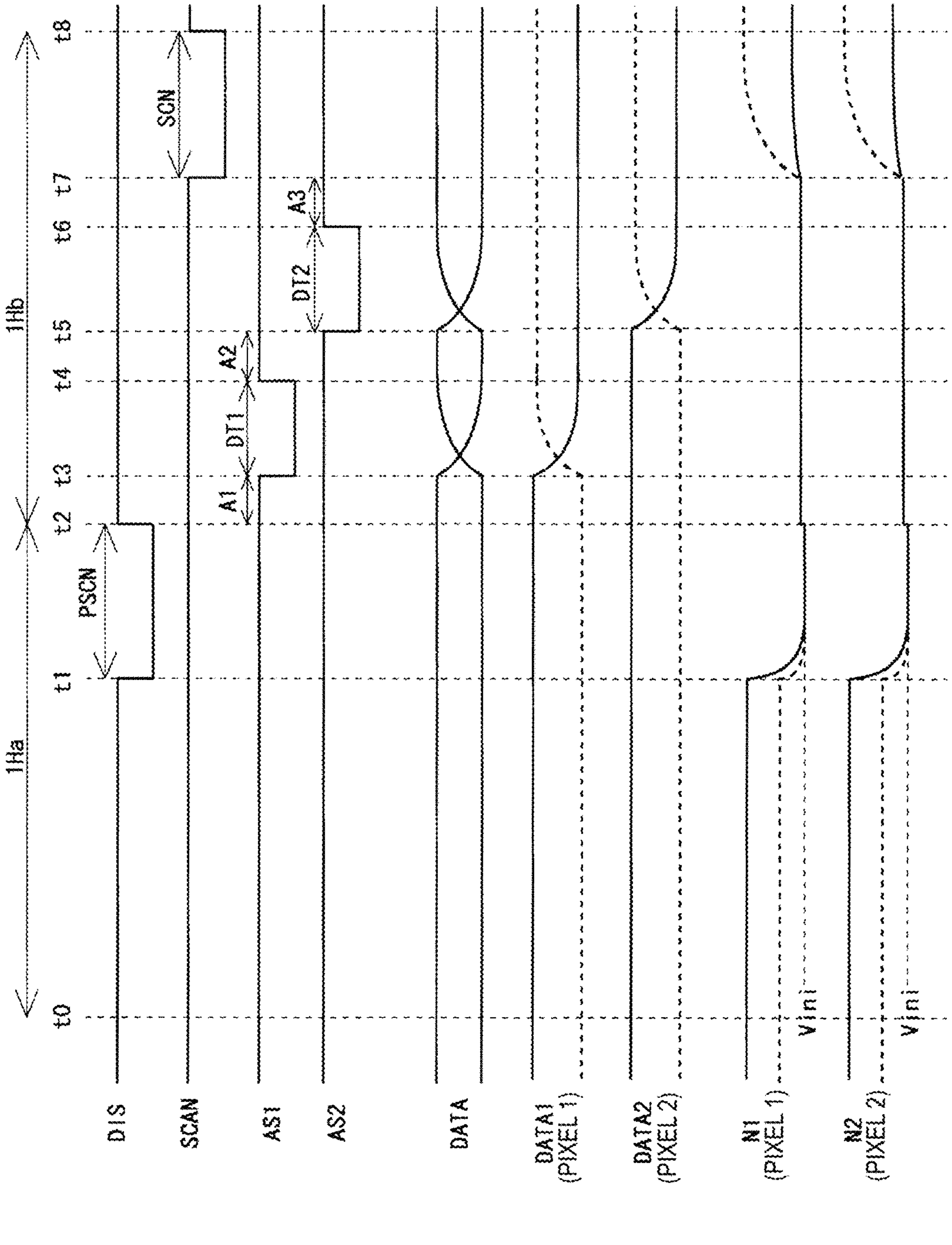
FIG. 4 is a timing chart illustrating a method for driving two pixel circuits in a second base study.

FIG. 4 is a timing chart illustrating a method for driving the pixel circuits 11*a* and 11*b* in second base study. The timing chart illustrated in FIG. 4 includes parts common to the timing chart illustrated in FIG. 3, and a description of the common parts is omitted and different parts are described. In FIG. 3, at the time point t3, the scanning signal SCAN supplied to the scanning line changes from the H level to the L level, and maintains the L level until the time point t7. For this reason, the scanning signal SCAN maintains the L level from the time point t3 when the first data period DT1 starts to the time point t7 which is later than the time point t6 when the second data period DT2 ends.

In contrast, in the timing chart illustrated in FIG. 4, the scanning signal SCAN maintains the H level during the period from the time point t3 to the time point t4 that is the first data period DT1 for the pixel circuit 11*a* and the period from the time point t5 to the time point t6 that is the second data period DT2 for the pixel circuit 11*b*.

In the scanning line select period SCN, when the scanning signal SCAN changes from the H level to the L level at the time point t7, the write transistor M2 and the compensation transistor M3 in the pixel circuit 11*a* turn to the on state. With this configuration, in the pixel circuit 11*a*, the data signal held in the data line D1 is written into the node N1 via the write transistor M2, the driving transistor M1, and the compensation transistor M3. As a result, the potential of the node N1 starts rising from the initialization potential Vini at the time point t7 and rises until the time point t8.

In the pixel circuit 11*b* also, the data signal held in the data line D2 is written into the node N2 via the write transistor M2, the driving transistor M1, and the compensation transistor M3. With this configuration, the potential of the node N2 starts rising from initialization potential Vini at the time point t7 and rises until the time point t8. In this way, during the scanning line select period SCN from the time point t7 to the time point t8, the data signal to be written into the pixel circuit 11a is written from data line D1 into the node N1 in the pixel circuit 11a, and at the same time, the data signal to be written into the pixel circuit 11b is written from the data line D2 into the node N2 in the pixel circuit 11b.

1.6 Problem in Second Base Study

The driving method described in the second base study has problems as below. In the second base study, the first data period DT1 during which the data signal to be written into the pixel circuit 11a is supplied to the data line D1, the second data period DT2 during which the data signal to be written into the pixel circuit 11b is supplied to the data line D2, and the scanning line select period SCN during which the data signals are written from the data line D1 and data line D2 respectively into the pixel circuit 11a and the pixel circuit 11b are set not to overlap each other.

However, a length of the second horizontal interval 1Hb depends on a resolution of the display device (the number of scanning lines). Particularly, in recent years, the one horizontal interval is shortened with the improvement in the high resolution of the display image, and in this case also, the first data period DT1, the second data period DT2, and the scanning line select period SCN are constrained to be within the second horizontal interval 1Hb. For this reason, in a case where the scanning line select period SCN is lengthened, the first and second data periods DT1 and DT2 are shortened. As a result, before the voltages of the data lines D1 and D2 becomes desired data voltages or higher which are desired actually to be written, the first and second data periods DT1 and DT2 may end in some cases. In this case, since the charges of the data lines D1 and D2 is insufficient, data voltages having voltage values lower than the data voltages which are desired actually to be written are written into the nodes N1 and N2 in the pixel circuits 11a and the pixel circuit 11b, respectively.

On the other hand, in a case where the scanning line select period SCN is shortened, the first and second data periods DT1 and DT2 can be lengthened, and therefore, the charge shortages in the data line D1 or D2 are resolved. However, the scanning line select period SCN during which the data signals supplied to the data lines D1 and D2 are written into the nodes N1 and N2 in the pixel circuit 11a and the pixel circuit 11b, respectively, is shortened. For this reason, a data voltage having a voltage value lower than the data voltage which is desired actually to be written is written into each of the nodes N1 and N2. In addition, the scanning line select period SCN is a compensating period for compensating the variation in the threshold voltage Vth of the driving transistor M1, and therefore, in a case where the scanning line select period SCN is shortened, the compensating period cannot be sufficiently ensured and the suppression of the luminance unevenness is insufficient.

As described above, the driving methods in the first base study and the second base study include the problems. Accordingly, embodiments capable of solving these problems are described below.

2. First Embodiment 2.1 Entire Configuration

Figure 5:
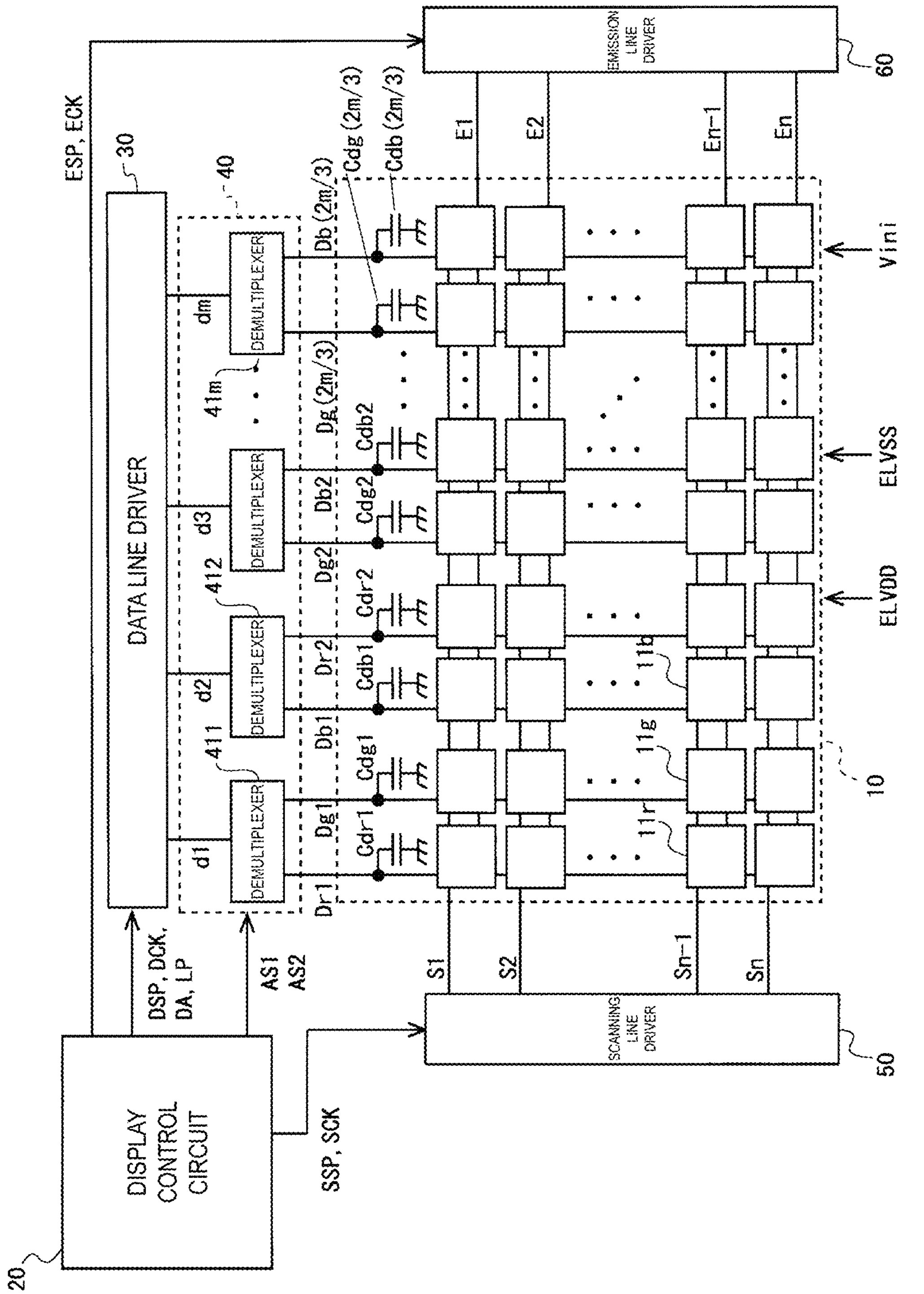
FIG. 5 is a block diagram illustrating an entire configuration of an organic EL display device according to a first embodiment.

FIG. 5 is a block diagram illustrating an entire configuration of an organic EL display device according to a first embodiment. The organic EL display device is an active matrix type display device capable of color display of RGB three-primary colors. As illustrated in FIG. 5, the organic EL display device includes a display portion 10, a display control circuit 20, a data line driver 30, an output selecting circuit 40, a scanning line driver 50, and an emission line driver 60. The organic EL display device is a display device adopting the SSD method for supplying the data signals to the data lines from the data line driver 30 via the output selecting circuit 40. In the present embodiment, the data line drive circuit is realized by the data line driver 30 and the scanning line drive circuit is realized by the scanning line driver 50.

The display portion 10 includes m×2 data lines (m represents an integer equal to or more than 2) arranged in the display portion. To be more specific, data lines Dr1 to Dr(2m/3), data lines Dg1 to Dg(2m/3), and data lines Db1 to Db(2m/3) are arranged, and further, n scanning lines S1 to Sn perpendicular to these data lines are arranged. The display portion 10 is provided with the pixel circuit 11r, 11g, or 11b at every intersection between each data line and each scanning line. To be more specific, (2/3)m×n pixel circuits 11r are provided corresponding to the intersections between (2m/3) data lines Dr1 to Dr(2m/3) and n scanning lines Si to Sn, (2/3)m×n pixel circuits 11g are provided correspondingly to the intersections between (2m/3) data lines Dg1 to Dg(2m/3) and n scanning lines Si to Sn, and (2/3)m×n pixel circuits 11b are provided correspondingly to the intersections between (2m/3) data lines Db1 to Db(2m/3) and n scanning lines S1 to Sn. Therefore, the display portion 10 is provided with 2×m×n pixel circuits in total.

The display portion 10 includes emission lines E1 to En arranged therein as n control lines in parallel with n scanning lines S1 to Sn. The data lines Dr1 to Dr(2m/3), Dg1 to Dg(2m/3), and Db1 to Db(2m/3) are connected to the output selecting circuit 40. n scanning lines S1 to Sn are connected to the scanning line driver 50. n emission lines E1 to En are connected to the emission line driver 60.

The display portion 10 includes a power source line arranged in the display portion, the power source line being common to the pixel circuits 11r, 11g, and 11b. To be more specific, a power source line (hereinafter, referred to as a "H level power source line", and designated by a reference sign "ELVDD" similarly to the H level voltage) for supplying the H level voltage ELVDD for driving the organic EL element described later (also referred to as a "display element driven with current") and a power source line (hereinafter, referred to as a "L level power source line", and designated by a reference sign "ELVSS" similarly to the L level voltage) for supplying the L level voltage ELVSS for driving the organic EL element, are arranged. Furthermore, an initialization line (designated by a reference sign "Vini" similarly to the initialization potential) for supplying the initialization potential Vini for an initialization action described later, is arranged. These potentials are supplied from a power source circuit (not illustrated). In the present embodiment, a first power source line is realized by the H level power source line ELVDD and a second power source line is realized by the L level power source line ELVSS.

2m/3 data lines Dr1 to Dr(2m/3) are connected with 2m/3 data capacitors Cdr1 to Cdr(2m/3), respectively. 2m/3 data lines Dg1 to Dg(2m/3) are connected with 2m/3 data capacitors Cdg1 to Cdg(2m/3), respectively. 2m/3 data lines Db1 to Db(2m/3) are connected with 2m/3 data capacitors Cdb1 to Cdb(2m/3), respectively. Note that one end (to which the data line is not connected) of the data capacitor is grounded, for example, but the disclosure is not limited thereto. The data capacitors Cdr1 to Cdr(2m/3), the data capacitors Cdg1 to Cdg(2m/3), and the data capacitors Cdb1 to Cdb(2m/3) may be collectively referred to as data capacitance elements.

Note that one end (to which the data line is not connected) of the data capacitor is grounded, for example, but is not limited thereto. The data capacitor may be configured to include the above data capacitor and a parasitic capacitance of the data lines, or may be configured to include only a parasitic capacitance of the data lines. As described above, the data capacitance element herein includes at least the parasitic capacitance.

The display control circuit 20 outputs various control signals to the data line driver 30, the output selecting circuit 40, the scanning line driver 50, and the emission line driver 60. To be more specific, the display control circuit 20 outputs a data start pulse DSP, a data clock DCK, display data DA, and a latch pulse LP to the data line driver 30. The display data DA includes R data, G data, and B data. The display control circuit 20 also outputs the data selection signals AS1 and AS2 to the output selecting circuit 40. The display control circuit 20 also output a scan start pulse SSP and a scan clock SCK to the scanning line driver 50. The display control circuit 20 further outputs an emission start pulse ESP and an emission clock ECK to the emission line driver 60.

The data line driver 30 includes an m-bit shift register, a sampling circuit, a latch circuit, m D/A converters, and the like which are not illustrated. The shift register includes m bistable circuits cascade-connected with each other, and synchronizes the data start pulse DSP supplied to the first stage with the data clock DCK and transfers the resultant to output the sampling pulses from respective stages. At an output timing of the sampling pulse, the display data DA is supplied to the sampling circuit. The sampling circuit stores the display data DA in accordance with the sampling pulse. When the display data DA of one row is stored in the sampling circuit, the display control circuit 20 outputs the latch pulse LP to the latch circuit. The latch circuit, on receiving the latch pulse LP, holds the display data DA stored in the sampling circuit. The D/A converters, which are provided correspondingly to m output lines dl to dm respectively connected to m output terminals (not illustrated) of the data line driver 30, convert the display data DA held by the latch circuit into the data signals that are analog voltage signals, and supplies the obtained data signals to the output lines dl to dm. Since the display device according to the present embodiment performs the color display of RGB three-primary colors and adopts the SSD method, the R data signal, the G data signal, the B data signal are time-divisioned and output to the output lines.

The output selecting circuit 40 includes m demultiplexers 411 to 41*m*. For example, an input terminal of the demultiplexer 411 is connected to one output line dl. The demultiplexer 411 includes two output terminals and the output terminals are connected to the data lines Dr1 and data line Dg1, respectively. An action of the demultiplexer 411 is controlled by the data selection signal AS1 and the data selection signal AS2, and the time-divisionally supplied R data signal and G data signal are supplied from two output terminals to the data line Dr1 and the data line Dg1, respectively.

Similarly, the demultiplexer 412 is controlled by the data selection signal AS1 and the data selection signal AS2, and the time-divisionally supplied B data signal and R data signal are supplied from two output terminals to the data line Db1 and the data line Dr2, respectively. In this way, in the display device adopting the SSD method, the number of output lines connected to the data line driver 30 can be reduced as compared with a case not adopting the SSD method, and for example, in the above case, the number of output lines can be reduced from 2m to m.

The scanning line driver 50 drives n scanning lines S1 to Sn. To be more specific, the scanning line driver 50 includes a shift register, a buffer, and the like not illustrated in the drawings. The shift register sequentially transfers the scan start pulse SSP in synchronization with the scan clock SCK. The scanning signals which are outputs from respective stages of the shift register are sequentially supplied through the buffer to the corresponding scanning lines Si to Sn. Pixels consisting of 2m pixel circuits connected to the scanning line Sj are collectively selected by the active scanning signal (at the L level in the present embodiment).

The emission line driver 60 drives n emission lines E1 to En. To be more specific, the emission line driver 60 includes a shift register, a buffer, and the like not illustrated in the drawings. The shift register sequentially transfers the emission start pulse ESP in synchronization with the emission clock ECK. Each of emission signals which are outputs from respective shift registers is supplied through the buffer to the corresponding emission line Ej.

FIG. 5 illustrates, as an example, the organic EL display device in which the scanning line driver 50 is located on one end of the display portion 10 (on a left side of the display portion 10 illustrated in FIG. 5), and the emission line driver 60 is located on the other end of the display portion 10 (on a right side of the display portion 10 illustrated in FIG. 5). However, the location is not limited to this, and for example, a both-sides input structure may be used in which the scanning line driver 50 and the emission line driver 60 are located on both sides of the display portion 10. Note that in the present embodiment, a "prescribed number of data lines" refers to two data lines selected from the respective RGB data lines Dr, Dg, and Db, and a "prescribed number of data signals" refers to two data signals selected from the respective RGB data signals.

2.2 Configuration of Demultiplexer

Figure 6:
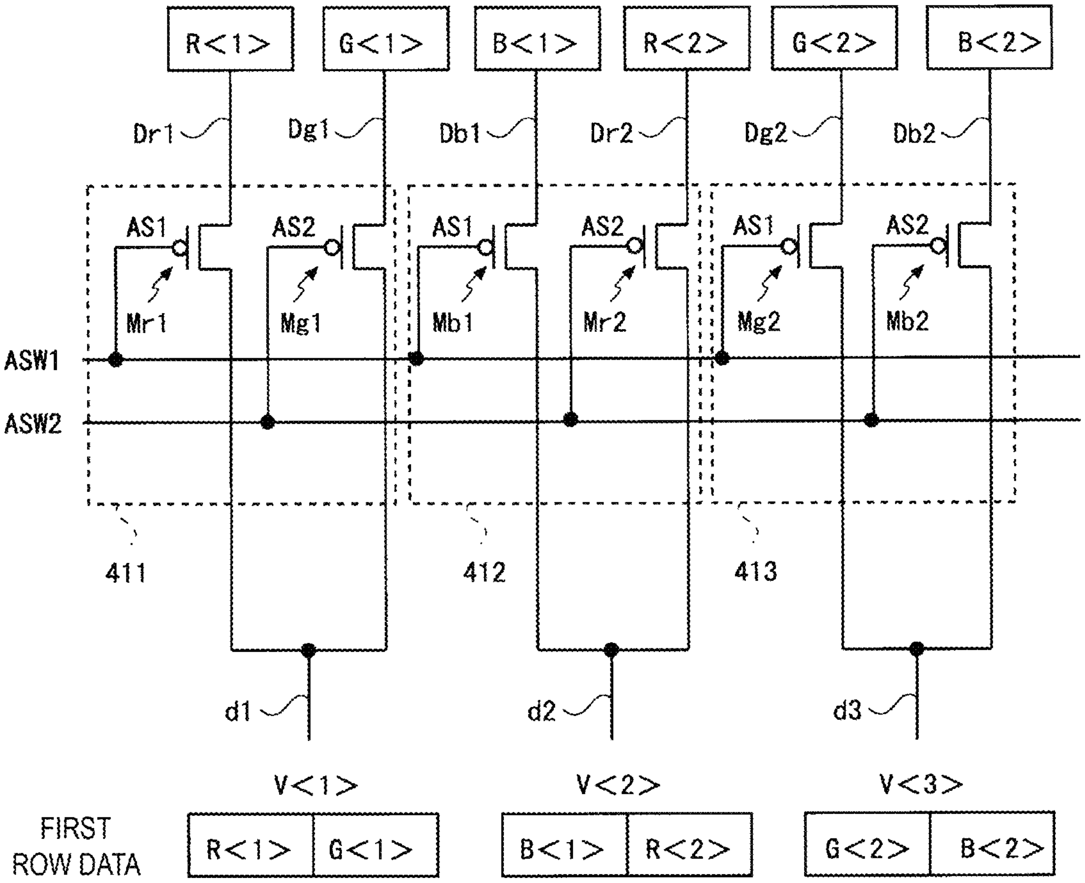
FIG. 6 is a circuit diagram illustrating a configuration of a demultiplexer included in an output selecting circuit of the organic EL display device illustrated in FIG. 5.

FIG. 6 is a circuit diagram illustrating configurations of some demultiplexers 411 to 413 included in the output selecting circuit 40 of the organic EL display device illustrated in FIG. 5. The demultiplexers 411 to 413 are provided between the output lines dl to d3 extending from the data line driver 30 and the data lines Dr1 to Db2, respectively.

For example, a description is given of a case that the data signal V<1> including a data signal R<1> and a data signal G<1> which are time-divisioned is applied from the data line driver (not illustrated) to the demultiplexer 411, and a data signal V<2> including a data signal B<1> and a data signal R<2> which are time-divisioned is applied to the demultiplexer 412, and a data signal V<3> including a data signal G<2> and a data signal B<2> which are time-divisioned is applied to the multiplexer 413.

As illustrated in FIG. 6, the demultiplexer 411 includes a selecting transistor Mr1 and a selecting transistor Mg1, the demultiplexer 412 includes a selecting transistor Mb1 and a selecting transistor Mr2, and the demultiplexer 413 includes a selecting transistor Mg2 and a selecting transistor Mb2. When the data selection signal AS1 of the L level is applied from the data control line ASW1 to each of gate terminals of the selecting transistors Mr1, Mb1, and Mg2, the selecting transistor Mr1 selects the data signal R<1> from the data signal V<1> to output to the data line Dr1, the selecting transistor Mb1 selects the data signal B<1> from the data signal V<2> to output to the data line Db1, and the selecting transistor Mg2 selects the data signal G<2> from the data signal V<3> to output to the data line Dg2. Similarly, when the data selection signal AS2 of the L level is applied from the data control line ASW2 to each of gate terminals of the selecting transistors Mg1, Mr2, and Mb2, the selecting transistor Mg1 selects the data signal G<1> from the data signal V<1> to output to the data line Dg1, the selecting transistor Mr2 selects the data signal R<2> from the data signal V<2> to output to the data line Dr2, and the selecting transistor Mb2 selects the data signal B<2> from the data signal V<3> to output to the data line Db2. In this way, the demultiplexer 411 outputs the data signal R<1> to the data line Dr1 and outputs the data signal G<1> to the data line Dg1. The demultiplexer 412 outputs the data signal B<1> to the data line Db1 and outputs the data signal R<2> to the data line Dr2. The demultiplexer 413 outputs the data signal G<2> to the data line Dg2 and outputs the data signal B<2> to the data line Db2. Note that a configuration of each of the pixel circuits 11*r*, 11*g*, and 11*b* respectively connected to the demultiplexers 411 to 413 is the same as the configuration of the pixel circuit 11*a* or 11*b* illustrated in FIG. 2, and therefore, the description thereof is omitted.

2.3 Driving Method

Figure 7:
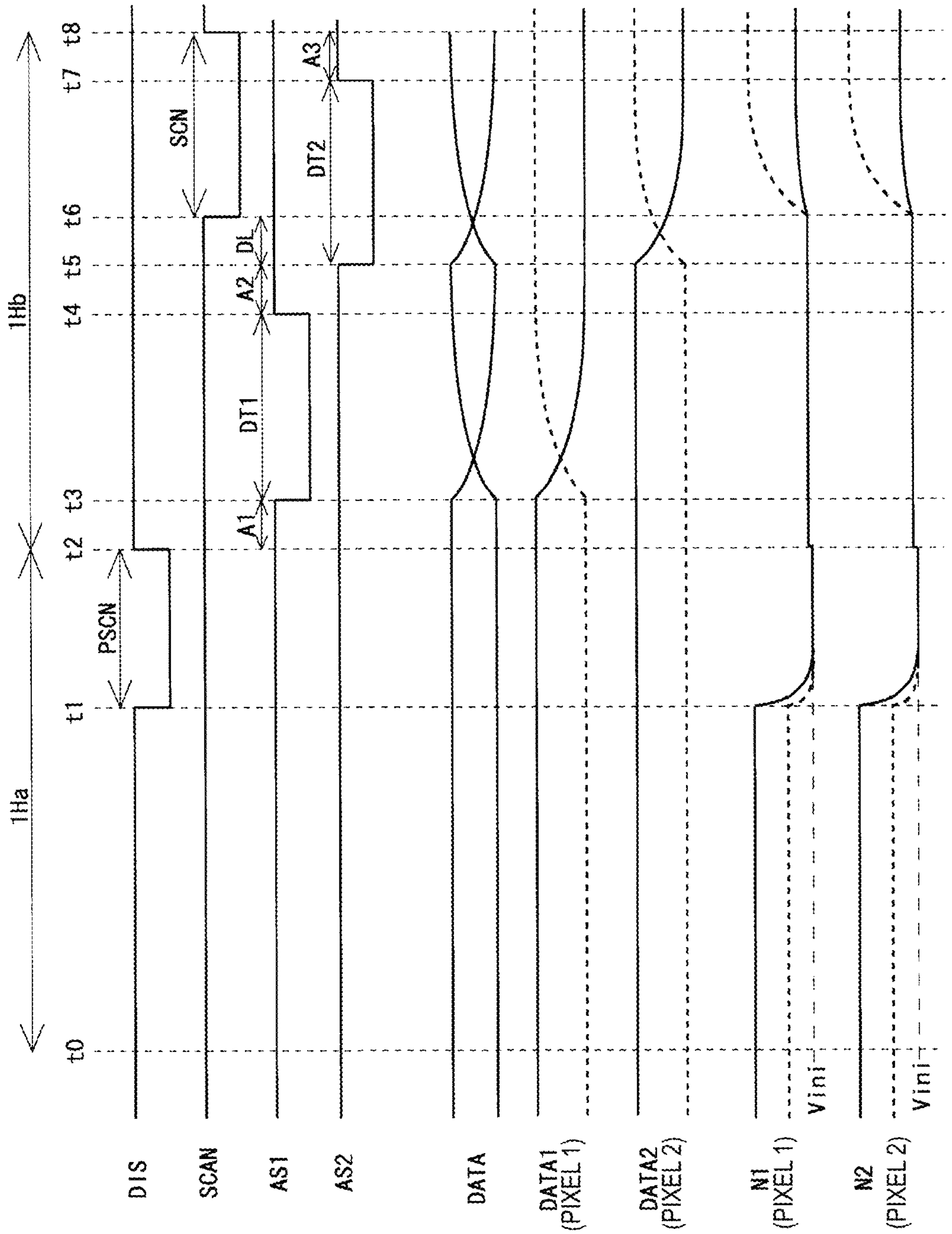
FIG. 7 is a timing chart illustrating a method for driving two pixel circuits in the organic EL display device illustrated in FIG. 5.

In the following, a description is given of a driving method for writing the data signals into the pixel circuits 11*a* and 11*b* illustrated in FIG. 2 using the demultiplexer 411 instead of the demultiplexers 411 to 41*m* illustrated in FIG. 5. The demultiplexer 411 illustrated in FIG. 2 includes two selecting transistors Ms1 and Ms2, and the data lines D1 and D2 connected to the respective selecting transistors are connected to the pixel circuits 11*a* and 11*b*, respectively. The drain terminals of the selecting transistors Ms1 and Ms2 are connected to the data lines D1 and D2, respectively, and the data lines D1 and D2 are connected to the pixel circuits 11*a* and 11*b*, respectively. FIG. 7 is a timing chart illustrating the method for driving the pixel circuit 11*a* and the pixel circuit 11*b* illustrated in FIG. 2.

In the present embodiment, the scanning line select period SCN is set such that at least a part of the scanning line select period SCN overlaps the second data period DT2 and a start time point of the scanning line select period SCN is later than a start time point of the second data period DT2. The first horizontal interval 1Ha including the initialization period PSCN illustrated in FIG. 7 is the same as the first horizontal interval 1Ha illustrated in FIG. 4, and therefore, a description thereof is omitted.

In the second horizontal interval 1Hb, after a first adjustment period A1 from the time point t2 to the time point t3 elapses, the data selection signal AS1 supplied to the data control line ASW1 changes from the H level to the L level at the time point t3. This allows the first data period DT1 to start so that the data signal to be written into the pixel circuit 11*a* is supplied to the data line D1. At the time point t4, the data selection signal AS1 supplied to the data control line ASW1 changes from the L level to the H level so that the selecting transistor Ms1 turns to the off state, and then, the first data period DT1 ends. At this time, a potential of the data line D1 is in a level in accordance with the supplied data signal. The data signal supplied to the data line D1 is held until a new data signal is supplied to the data line D1 in the next scanning.

After a second adjustment period A2 from the time point t4 to the time point t5 elapses, the data selection signal AS2 supplied to the data control line ASW2 changes from the H level to the L level at the time point t5. This allows the second data period DT2 to start so that the data signal to be written into the pixel circuit 11*b* is supplied to the data line D2. At the time point t6, the scanning signal SCAN changes from the H level to the L level, the scanning line select period SCN starts, data writing is started for writing the data signal written into the data line D1 into the node N1 in the pixel circuit 11*a*, and data writing is started for writing the data signal written into the data line D2 into the node N2 in the pixel circuit 11*b*. Note that a description is given later of a period DL (hereinafter, referred to as a "delay period DL") from the start time point t5 of the second data period DT2 until the start time point t6 of the scanning line select period SCN.

At the time point t7, the data selection signal AS2 changes from the L level to the H level so that the selecting transistor Ms2 turns to the off state. This ends the second data period DT2. At this time, a potential of the data line D2 is a potential in accordance with the supplied data signal. The data signal supplied to the data line D2 is held in the data line D2 until a new data signal is supplied to the data line D2 in the next scanning.

After a third adjustment period A3 from the time point t7 to the time point t8 elapses, the scanning signal SCAN changes from the H level to the L level at the time point t8 so that the scanning line select period SCN ends. This allows the node N1 in the pixel circuit 11*a* and the potential of the node N2 in the pixel circuit 11*b* to have potentials expressed by Equation (5) above, and the storage capacitors Cst in the pixel circuit 11*a* and the pixel circuit 11*b* are charged with these potentials to be applied to the gate terminals of the respective driving transistors M1. When the current supply transistors M5 turns to the on state, a voltage of the H level is applied to the source terminals of the driving transistors M1 in the pixel circuit 11*a* and the pixel circuit 11*b* from the H level power source line ELVDD so that the driving transistors M1 turns to the on state. Therefore, the driving transistors M1 supply the drive current depending on the data voltage to the organic EL element OLED. As a result, each of the pixel circuits 11*a* and 11*b* emits a light with a luminance depending on the data signal.

Note that in the above description, the data signal written into the data line D1 during the first data period DT1 may be referred to as a "first data signal", and the data signal written into the data line D2 during the second data period DT2 may be referred to as a "second data signal". In the above description, a time point when the scanning line select period SCN ends is the time point t8 later than time point t7 when the second data period DT2 ends. However, the scanning line select period SCN may end at a time point the same as the time point t6 when the second data period DT2 ends, or may end earlier than the time point t6. Here, in a case where the scanning line select period SCN ends at the same time as or earlier than the time point t6 when the second data period DT2 ends, an attention is required such that the data voltage supplied to the data line D2 does not become lower than the data voltage which is desired actually to be written.

In a case of a panel for Full High Definition (FHD) (for which the screen resolution is 1920×1080×RGB pixels), the length of the one horizontal interval is about 8.18 μs, for example. In this case, both the first and second data periods DT1 and DT2 illustrated in FIG. 7 have the length of 1.93 to 2.75 μs, which is a little shorter than the first and second data periods DT1 and DT2 in the case of the first base study (e.g., 2.94 μs). However, the first and second data periods DT1 and DT2 are considerably longer as compared with the first and second data periods DT1 and DT2 in the case of the second base study (e.g., 1.44 μs).

Note that each of the first to third adjustment periods is provided as a period during which when each signal changes from the H level to the L level or from the L level to the H level, waveform dulling of the signal is canceled, and is set to 0.4 to 1.5 μs in FIG. 7, for example.

2.4 Study on Delay Period

Figure 8:
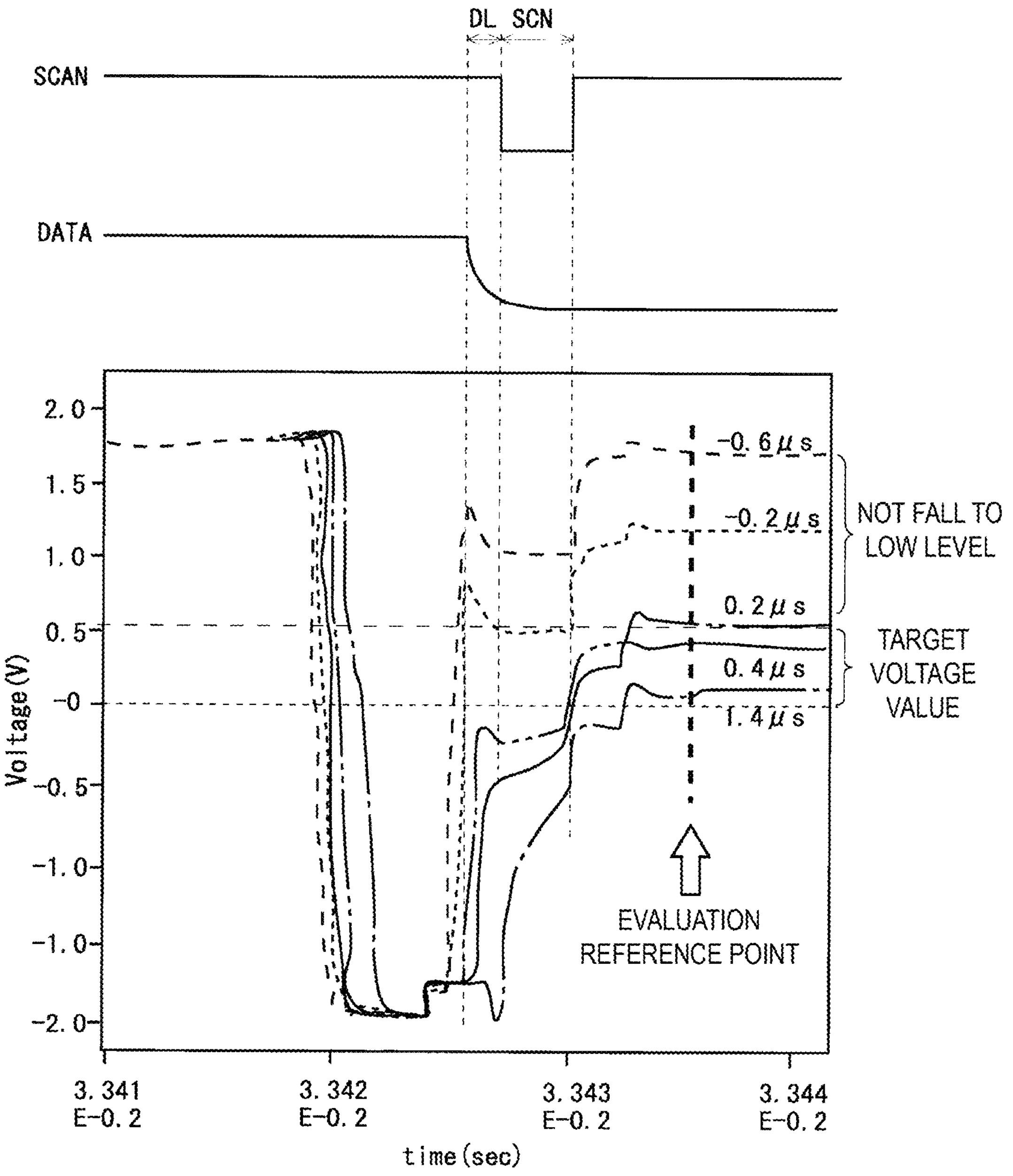
FIG. 8 is a diagram illustrating a relationship, obtained by the simulation, between a delay period and a data voltage written into a node in the pixel circuit.

In the present embodiment also, a problem the same as the first problem of the first base study previously described (the problem is that a drive transistor does not turn on when a data voltage changes from the high level to the low level in a diode-connection type pixel circuit, which causes a desired data to be unable to be written) may occur in some cases. For this reason, obtained is the delay period DL required in order for the potential of the node N2 in the pixel circuit 11*b* to become a desired potential or higher when the data voltage changes from the high level to the low level. Specifically, a period (delay period DL) from the start time point t5 of the second data period DT2 to the start time point t6 of the scanning line select period SCN is used as a parameter to obtain the potential of the node N2 by a computation simulation (hereinafter, abbreviated as the "simulation") when the data signal supplied to the data line D2 during the second data period DT2 is written into the node N2 in the pixel circuit 11*b*. FIG. 8 is a diagram illustrating a relationship, obtained by the simulation, between the delay period DL and the data voltage written into the node N2 in the pixel circuit 11*b*. Note that in the simulation, 10 node potentials are obtained with changing the delay period from −0.6 μs to 1.4 μs by 0.2 μs, but FIG. 8 illustrates five node potentials of those 10 potentials in consideration of visibility.

As illustrate in FIG. 8, a data voltage of the high level (about 1.8V) is written into the data line during the last scanning line select period and further the potential of the node in the pixel circuit is initialized during the initialization period to be decreased to a level lower than the low level (about −1.8 V). After that, the data voltage starts to change from the high level toward the low level. After the delay period DL elapses, when the scanning signal SCAN changes from the H level to the L level, a data signal of the low level is written into the node in the pixel circuit so that the potential of the node rises. When the scanning signal SCAN changes from the low level to the high level, a data voltage is not written from the data line, but the potential of the node further rises without converging, and after a prescribed time period further elapses, each converges to a certain potential. Then, a time point when the potential of the node converges to a certain potential is used as an evaluation reference point to obtain a potential at that time point for each delay period DL. As a result, it is found that if the delay period DL is too short, the potential of the node does not completely decrease to a desired low level potential, and on the other hand, as the delay period DL is longer, the potential of the node more decreases, where if the delay period DL is about 0.4 μs or lower, the potential of the node decreases to about 0.5 V or lower that is a target value. It can be seen from the simulation result that the delay period DL is required to be about 0.4 μs or more.

Figure 9:
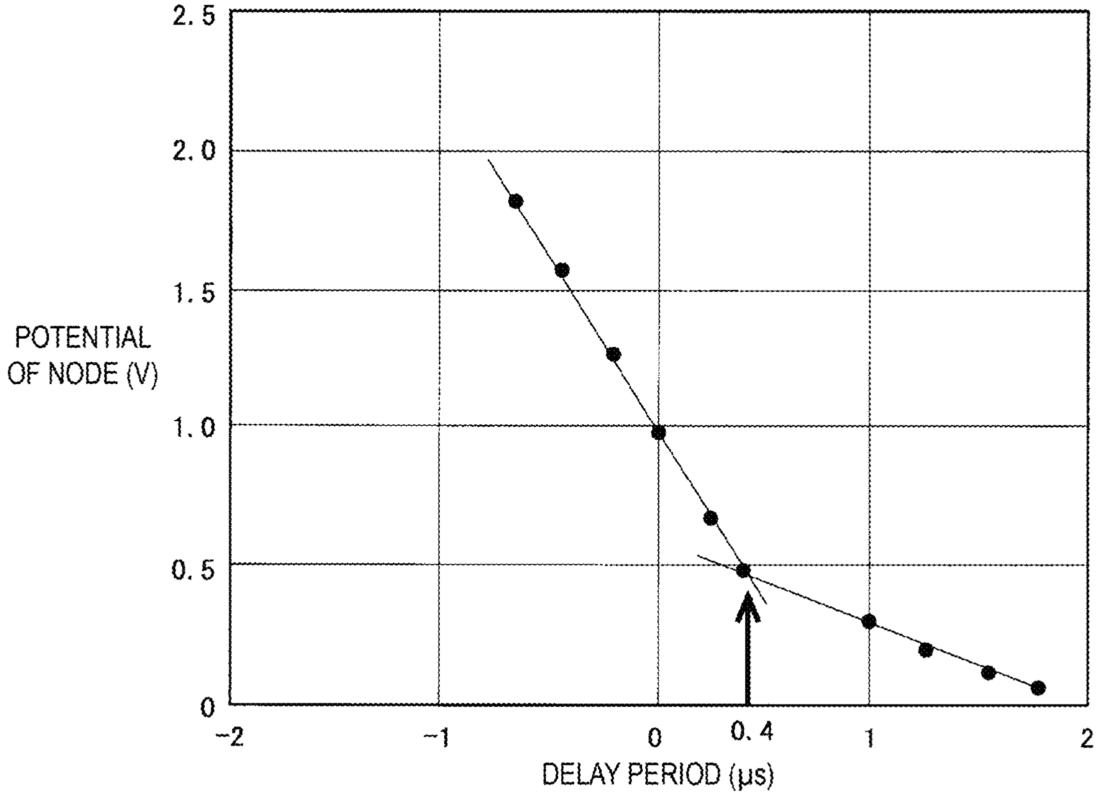
FIG. 9 is a diagram illustrating a relationship between a potential of the node converged on an evaluation reference point in FIG. 8 and the delay period.

FIG. 9 is a diagram illustrating a relationship between the potential of the node N2 on the evaluation reference point in FIG. 8 and the delay period DL. As illustrated in FIG. 9, a line jointing the converged potentials of the node N2 is a straight line. An inclination of this straight line abruptly changes at around 0.4 μs in the delay period DL, and an inclination in the delay period DL longer than about 0.4 μs is gentle as compared with the period shorter than about 0.4 μs. It can be seen from this that the potential of the node N2 does not decrease to the target value during the period shorter than about 0.4 μs in the delay period DL, but the potential of the node N2 can be decreased to the target value if the delay period DL is at least about 0.4 μs or more. On the other hand, it can be seen from FIG. 9 that even if the delay period DL is lengthened longer than about 0.4 μs, an effect to decrease the potential of the node N2 is small for the lengthening. It can be seen from this that the value of about 0.4 μs is a lower limit value of the delay period DL capable of decreasing the potential of the node to the target value and is a period capable of decreasing the most efficiently the potential of the node.

From the above, if the delay period is about 0.4 μs or more, even if a data voltage of the high level is written into the data line D2 during the last horizontal interval, a data voltage of the low level can be written into the pixel circuit 11*b* connected to the data line D2 during the scanning line select period SCN in the next horizontal interval. With this configuration, regardless of the level of the data signal, each pixel circuit can be made to emit a light with a luminance depending on the data signal.

The delay period DL is preferably equal to or more than the lower limit value expressed by the following relationship (6) according to the timing chart in FIG. 7.

$$1H-SCN-A1-A2-TVD(\max)\leq DL \quad (6)$$

where, TVD represents a video settling time indicating a time from when an input data signal changes to when the signal reaches a target tolerable range, and the video settling time TVD must be a maximum value in order to reliably write a data voltage in accordance with the data signal into each pixel circuit in the relationship (6). The video settling time TVD is obtained from a time constant (CR) expressed by a resistance component R and capacitance component C of the data line, and is specifically obtained by Equation (7) below, and the like.

$$TVD=4.6CR \quad (7)$$

The first data period DT1 is required to be at least a period the same as TVD(max) representing the maximum value of the video settling time TVD, and therefore, assuming DT1≈TVD(max) herein.

For example, in a case where a panel is an FHD panel and the driving method therefor is a method in which each data signal generated by the data line driver is demultiplexed and supplied to two data lines (2De-Mux method), a range of TVD obtained by Equation (7) above is as below.

$$1.93\mu s\leq TVD\leq 2.75\mu s \quad (8)$$

In a case where the video settling time TVD(max) is 2.75 μs, the delay period DL is represented by the following relationship (9) based on the relationship (6).

$$0.53\ \mu s\leq DL \quad (9)$$

From this result, if the delay DL is set to 0.53 μs or more, even if a data voltage of the high level is written into the data line D2 during the last horizontal interval, a data voltage of the low level can be written into the pixel circuit 11*b* connected to the data line D2 during the scanning line select period SCN in the next horizontal interval.

Next, a description is given of an upper limit value of the delay period DL. The upper limit value of the delay period DL is be obtained by the following relationship 10).

$$1H-SCN(\min)-A1-A2-TVD(\max)\geq DL \quad (10)$$

The scanning line select period SCN may be a period during which the data voltage can be written into each pixel circuit 11*a* connected to at least the data line D1 and the data voltage can be written into each pixel circuit 11*b* connected to the data line D2. For this reason, the scanning line select period SCN can be reduced to the shortest period required for writing the data voltage into each pixel circuit, and therefore, the upper limit value of the delay period depends on a lower limit value (SCAN(min)) of the scanning line select period SCN.

Although not illustrated in FIG. 7, when the scanning signal SCAN changes from the H level to the L level, the scanning signal SCAN does not abruptly fall from the H level to the L level but falls with a signal waveform being dulled. Therefore, assuming that an upper limit value of a waveform dulling period is represented by TVDscan(max), the relationship (6) expressing the lower limit value of the delay period DL in consideration of the waveform dulling period TVDscan(max) is as the following relationship (11).

$$1H-SCN-A1-A2-TVD(\max)-TVD\mathrm{scan}(\max)\leq DL \quad (11)$$

Similarly, the relationship (10) expressing the upper limit value of the delay period is as the following relationship (12).

$$1H-SCN(\min)-A1-A2-TVD(\max)-TVD\mathrm{scan}(\max)\geq DL \quad (12)$$

Such a delay period is set in a period from or after a time point when to start supplying the data signal supplied last time among a plurality of data signals supplied to the data lines to the data line until a time point before a time point when to end supplying the data signal.

The waveform dulling period TVDscan(max) can be included in the delay period DL. In this case, the upper limit value and lower limit value of the delay period are expressed by the relationship (6) and the relationship (10), respectively. Note that in the timing chart in FIG. 7, the waveform dulling period TVDscan(max) is illustrated to be included in the delay period DL.

2.5 Confirmation of Effect by Simulation

As described above, the driving methods in the above first and second base studies have the problems. Therefore, the problems described in the above first and second base studies are reproduced by a simulation to describe that the problems are solved by the present embodiment.

Preconditions when performing the simulation are as below. The display panel is an FHD panel. Each demultiplexer includes two selecting transistors (2DeMux), the data voltage of the low level is 3.5 V, and the data voltage of the high level is 6.5 V.

Figure 10:
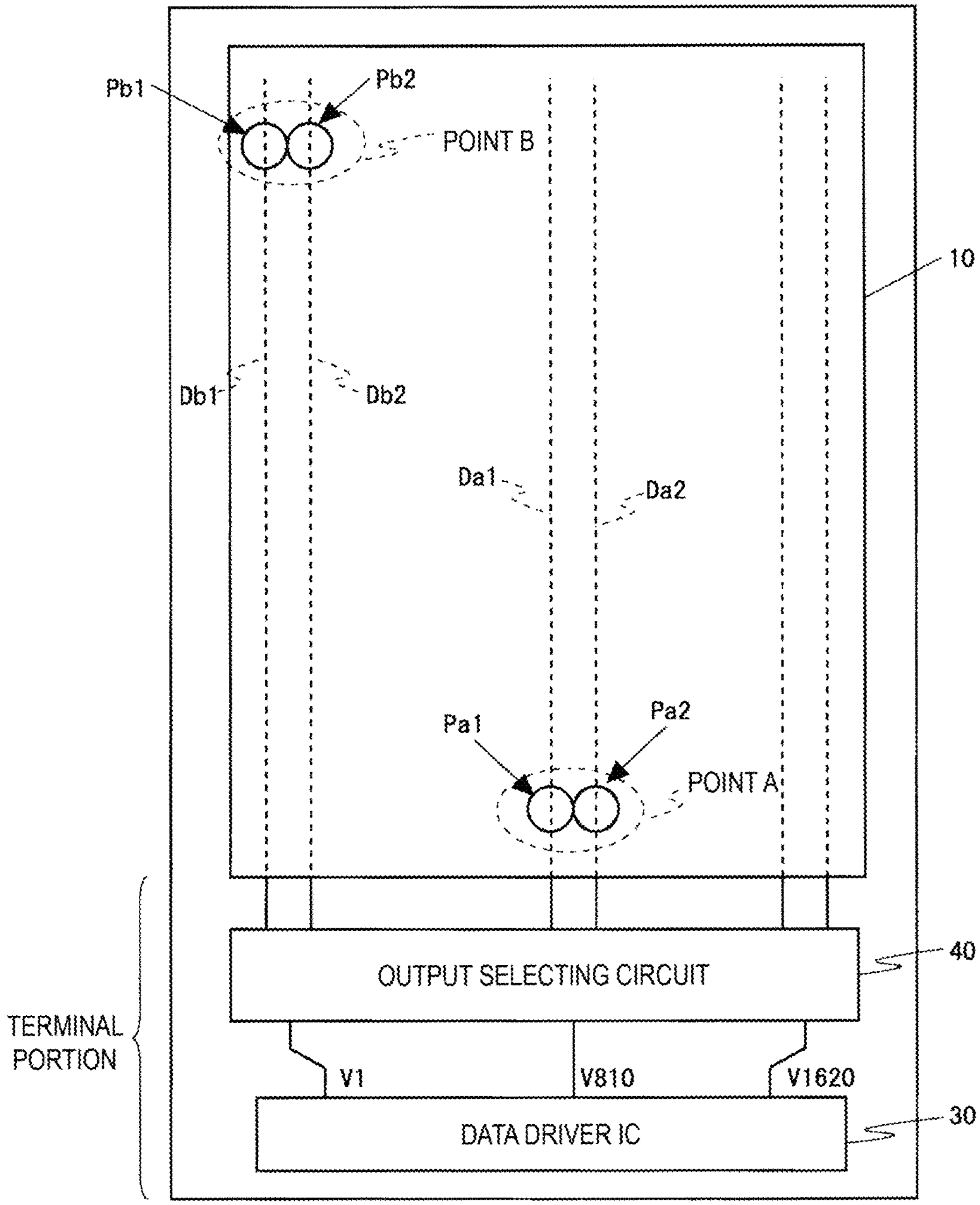
FIG. 10 is a plan view illustrating a configuration of an organic EL display device including a display portion.

Next, a description is given of a position of the pixel circuit on which the simulation is performed. FIG. 10 is a plan view illustrating a configuration of the organic EL display device including the display portion 10. FIG. 10 illustrates the display portion 10, a plurality of data lines provided to the display portion 10, the output selecting circuit 40, and the data line driver 30, and further, positions of the pixel circuits on which the simulation is performed are illustrated in the display portion 10. As illustrated in FIG. 10, a point A is a position at a center lower end in the display portion 10 the closest to the output selecting circuit 40, and a point B is a position at a corner of the display portion 10 the farthest from the output selecting circuit 40 (at an upper left corner in FIG. 10). Then, among the pixel circuits studied by the simulation, two pixel circuits adjacent to each other at the point A are represented by a pixel circuit Pa1 and a pixel circuit Pa2, and two pixel circuits adjacent to each other at the point B are represented by a pixel circuit Pb1 and a pixel circuit Pb2.

The simulation was performed in combination of a case that a high level data signal is written into the data line D1 during the first data period DT1 and a low level data signal is written into the data line D2 during the second data period DT2, and a case that a low level data signal is written into the data line D1 during the first data period DT1 and a high level data signal is written into the data line D2 during the second data period DT2.

An evaluation by the simulation is performed for a current value of a drive current flowing in the organic EL element OLED of each pixel circuit, a variation in the current value inside a surface of the display portion 10, and a degree of the luminance unevenness caused by a variation in the current values of the pixel circuits adjacent to each other.

2.6 Simulation Result of First Base Study

Figure 11A:
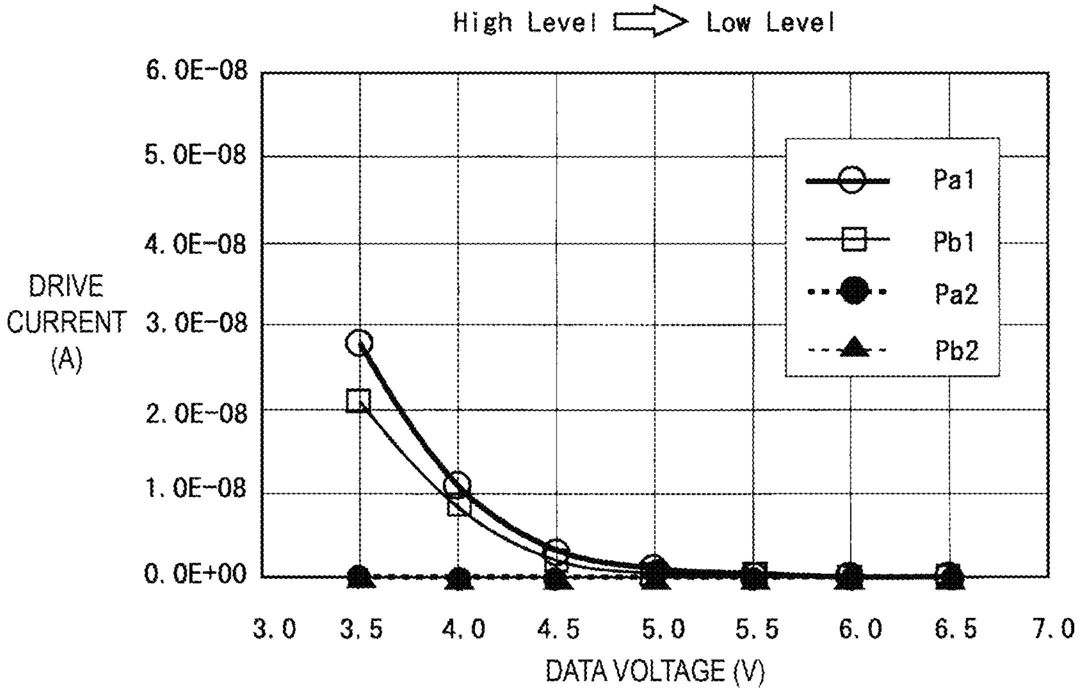
FIGS. 11A and 11B are each a diagram illustrating a simulation result in the first base study performed based on the timing chart illustrated in FIG. 3. To be more specific.
Figure 11B:
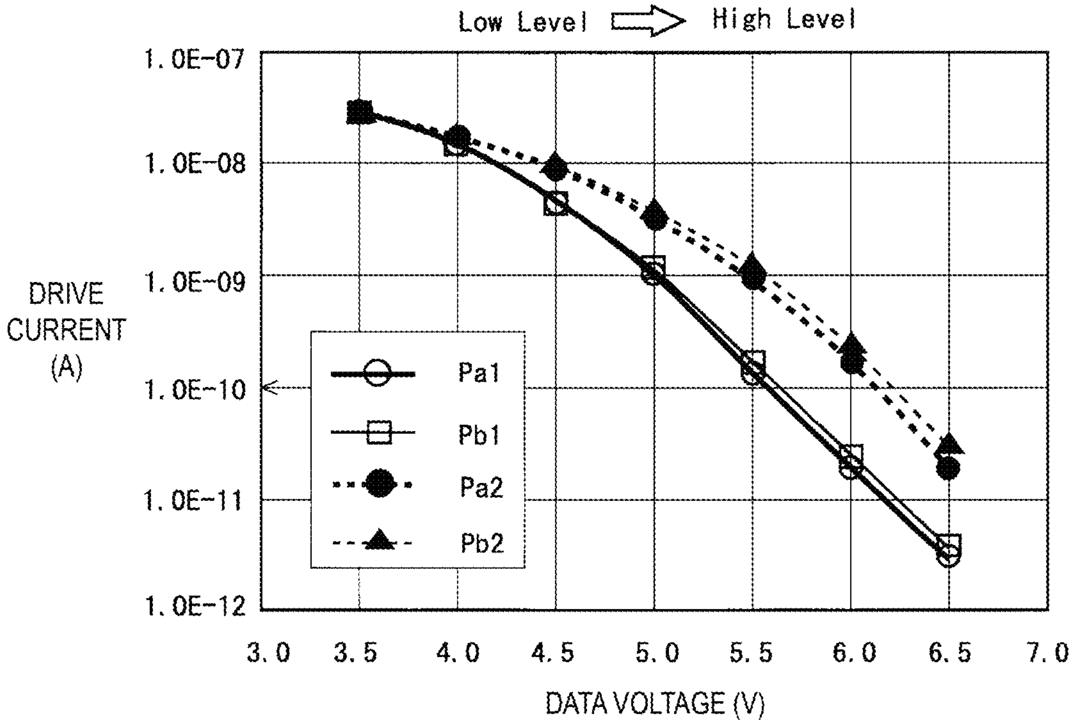

A description is given of a simulation result in the first base study. FIGS. 11A and 11B are each a diagram illustrating the simulation result for the first base study performed based on the timing chart illustrated in FIG. 3. To be more specific, FIG. 11A is a diagram illustrating a simulation result in a case where the data signal changes from the high level to the low level in the pixel circuits Pa1 and Pb1 and the pixel circuits Pa2 and Pb2 in the first base study, and FIG. 11B is a diagram illustrating a simulation result in a case where the data signal changes from the low level to the high level in the pixel circuits Pa1 and Pb1 and the pixel circuits Pa2 and Pb2 in the first base study.

Before describing FIG. 11A, a description is given of states where the pixel circuits Pa1 and Pb1 and the pixel circuits Pa2 and Pb2 are driven, with reference to FIG. 3. First, referring to FIG. 3, a description is given of a case that the data signal changes from the high level toward a desired low level in the pixel circuits Pa1 and Pb1 and the pixel circuits Pa2 and Pb2 (a case of a data voltage DATA1 or DATA2 depicted by a solid line in FIG. 3).

In the pixel circuits Pa1 and Pb1, the high level data signal is supplied to a data line Da1 connected to the pixel circuit Pa1 and a data line Db1 connected to the pixel circuit Pb1 during the first data period before the first data period DT1. At the time point t3, the data selection signal AS1 changes from the H level to the L level so that the data voltage DATA1 of the data line Da1 decreases from the high level toward a desired low level. This allows the data voltage DATA1 of the desired low level to be supplied to the data lines Da1 and Db1. At the time point t4, the data selection signal AS1 changes from the L level to the H level so that the selecting transistor Ms1 turns to the off state, but thereafter, the data voltage DATA1 of the desired low level is held in the data lines Da1 and Db1. For this reason, in a period from the time point t3 to the time point t7 during which the scanning signal SCAN is in the L level, the storage capacitor Cst connected to the node N1 in the pixel circuit Pa1 is charged with the data voltage DATA1 of the desired low level written into the data line Da1 connected to the pixel circuit Pa1 to be applied to the gate terminal of the driving transistor M1 in the pixel circuit Pa1. After that, if a voltage of the high level is applied from the H level power source line ELVDD via the current supply transistor M5 to the first conduction terminal of the driving transistor M1, the driving transistor M1 turns to the on state and a current depending on the data voltage DATA1 of the desired low level flows in the organic EL element OLED. Similarly, a current depending on the data voltage DATA1 of the desired low level flows from the driving transistor M1 to the organic EL element OLED. As a result, the pixel circuits Pa1 and Pb1 emit lights with the luminances depending on the data voltages DATA1 and DATA2, respectively.

On the other hand, in the pixel circuits Pa2 and Pb2, the data voltage DATA2 of the high level is supplied to the data line Da2 connected to the pixel circuit Pa2 during the second data period before the second data period DT2. At the time point t5, when the data selection signal AS2 changes from the H level to the L level, the selecting transistor Ms2 turns to the on state so that the data voltage DATA2 of the data line Da2 decreases from the high level toward the desired low level. On the other hand, the scanning signal SCAN is in the L level from the time point t3 to the time point t7, and thus during a period from the time point t3 to the time point t5, each storage capacitor Cst connected to the node N2 in the pixel circuit Pa2 is charged with the data voltage DATA2 of the high level held in the data line Da2 to be applied to the gate terminal of each driving transistor M1. Even if a voltage of the high level is applied from the H level power source line ELVDD via the current supply transistor M5 to the first conduction terminal of the driving transistor M1, a voltage of a higher level is applied to the gate terminal, and therefore, the driving transistor M1 in the pixel circuit Pa2 turns to the off state. Furthermore, at the time point t5, even if the data selection signal AS2 changes from the H level to the L level, and the data voltage DATA2 supplied to the data line Da2 decreases from the high level toward the desired low level, the driving transistor M1 continues to be in the off state and the potential of the node N2 maintains the high level. For this reason, each storage capacitor Cst of the pixel circuit Pa2 cannot be charged with the data voltage DATA2 of the desired low level. As a result, since the potential of each node N2 maintains the high level, a current depending on the desired data voltage DATA2 does not flow in the organic EL element OLED so that the pixel circuit Pa2 does not emit a light. In a similar reason, each storage capacitor Cst of the pixel circuit Pb2 cannot be charged with the data voltage DATA2 of the desired low level. As a result, since the potential of each node N2 maintains the high level, a current depending on the desired data voltage DATA2 does not flow in the organic EL element OLED so that the pixel circuit Pb2 also does not emit a light.

A simulation result in FIG. 11A provides a result reflecting the above problems of the action, and indicates that the drive current depending on the data voltage DATA1 flows in the pixel circuits Pa1 and Pb1 but the drive current does not flow in the pixel circuits Pa2 and Pb2.

Next, a description is given of a case that the data signal changes from the low level to the high level in the pixel circuits Pa1 and Pb1 and the pixel circuits Pa2 and Pb2 (a case of a data voltage DATA1 or DATA2 depicted by a dotted line in FIG. 3) referring to in FIG. 3.

In the pixel circuits Pa1 and Pb1, the low level data signal is supplied to the data line Da1 connected to the pixel circuit Pa1 and the data line Db1 connected to the pixel circuit Pb1 during the first data period before the first data period DT1. At the time point t3, the data selection signal AS1 changes from the H level to the L level so that the data voltage DATA1 of the data line Da1 increases from the low level toward a desired high level. This allows the data voltage DATA1 of the desired high level to be supplied to the data lines Da1 and Db1. At the time point t4, the data selection signal AS1 changes from the L level to the H level so that the selecting transistor Ms1 turns to the off state, but thereafter, the data voltage DATA1 of the desired high level is held in the data lines Da1 and Db1. For this reason, in a period from the time point t3 to the time point t7 during which the scanning signal SCAN is in the L level, the storage capacitor Cst connected to the node N1 in the pixel circuit Pa1 is charged with the data voltage DATA1 of the desired high level written into the data line Da1 connected to the pixel circuit Pa1 to be applied to the gate terminal of the driving transistor M1 in the pixel circuit Pa1. After that, if a voltage of the high level is applied from the H level power source line ELVDD via the current supply transistor M5 to the first conduction terminal of the driving transistor M1, the driving transistor M1 turns to the on state and a current depending on the data voltage DATA1 of the desired high level flows in the organic EL element OLED. Similarly, in the pixel circuit Pb2, a current depending on the data voltage DATA1 of the desired high level flows from the driving transistor M1 to the organic EL element OLED. As a result, the pixel circuits Pa1 and Pb1 emit lights with desired luminances.

In the pixel circuits Pa2 and Pb2, the low level data signal is supplied to the data line Da2 connected to the pixel circuit Pa2 and the data line Db2 connected to the pixel circuit Pb2 during the second data period before the second data period DT2. At the time point t5, the data selection signal AS2 changes from the H level to the L level so that the data voltage DATA2 increases from the low level toward a desired high level. This allows the data voltage DATA2 of the desired high level to be supplied to the data lines Da2 and Db2. At the time point t6, the data selection signal AS2 changes from the L level to the H level so that the selecting transistor Ms2 turns to the off state, but thereafter also, the data voltage DATA2 of the desired high level is held in the data lines Da2 and Db2. For this reason, in a period from the time point t3 to the time point t7 during which the scanning signal SCAN is in the L level, the storage capacitor Cst connected to the node N2 in the pixel circuit Pa2 is charged with the data voltage DATA2 of the desired high level written into the data line Da2 connected to the pixel circuit Pa2 to be applied to the gate terminal of the driving transistor M1 in the pixel circuit Pb2. After that, if a voltage of the high level is applied from the H level power source line ELVDD via the current supply transistor M5 to the first conduction terminal of the driving transistor M1, the driving transistor M1 turns to the on state and a current depending on the data voltage DATA2 of the desired high level flows in the organic EL element OLED. Similarly, in the pixel circuit Pb2, a current depending on the data voltage DATA2 of the desired high level flows from the driving transistor M1 to the organic EL element OLED. As a result, the pixel circuits Pa2 and Pb2 emit lights with desired luminances.

A simulation result in FIG. 11B also provides a result reflecting the above problems of the action. The drive current depending on the data voltage DATA1 flows in the pixel circuits Pa1 and Pb1 and the drive current depending on the data voltage DATA2 flows in the pixel circuits Pa2 and Pb2. However, the compensating period for the pixel circuit Pa1 or Pb1 is a period from the time point t3 to the time point t7, and is longer as compared with the compensating period for the pixel circuit Pa2 or Pb2 that is a period from the time point t5 to the time point t7, and therefore, the potential of the node N1 can be closer to the desired potential than the potential of the node N2. As a result, the drive current is smaller at the higher data voltage in the pixel circuits Pa1 and Pb1, and therefore, a graver black can be expressed. In this way, even if the same data voltage is applied to the pixel circuit Pa1 and the pixel circuit Pa2 adjacent to each other or the pixel circuit Pb1 and the pixel circuit Pb2 adjacent to each other, the compensating periods are different between the pixel circuits adjacent to each other, and therefore, the current values of the drive currents flowing the adjacent pixels are different from each other. For this reason, the luminance unevenness is generated between the pixel circuits adjacent to each other, for example, between the pixel circuit Pa1 and the pixel circuit Pa2, or the pixel circuit Pb1 and the pixel circuit Pb2.

2.7 Simulation Result of Second Base Study

Figure 12A:
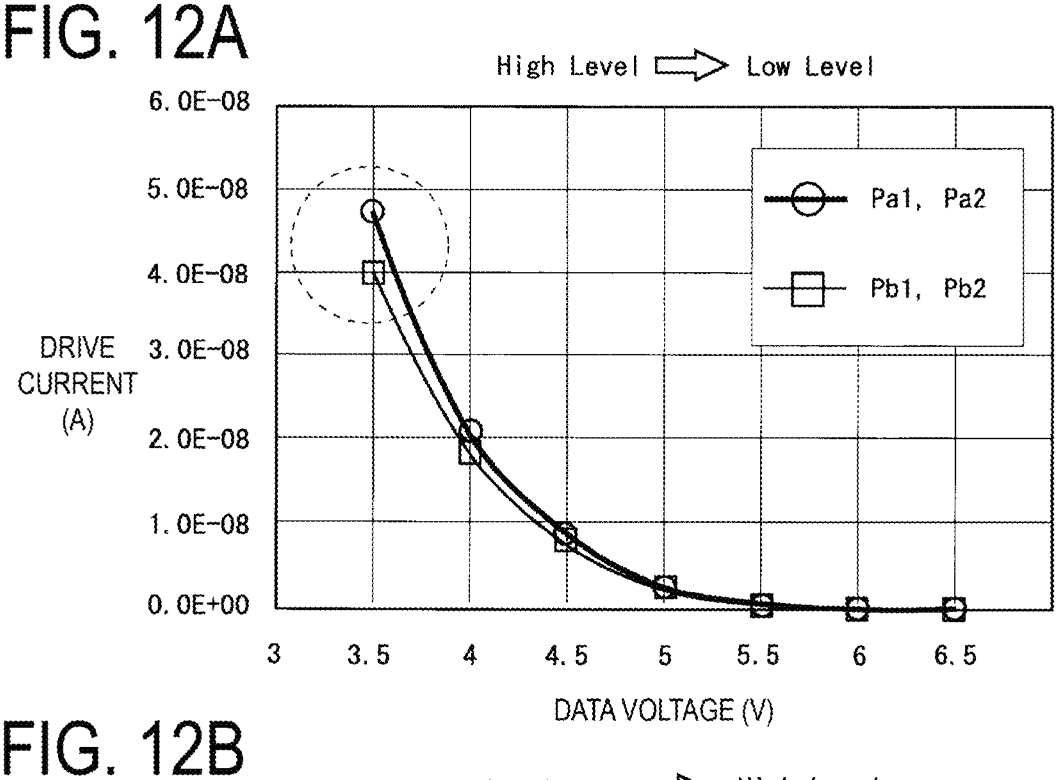
FIGS. 12A and 12B are each a diagram illustrating a simulation result in the second base study performed based on the timing chart illustrated in FIG. 4. To be more specific.
Figure 12B:
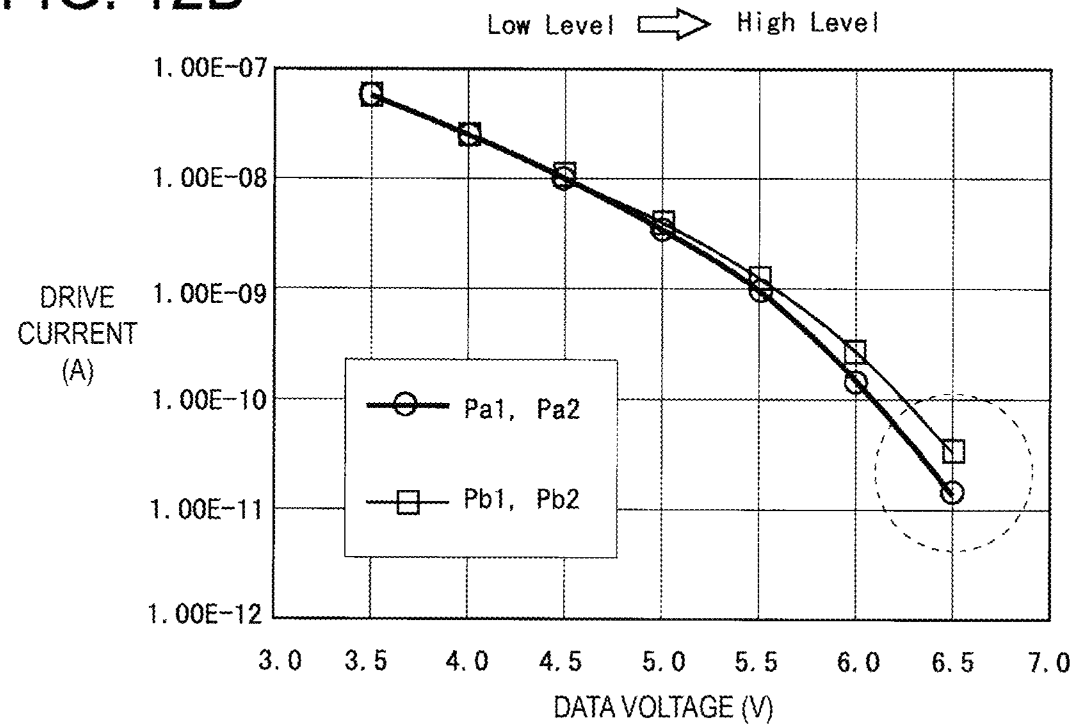

Next, a description is given of a simulation result in the second base study. FIGS. 12A and 12B are each a diagram illustrating the simulation result in the second base study performed based on the timing chart illustrated in FIG. 4. To be more specific, FIG. 12A is a diagram illustrating a simulation result in a case where the data signal changes from the high level to the low level in the pixel circuits Pa1 and Pb1 and the pixel circuits Pa2 and Pb2 in the second base study, and FIG. 12B is a diagram illustrating a simulation result in a case where the data signal changes from the low level to the high level in the pixel circuits Pa1 and Pb1 and the pixel circuits Pa2 and Pb2 in the second base study.

Before describing FIG. 12A, a description is given of states where the pixel circuits Pa1 and Pb1 and the pixel circuits Pa2 and Pb2 are driven, with reference to FIG. 4. Referring to FIG. 4, a description is given of a case that the data signal changes from the high level toward a desired low level in the pixel circuits Pa1 and Pb1 and the pixel circuits Pa2 and Pb2 (a case of a data voltage DATA1 or DATA2 depicted by a solid line in FIG. 4).

In the pixel circuits Pa1 and Pb1, the high level data signal is supplied to the data line Da1 connected to the pixel circuit Pa1 and the data line Db1 connected to the pixel circuit Pb1 during the first data period immediately before the first data period DT1. At the time point t3, the data selection signal AS1 changes from the H level to the L level so that the data voltage DATA1 of the data line Da1 decreases from the high level toward a desired low level. This allows the data voltage DATA1 of the desired low level to be supplied to the data lines Da1 and Db1. At the time point t4, the data selection signal AS1 changes from the L level to the H level so that the selecting transistor Ms1 turns to the off state, but thereafter, the data voltage DATA1 of the desired level is held in the data lines Da1 and Db1. On the other hand, in the scanning line select period SCN, the L level is maintained from the time point t7 after the second data period described later ends until the time point t8. With this configuration, in a period from the time point t7 to the time point t8, the storage capacitor Cst connected to the node N1 in the pixel circuit Pa1 is charged with the desired data voltage DATA1 written into the data line Da1 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA1 of the desired high level flows in the organic EL element OLED. As a result, the pixel circuits Pa1 and Pb1 emit lights with desired luminances.

In the pixel circuits Pa2 and Pb2, the high level data signal is supplied to the data line Da2 connected to the pixel circuit Pa2 and the data line Db2 connected to the pixel circuit Pb2 during the second data period before the second data period DT2. At the time point t5, the data selection signal AS2 changes from the H level to the L level so that the data voltage DATA2 decreases from the high level toward the low level. This allows the data voltage DATA2 of the desired low level to be supplied to the data lines Da2 and Db2. At the time point t6, the data selection signal AS2 changes from the L level to the H level so that the selecting transistor Ms2 turns to the off state, but thereafter, the data voltage DATA2 of the desired low level is held in the data lines Da2 and Db2. On the other hand, in the scanning line select period SCN, the L level is maintained from the time point t7 after the second data period ends until the time point t8. With this configuration, in a period from the time point t7 to the time point t8, the storage capacitor Cst connected to the node N2 in the pixel circuit Pa2 is charged with the data voltage DATA2 of the desired low level written into the data line Da2 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA2 of the desired low level flows in the organic EL element OLED. Similarly, in the driving transistor M1 in the pixel circuit Pb2 also, a current depending on the data voltage DATA2 of the desired low level flows in the organic EL element OLED. As a result, the pixel circuits Pa2 and Pb2 emit lights with desired luminances.

In this way, the data period for supplying the data signal to the data lines D1 and D2 and the scanning line select period for writing the data signals supplied to data lines D1 and D2 into the corresponding pixel circuits do not overlap each other, and therefore, the problem in the first base study is not caused that the drive current does not flow in the pixel circuit Pa2 and the pixel circuit Pb2 when the data signal changes from the high level to the low level. The scanning line select period for writing the data signals from the data line D1 into to nodes N1 in the pixel circuits Pa1 and Pb1 is the same as the scanning line select period for writing the data signals from the data line D2 into nodes N2 in the pixel circuits Pa2 and Pb2, and therefore, suppressed are the luminance unevennesses generated between the pixel circuits Pa1 and the pixel circuit Pa2 adjacent to each other, or the pixel circuit Pb1 and the pixel circuit Pb2 adjacent to each other.

However, since the periods for supplying the data signals to the data lines D1 and D2 are shortened, the data signals cannot be sufficiently supplied to the data lines D1 and D2, and the first and second data periods DT1 and DT2 end before the data signals reach prescribed levels. As a result, the data voltage of the low level written into each pixel circuit during the scanning line select period SCN is higher than a voltage value that is desired to be actually reached so that only a drive current flows which is smaller than a drive current that is desired to actually flow. The first and second data periods DT1 and DT2 are short, and therefore, the charge shortage in the data line at the point B where a load is larger is more remarkable as compared with the point A and the potential of the node at the point B is higher than a potential that is desired to be actually reached. For this reason, the current values of the drive currents flowing in the pixel circuits Pb1 and Pb2 at the point B are smaller than the current values of the drive currents flowing in the pixel circuits Pa1 and Pa2 at the point A, causing the luminance unevenness inside the surface of the display portion 10. This can be seen from the simulation result in FIG. 12A.

Next, a description is given of a case that the data signal changes from the low level to the high level in the pixel circuits Pa1 and Pb1 and the pixel circuits Pa2 and Pb2 (a case of the data voltage DATA1 or DATA2 depicted by a dotted line in FIG. 4) referring to in FIG. 4.

In the pixel circuits Pa1 and Pb1, the low level data signal is supplied to the data line Da1 connected to the pixel circuit Pa1 and the data line Db1 connected to the pixel circuit Pb1 during the first data period immediately before the first data period DT1. At the time point t3, the data selection signal AS1 changes from the H level to the L level so that the data voltage DATA1 of the data line Da1 increases from the low level toward a desired high level. This allows the data voltage DATA1 of the desired high level to be supplied to the data lines Da1 and Db1. At the time point t4, the data selection signal AS1 changes from the L level to the H level so that the selecting transistor Ms1 turns to the off state, but thereafter, the data voltage DATA1 of the desired high level is held in the data lines Da1 and Db1. On the other hand, in the scanning line select period SCN, the L level is maintained from the time point t7 after the second data period described later ends until the time point t8. With this configuration, in a period from the time point t7 to the time point t8, the storage capacitor Cst connected to the node N1 in the pixel circuit Pa1 is charged with the data voltage DATA1 of the desired low level written into the data line Da1 connected to the pixel circuit Pa1 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA1 of the desired high level flows in the organic EL element OLED. Similarly, in the driving transistor M1 in the pixel circuit Pb1 also, a current depending on the data voltage DATA1 of the desired high level flows in the organic EL element OLED. As a result, the pixel circuits Pa1 and Pb1 emit lights with desired luminances.

In the pixel circuits Pa2 and Pb2, the low level data signal is supplied to the data line Da2 connected to the pixel circuit Pa2 and the data line Db2 connected to the pixel circuit Pb2 during the second data period before the second data period DT2. At the time point t5, the data selection signal AS2 changes from the H level to the L level so that the data voltage DATA2 rises from the low level toward a high level. This allows the data voltage DATA2 of the desired high level to be supplied to the data lines Da2 and Db2. At the time point t6, the data selection signal AS2 changes from the L level to the H level so that the selecting transistor Ms2 turns to the off state, but thereafter, the data voltage DATA2 of the desired high level is held in the data lines Da2 and Db2. On the other hand, in the scanning line select period SCN, the L level is maintained from the time point t7 after the second data period ends until the time point t8. With this configuration, in a period from the time point t7 to the time point t8, the storage capacitor Cst connected to the node N2 in the pixel circuit Pa2 is charged with the data voltage DATA2 of the desired high level written into the data line Da2 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA2 of the desired high level flows in the organic EL element OLED. Similarly, in the driving transistor M1 in the pixel circuit Pb2 also, a current depending on the data voltage DATA2 of the desired high level flows in the organic EL element OLED. As a result, the pixel circuits Pa2 and Pb2 emit lights with desired luminances.

In this case also, the data periods DT1 and DT2 for supplying the data signals to the data lines D1 and D2 and the scanning line select period SCN for writing the data signals supplied to data lines D1 and D2 into the corresponding pixel circuits do not overlap each other, and therefore, the problem in the first base study is not caused that the drive current does not flow in the pixel circuit Pa2 and the pixel circuit Pb2 when the data signal changes from the high level to the low level. During the scanning line select period SCN, the data signals are written from the data line D1 into the nodes N1 in the pixel circuits Pa1 and Pb1, and the data signals are written from the data line D2 into the nodes N2 in the pixel circuits Pa2 and Pb2. In this way, the periods for writing the data signals are the same in the pixel circuit Pa1 and the pixel circuit Pa2 adjacent to each other, or the pixel circuit Pb1 and the pixel circuit Pb2 adjacent to each other, and therefore, the luminance unevenness generated between the pixel circuits adjacent to each other is suppressed.

However, similar to the case in FIG. 12A, since the data periods for supplying the data signals respectively to the data lines D1 and D2 are shortened, the scanning line select period SCN for writing the data signals into the pixel circuits corresponding to the data lines D1 and D2 cannot be sufficiently ensured, and the first and second data periods DT1 and DT2 end before the data signals reach prescribed levels. Therefore, the data voltage of the high level written into each pixel circuit during the scanning line select period SCN is lower than the voltage value that is desired to be actually reached. As a result, a drive current more than the drive current that is desired to actually flow in any pixel circuit, which causes black floating incapable of expressing a graver black. A short supply of the data signal is more remarkable at the point B where a load is larger as compared with the point A, and the potential of the node at the point B is lower than a potential that is desired to be actually reached. As a result, the current values of the drive currents in the pixel circuits Pb1 and Pb2 at the point B are larger as compare with the current values of the drive currents in the pixel circuits Pa1 and Pa2 at the point A, causing the luminance unevenness inside the surface of the display portion 10, A state where the luminance unevenness is generated can be seen from the simulation result in FIG. 12B.

2.8 Simulation Result in the Present Embodiment

Figure 13A:
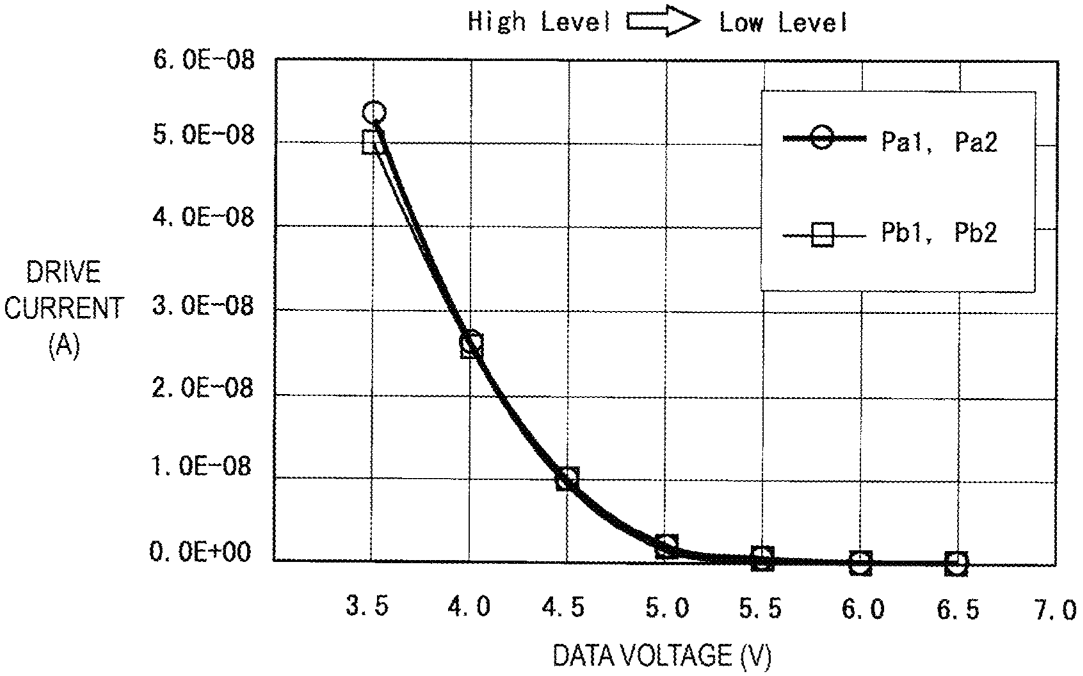
FIGS. 13A and 13B are each a diagram illustrating a simulation result in the present embodiment performed based on the timing chart illustrated in FIG. 7. To be more specific.
Figure 13B:
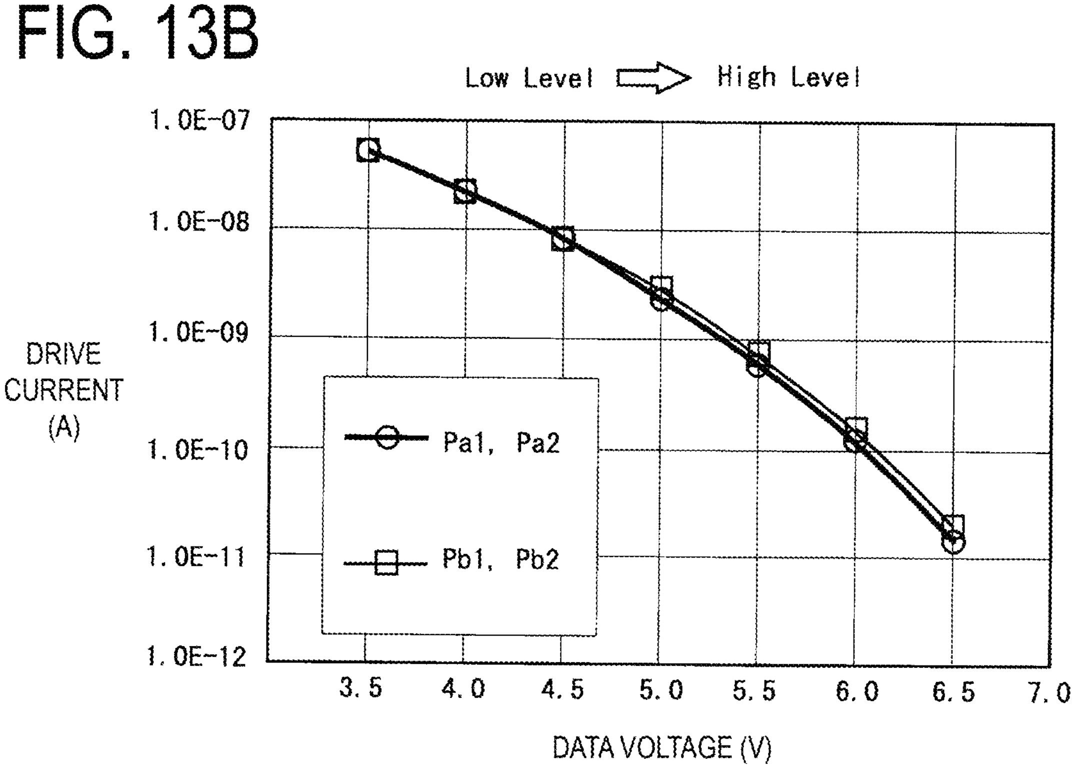

A description is given of a simulation result in the present embodiment. FIGS. 13A and 13B are each a diagram illustrating a simulation result in the present embodiment performed based on the timing chart illustrated in FIG. 7. To be more specific, FIG. 13A is a diagram illustrating a simulation result in a case where the data signal changes from the high level to the low level in the pixel circuits Pa1 and Pb1 and the pixel circuits Pa2 and Pb2 in the present embodiment, and FIG. 13B is a diagram illustrating a simulation result in a case where the data signal changes from the low level to the high level in the pixel circuits Pa1 and Pb1 and the pixel circuits Pa2 and Pb2 in the present embodiment.

Before describing FIG. 13A, a description is given of states where the pixel circuits Pa1 and Pb1 and the pixel circuits Pa2 and Pb2 are driven referring to FIG. 7. Referring to FIG. 7, a description is given of a case that the data signal changes from the high level toward a desired low level in the pixel circuits Pa1 and Pb1 and the pixel circuits Pa2 and Pb2 (a case of a data voltage DATA1 or DATA2 depicted by a solid line in FIG. 7).

In the pixel circuits Pa1 and Pb1, the high level data signal is supplied to the data line Da1 connected to the pixel circuit Pa1 and the data line Db1 connected to the pixel circuit Pb1 during the first data period immediately before the first data period DT1. At the time point t3, the data selection signal AS1 changes from the H level to the L level so that the data voltage DATA1 of the data line Da1 decreases from the high level toward a desired low level. This allows the data voltage DATA1 of the desired low level to be supplied to the data lines Da1 and Db1. At the time point t4, the data selection signal AS1 changes from the L level to the H level so that the selecting transistor Ms1 turns to the off state, but thereafter, the data voltage DATA1 of the desired low level is held in the data lines Da1 and Db1. On the other hand, in the scanning line select period SCN, the L level is maintained from the time point t6 after the first data period ends and which is further later by a prescribed delay period DL than the time point t5 when the second data period described later starts until the time point t8. With this configuration, in a period from the time point t6 to the time point t8, the storage capacitor Cst connected to the node N1 in the pixel circuit Pa1 is charged with the data voltage DATA1 of the desired low level written into the data line Da1 connected to the pixel circuit Pa1 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA1 of the desired low level flows in the organic EL element OLED. Similarly, also in the driving transistor M1 in the pixel circuit Pb1, a current depending on the data voltage DATA1 of the desired low level flows in the organic EL element OLED. As a result, the pixel circuits Pa1 and Pb1 emit lights with desired luminances.

In the pixel circuits Pa2 and Pb2, the high level data signal is supplied to the data line Da2 connected to the pixel circuit Pa2 and the data line Db2 connected to the pixel circuit Pb2 during the second data period before the second data period DT2. At the time point t5, the data selection signal AS2 changes from the H level to the L level so that the data voltage DATA2 decreases from the high level toward a desired low level. This allows the data voltage DATA2 of the desired low level to be supplied to the data lines Da2 and Db2. On the other hand, in the scanning line select period SCN, the L level is maintained from the time point t6 which is later by the delay period DL than the time point t5 when the from second data period starts until the time point t8. With this configuration, in a period from the time point t6 to the time point t8, the storage capacitor Cst connected to the node N2 in the pixel circuit Pa2 is charged with the data voltage DATA2 of the desired low level written into the data line Da2 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA2 of the desired low level flows in the organic EL element OLED. As a result, the pixel circuits Pa2 and Pb2 emit lights with desired luminances.

In this way, in the present embodiment, the start time point t6 of the scanning line select period SCN is a time point later by the delay period DL than the start time point t5 of the second data period DT2. For this reason, as in the first base study, no high level data signal is written before the low level data signal that is desired to be actually written during the second data period DT2 is written so that no driving transistor M1 turns to the off state. As a result, regardless of the level of the data signal, the low level data signals can be written respectively into the pixel circuit Pa2 and the pixel circuit Pb2.

The scanning line select period SCN as the compensating period is provided after the first data period DT1 and the second data period DT2 end so that a period for writing the data signals from the data line D1 into the nodes N1 in the pixel circuits Pa1 and Pb1 is the same as the period for writing the data signals from the data line D2 into the nodes N2 in the pixel circuits Pa2 and Pb2. For this reason, the luminance unevenness generated between the pixel circuit Pa1 and the pixel circuit Pa2 adjacent to each other, or between the pixel circuit Pb1 and the pixel circuit Pb2 adjacent to each other is suppressed.

The first data period DT1 and the second data period DT2 can be lengthened as compared with the case of the second base study so that a time for supplying the data signal to each data line can be sufficiently ensured. With this configuration, the current value of the drive current is larger than the case of the second base study when the written data signal is of the low level (level at which an image of white or close to white is displayed), and is smaller than the case of the second base study when the written data signal is of the high level (level at which an image of black or close to black is displayed). In this way, improvement is obtained in any case as compared with the second base study.

Next, a description is given of a case that the data voltage changes from the low level to the high level in the pixel circuits Pa1 and Pb1 and the pixel circuits Pa2 and Pb2 (a case of the data voltage DATA1 or DATA2 depicted by a dotted line in FIG. 7) referring to in FIG. 7 and FIG. 13B.

In the pixel circuits Pa1 and Pb1, the low level data signal is supplied to the data line Da1 connected to the pixel circuit Pa1 and the data line Db1 connected to the pixel circuit Pb1 during the first data period immediately before the first data period DT1. At the time point t3, the data selection signal AS1 changes from the H level to the L level so that the data voltage DATA1 of the data line Da1 increases from the low level toward a desired high level. This allows the data voltage DATA1 of the desired high level to be supplied to the data lines Da1 and Db1. At the time point t4, the data selection signal AS1 changes from the L level to the H level so that the selecting transistor Ms1 turns to the off state, but thereafter also, the data voltage DATA1 of the desired high level is held in the data lines Da1 and Db1. On the other hand, in the scanning line select period SCN, the L level is maintained from the time point t6 after the first data period ends and further after a prescribed delay period DL elapses from the time point t5 when the second data period described later starts until the time point t8. With this configuration, in a period from the time point t6 to the time point t8, the storage capacitor Cst connected to the node N1 in the pixel circuit Pa1 is charged with the data voltage DATA1 of the desired high level written into the data line Da1 connected to the pixel circuit Pa1 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA1 of the desired high level flows in the organic EL element OLED. Similarly, also in the driving transistor M1 in the pixel circuit Pb1, a current depending on the data voltage DATA1 of the desired high level flows in the organic EL element OLED. As a result, the pixel circuits Pa1 and Pb1 emit lights with desired luminances.

In the pixel circuits Pa2 and Pb2, the low level data signal is supplied to the data line Da2 connected to the pixel circuit Pa2 and the data line Db2 connected to the pixel circuit Pb2 during the second data period before the second data period DT2. At the time point t5, the data selection signal AS2 changes from the H level to the L level so that the data voltage DATA2 increases from the low level toward a desired high level. This allows the data voltage DATA2 of the desired high level to be supplied to the data lines Da2 and Db2. On the other hand, the scanning line select period SCN starts from the time point t6 which is later by a prescribed delay period DL than the time point t5 when the second data period starts and the L level is maintained until the time point t8. With this configuration, in a period from the time point t6 to the time point t8, the storage capacitor Cst connected to the node N2 in the pixel circuit Pa2 is charged with the data voltage DATA2 of the desired high level written into the data line Da2 to be applied to the gate terminal of the driving transistor M1. After that, if a voltage of the high level is applied from the H level power source line ELVDD via the current supply transistor M5 to the first conduction terminal of the driving transistor M1, the driving transistor M1 turns to the on state and a current depending on the data voltage DATA2 of the desired high level flows in the organic EL element OLED. Similarly, also in the driving transistor M1 in the pixel circuit Pb2, a current depending on the data voltage DATA2 of the desired high level flows in the organic EL element OLED. As a result, the pixel circuits Pa2 and Pb2 emit lights with desired luminances.

In this case, in the first base study, the problem where a data voltage of the low level cannot be written when the data voltage changes from the high level to the low level is not caused. The luminance unevenness generated between the pixel circuit Pa1 and the pixel circuit Pa2 adjacent to each other, or between the pixel circuit Pb1 and the pixel circuit Pb2 adjacent to each other is suppressed, or the current value of the drive current is improved as compared with the second base study, which are the same as the description for the case that the data voltages DATA1 and DATA2 change from the high level to the low level, and therefore, the description thereof is omitted.

2.9 Effects

According to the present embodiment, compared with the case of the second base study, the start time point of the scanning line select period SCN is later by the delay period DL than the start time point of the second data period DT2 so that, regardless of the level of the data signal that is desired to be actually written during the second data period DT2, the driving transistor M1 does not turned off before the data signal is written. In this way, regardless of the level of the data signal, the data signals can be written respectively into the pixel circuit Pa2 and pixel circuit Pb2.

Since the scanning line select period SCN as the compensating period is provided after the first data period DT1 and the second data period DT2 end, the compensating period for the pixel circuit Pa1 and the pixel circuit Pa2 adjacent to each other is the same period as the compensating period for the pixel circuit Pb1 and the pixel circuit Pb2 adjacent to each other. For this reason, the problem in the first base study that the luminance unevenness is generated between the pixel circuits adjacent to each other is suppressed.

The first data period DT1 and the second data period DT2 can be lengthened as compared with the case of the second base study so that a time for supplying the data signals to the data lines D1 and D2 can be sufficiently ensured. With this configuration, as compared with the case of the second base study, the drive current is larger and the luminance of the image is improved when the written data signal is the low level, and the drive current decreases and a graver black can be expressed when the supplied data signal is the high level. A contrast ratio of the images is more improved because the drive current is larger, and the drive current sufficiently decreases when the data signal is the high level so that a graver black can be expressed.

2.10. Modification Example 2.10.1 First Modification Example

In the first embodiment, in the case where the data signals are supplied from the demultiplexer 411 to the data lines D1 and D2, the selecting transistor Ms1 is first turned on to supply the data signal to the data line D1, and next, the selecting transistor Ms2 is turned on to supply the data signal to the data line D2. As for the supplied data signal in any cycle, first, the data signal is supplied to the data line D1, and next, the data signal is supplied to the data line D2. However, according to such a driving method, a variation in the luminance is likely to be noticeable. Therefore, a driving method as below is used for driving in order to change an order of the data signals supplied for each cycle. Note that the cycle referred to herein may be "one horizontal interval" or "one vertical interval".

Figure 14:
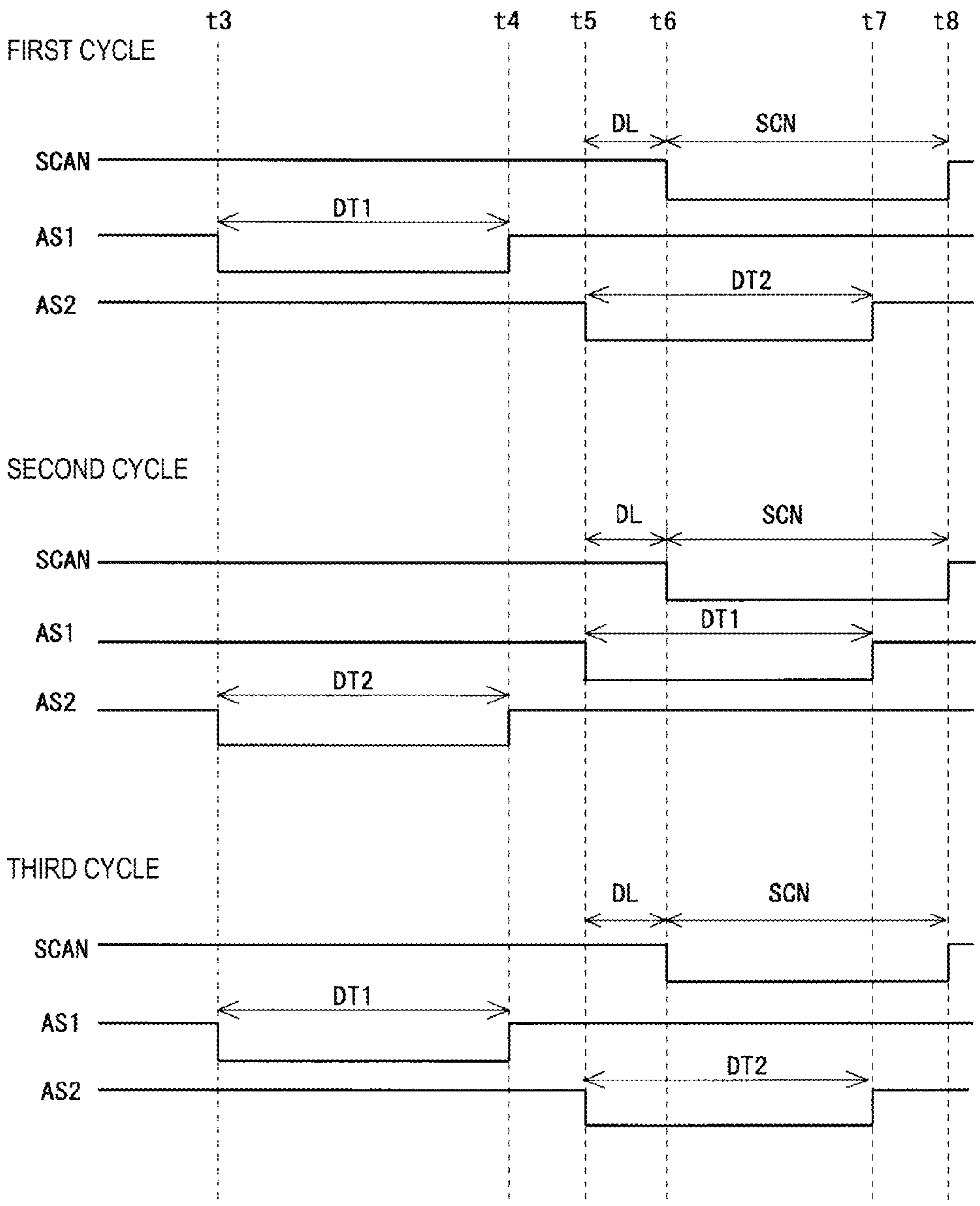
FIG. 14 is a timing diagram illustrating a timing of switching on/off of a selecting transistor of an organic EL display device according to a first modification example of the first embodiment.

FIG. 14 is a timing diagram illustrating a timing of switching on/off of a selecting transistor of an organic EL display device according to a first modification example of the present embodiment. The timing diagram illustrated in FIG. 14 illustrates timings in a first cycle (a first horizontal interval or a first vertical interval) to a third cycle (a third horizontal interval or a third vertical interval) for the scanning signal SCAN, and the data selection signals AS1 and AS2 in the timing chart illustrated in FIG. 7. In the first cycle (the first horizontal interval or the first vertical interval), at the time point t3, the data selection signal AS1 supplied to the data control line ASW1 changes from the H level to the L level. This allows the selecting transistor Ms1 to turn to the on state to start the first data period during which the data signal to be written into the pixel circuit 11*a* is supplied to the data line D1. At the time point t4, the data selection signal AS1 supplied to the data control line ASW1 changes from the L level to the H level so that the selecting transistor Ms1 turns to the off state, and then, the first data period DT1 ends. At this time, a potential of the data line D1 is in a level in accordance with the supplied data signal.

After an adjustment period from the time point t4 to the time point t5 elapses, the data selection signal AS2 supplied to the data control line ASW2 changes from the H level to the L level at the time point t5. This allows the selecting transistor Ms2 to turn to the on state to start the second data period DT2 during which the data signal to be written into the pixel circuit 11*b* is supplied to the data line D2. At the time point t6 after the delay period DL elapses from the time point t5, the scanning signal SCAN changes from the H level to the L level, the scanning line select period SCN starts, and started are data writing for writing the data signal written into the data line D1 into the node N1 in the pixel circuit 11*a* illustrated in FIG. 2 and data writing for writing the data signal which is being written into the data line D2 into the node N2 in the pixel circuit 11*b*.

At the time point t7, the data selection signal AS2 changes from the L level to the H level so that the selecting transistor Ms2 turns to the off state. This ends the second data period DT2. At this time, a potential of the data line D2 is a potential in accordance with the supplied data signal. After an adjustment period from the time point t7 to the time point t8 elapses, the scanning signal SCAN changes from the H level to the L level at the time point t8 so that the scanning line select period SCN ends. With this configuration, the storage capacitors Cst in the pixel circuit 11*a* and the pixel circuit 11*b* are charged with the data signals respectively written into the data lines D1 and D2 to be applied to the gate terminals of the driving transistors M1. Therefore, the driving transistors M1 in the pixel circuit 11*a* and the pixel circuit 11*b* supply the drive currents depending on the data voltages to the organic EL element OLED, and the pixel circuits 11*a* and 11*b* emit light with luminances depending on the data signals.

Next, in the second cycle (the second horizontal interval or the second vertical interval), at the time point t3, the data selection signal AS2 supplied to the data control line ASW2 changes from the H level to the L level. This allows the selecting transistor Ms2 to turn to the on state to start the second data period DT2 during which the data signal to be written into the pixel circuit 11*a* is supplied to the data line D2. At the time point t4, the data selection signal AS2 supplied to the data control line ASW2 changes from the L level to the H level so that the selecting transistor Ms1 turns to the off state, and then, the second data period DT2 ends. At this time, a potential of the data line D2 is in a level in accordance with the supplied data signal.

After an adjustment period from the time point t4 to the time point t5 elapses, the data selection signal AS1 supplied to the data control line ASW1 changes from the H level to the L level at the time point t5. This allows the selecting transistor Ms1 to turn to the on state to start the first data period DT1 during which the data signal to be written into the pixel circuit 11*b* is supplied to the data line D1. At the time point t6 after the delay period DL elapses from the time point t5, the scanning signal SCAN changes from the H level to the L level, the scanning line select period SCN starts, and started are data writing for writing the data signal written into the data line D2 into the node N2 in the pixel circuit 11*b* and data writing for writing the data signal which is being written into the data line D1 into the node N1 in the pixel circuit 11*a*.

At the time point t7, the data selection signal AS1 changes from the L level to the H level so that the selecting transistor Ms2 turns to the off state. This ends the first data period DT1. At this time, a potential of the data line D1 is a potential in accordance with the supplied data signal. After an adjustment period from the time point t7 to the time point t8 elapses, the scanning signal SCAN changes from the H level to the L level at the time point t8 so that the scanning line select period SCN ends. With this configuration, the storage capacitors Cst in the pixel circuit 11*a* and the pixel circuit 11*b* are charged with the data signals respectively written into the data lines D1 and D2 to be applied to the gate terminals of the driving transistors M1. Therefore, the driving transistors M1 in the pixel circuit 11*a* and the pixel circuit 11*b* supply the drive currents depending on the data voltages to the organic EL element OLED, and the pixel circuits 11*a* and 11*b* respectively emit light with luminances depending on the data signals.

In the third cycle (the third horizontal interval or the third vertical interval), first, the selecting transistor Ms1 turns to the on state so that the data signal is written into the data line D1, and next, the selecting transistor Ms2 turns to the on state so that the data signal is written into the data line D2, similarly to the case of the first cycle (the first horizontal interval or the first vertical interval). Although not illustrated in the drawings, in a fourth cycle (a fourth horizontal interval or a fourth vertical interval), first, the selecting transistor Ms2 turns to the on state so that the data signal is written into the data line D2, and next, the selecting transistor Ms1 turns to the on state so that the data signal is written into the data line D1, similarly to the case of the second cycle (the second horizontal interval or the second vertical interval). After that, an order of supplying the data signal is changed for each cycle (for each horizontal interval, or for each vertical interval). According to such a driving method, a variation in the luminance is unlikely to be noticeable.

Note that the order of supplying the data signal may be changed not only for each horizontal interval or for each vertical interval, but also for each of horizontal interval and vertical intervals. According to this driving method, a variation in the luminance is further unlikely to be noticeable.

2.10.2 Second Modification Example

In the first embodiment, the start time point of the scanning line select period SCN is after the delay period DL elapses further after the start time point of the second data period, and the delay period DL is set to the same period in any of the scanning lines S1 to Sn. However, as illustrated in FIG. 2, the scanning line Si and the scanning line Sn are different in a distance from a demultiplexer 41*i*, for example. With this configuration, waveform dulling of the scanning signal SCAN is larger than waveform dulling of the data signal in the pixel circuit connected to the scanning line Sn a distance from which to the demultiplexer 41*i* is larger, and delay of scanning signal SCAN may be larger than delay of the data signal. In this case, a time for writing the data signal into the node N1 is insufficient.

Figure 15A:
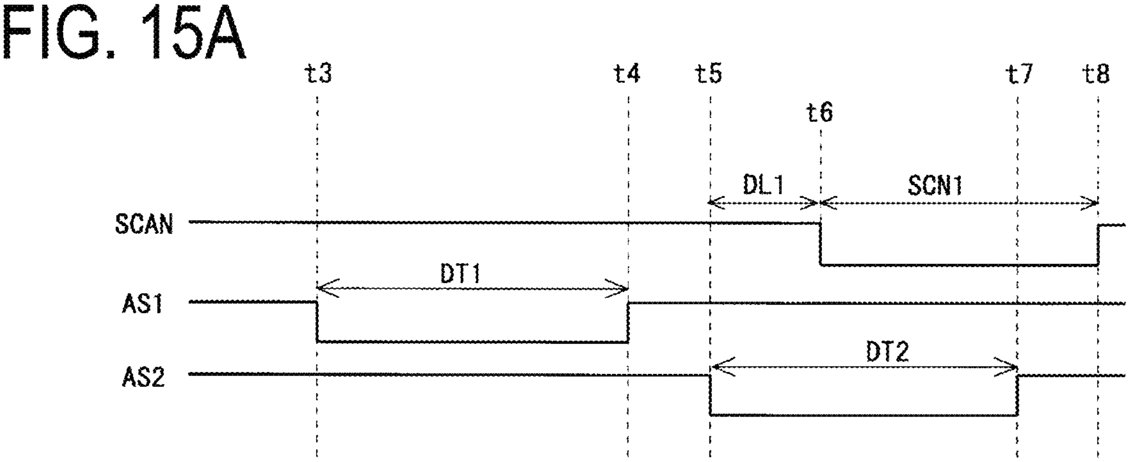
FIGS. 15A to 15C are each a diagram illustrating a relationship between a timing of switching on/off of a selecting transistor of an organic EL display device and a delay period according to a second modification example of the first embodiment. To be more specific.
Figure 15B:
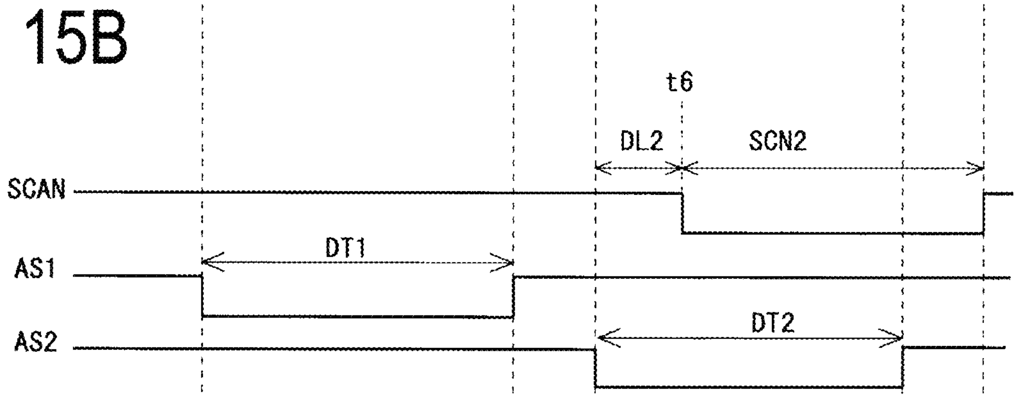
Figure 15C:
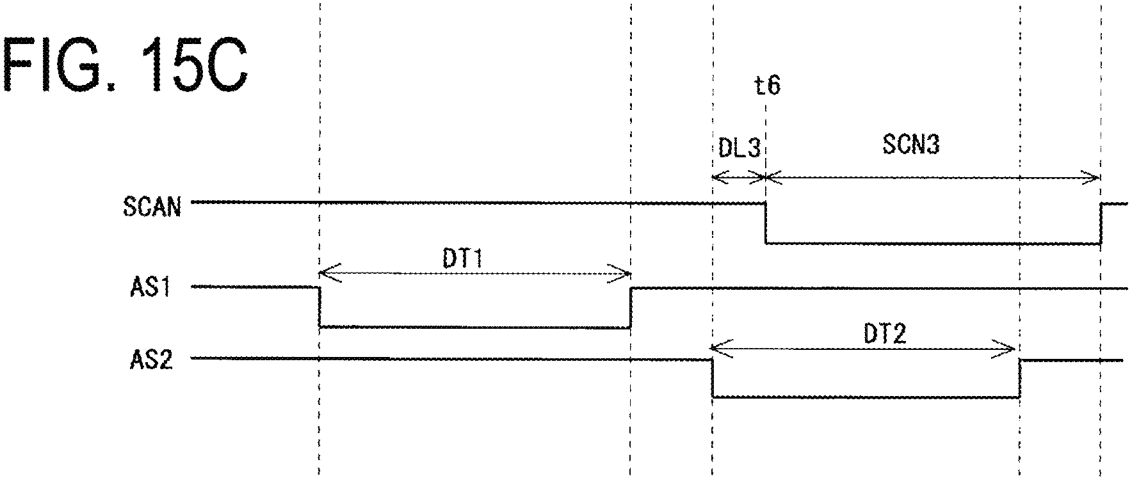

FIGS. 15A to 15C are each a diagram illustrating a relationship between a timing of switching on/off of a selecting transistor of an organic EL display device and a delay period according to a second modification example of the present embodiment. To be more specific, FIG. 15A is a diagram illustrating a length of the delay period DL to be provided to the scanning line select period SCN in a case where a data signal is written into a data line connected to a pixel circuit arranged at a position the closest to the demultiplexer 41*i*, FIG. 15C is a diagram illustrating a length of the delay period DL to be provided to the scanning line select period SCN in a case where a data signal is written into a data line connected to a pixel circuit arranged at a position the farthest from the demultiplexer 41*i*, and FIG. 15B is a diagram illustrating a length of the delay period DL to be provided to the scanning line select period SCN in a case where a data signal is written into a data line connected to a pixel circuit positioned midway between the positions illustrated in FIGS. 15A and 15C. As illustrated in FIGS. 15A to 15C, the larger the distance from the demultiplexer 41*i*, the shorter the length of the delay period DL.

As illustrated in FIGS. 15A to 15C, in any cases, at the time point t5, the data selection signal AS2 supplied to the data control line ASW2 changes from the H level to the L level. This allows the selecting transistor Ms2 to turn to the on state to start the second data period DT2 during which the data signal to be written into the pixel circuit 11*b* is supplied to the data line D2. At the time point t6 after the delay period DL elapses from the time point t5, the scanning signal SCAN changes from the H level to the L level, the scanning line select period SCN starts, and data writing for writing the data signal written into the data line D1 into the node N1 in the pixel circuit 11*a* illustrated in FIG. 2 and data writing for writing the data signal which is being written into the data line D2 into the node N2 in the pixel circuit 11*b*, are started. At this time, in order to lengthen the scanning line select period SCN as the distance becomes longer between the scanning line connected to the pixel circuit into which the data signal is to be written and the demultiplexer 41*i*, the delay periods DL1, DL2, and DL3 are set to be shorter in this order. In this way, in the case where the delay of the scanning signal SCAN is larger than the delay of the data signal, the farther from the demultiplexer 41*i* the position where the pixel circuit is located, the longer the scanning line select period SCN can be set, and therefore, shortage of writing the data signal into the node N1 can be solved even in the pixel circuit located at the position far from the demultiplexer 41*i*.

2.10.3 Third Modification Example

The scanning line S1 and the scanning line Sn are different in the distance from the demultiplexer 41*i*. This may cause the waveform dulling of the data signal of the data line to be larger than the waveform dulling of the scanning signal in the pixel circuit connected to the scanning line Sn the distance from which to the demultiplexer 41*i* is larger, as compared with the pixel circuit connected to the scanning line Si closer to the demultiplexer 41*i*, and the delay of the data signal may be larger than the delay of the scanning signal SCAN. In this case, charge of the data signal to the data line is short. Then, the video settling time TVD(max) representing a maximum time until the input data signal reaches a target charging potential is required to be longer.

Figure 16A:
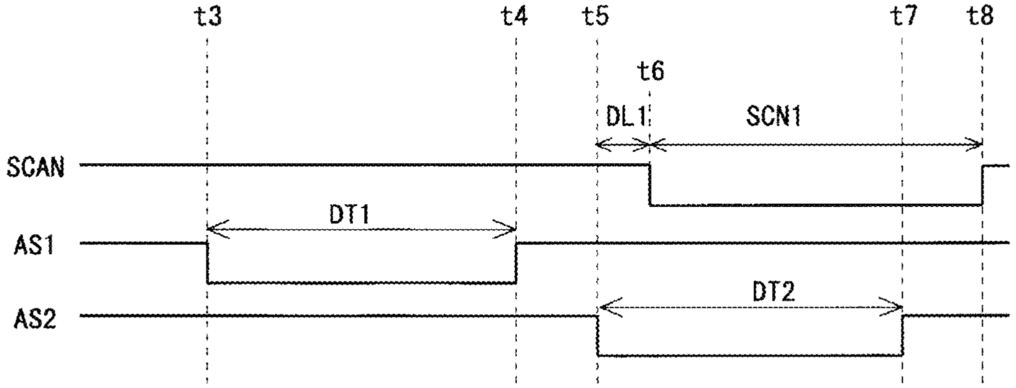
FIGS. 16A to 16C are circuit diagrams illustrating another configuration of an output selecting circuit of an organic EL display device according to a third modification example of the first embodiment. To be more specific.
Figure 16B:
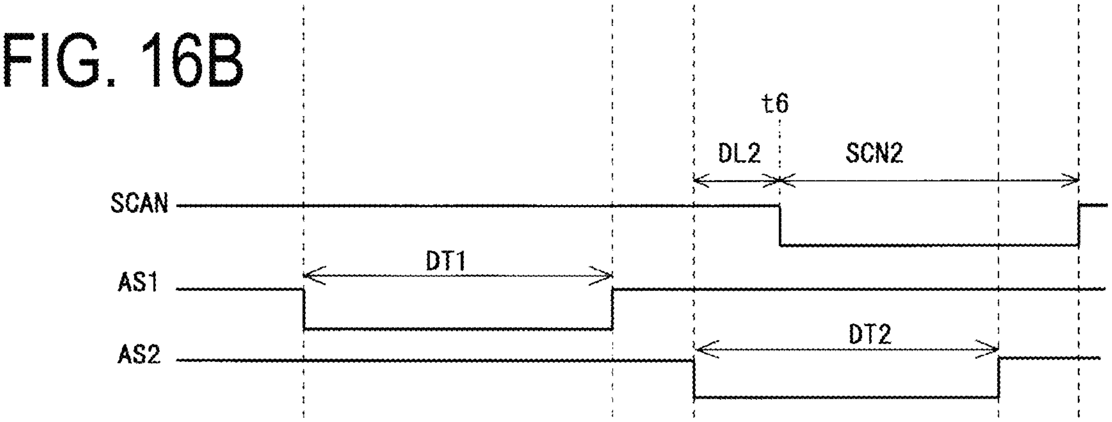
Figure 16C:
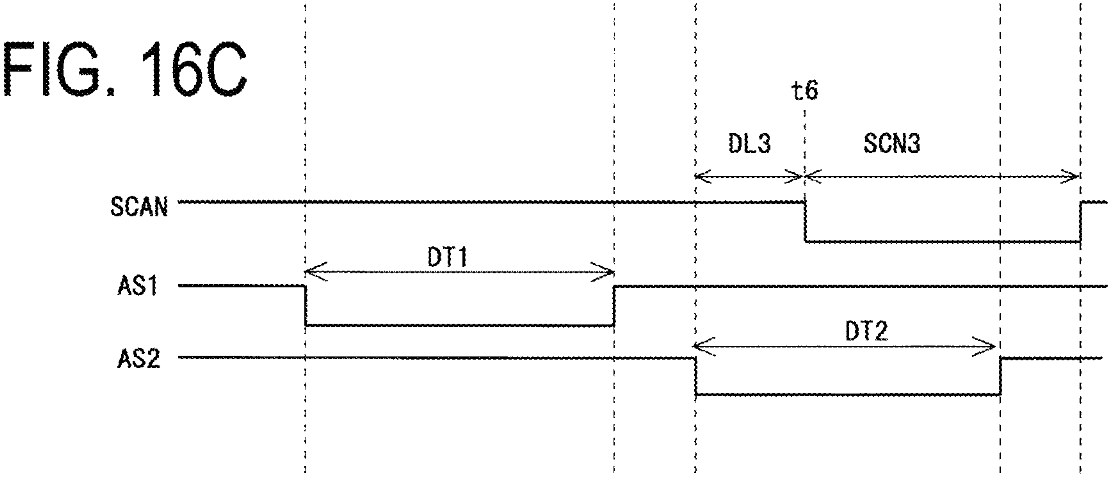

FIGS. 16A to 16C are each a diagram illustrating a relationship between a timing of switching on/off of a selecting transistor of an organic EL display device and a delay period according to a third modification example of the present embodiment. To be more specific, FIG. 16A is a diagram illustrating a length of the delay period DL to be provided to the scanning line select period SCN in a case where a data signal is written into a data line connected to a pixel circuit arranged at a position the closest to the demultiplexer 41*i*, FIG. 16C is a diagram illustrating a length of the delay period DL to be provided to the scanning line select period SCN in a case where a data signal is written into a data line connected to a pixel circuit arranged at a position the farthest from the demultiplexer 41*i*, and FIG. 16B is a diagram illustrating a length of the delay period DL to be provided to the scanning line select period SCN in a case where a data signal is written into a data line connected to a pixel circuit positioned midway between the positions illustrated in FIGS. 16A and 16C.

As a distance becomes longer between the scanning line connected to the pixel circuit into which the data signal is to be written and the demultiplexer 41*i*, the waveform dulling of the data signal written into the pixel circuit 11*b* becomes larger, and therefore, charge of the data signal to the data line may be short. For this reason, as illustrated in FIGS. 16A to 16C, as the distance between the scanning line and the demultiplexer 41*i* becomes longer, lengths of the delay periods DL1, DL2, DL3 are set to be longer in this order. In this way, in the case where the delay of the data signal is larger than the delay of the scanning signal SCAN, the video settling time TVD(max) can be lengthened by the lengthened amount of the delay period DL, and therefore, the charge shortage of the data signal to the data line can be resolved even in the pixel circuit located at the position far from the demultiplexer 41*i*.

2.10.4 Fourth Modification Example

Figure 17:
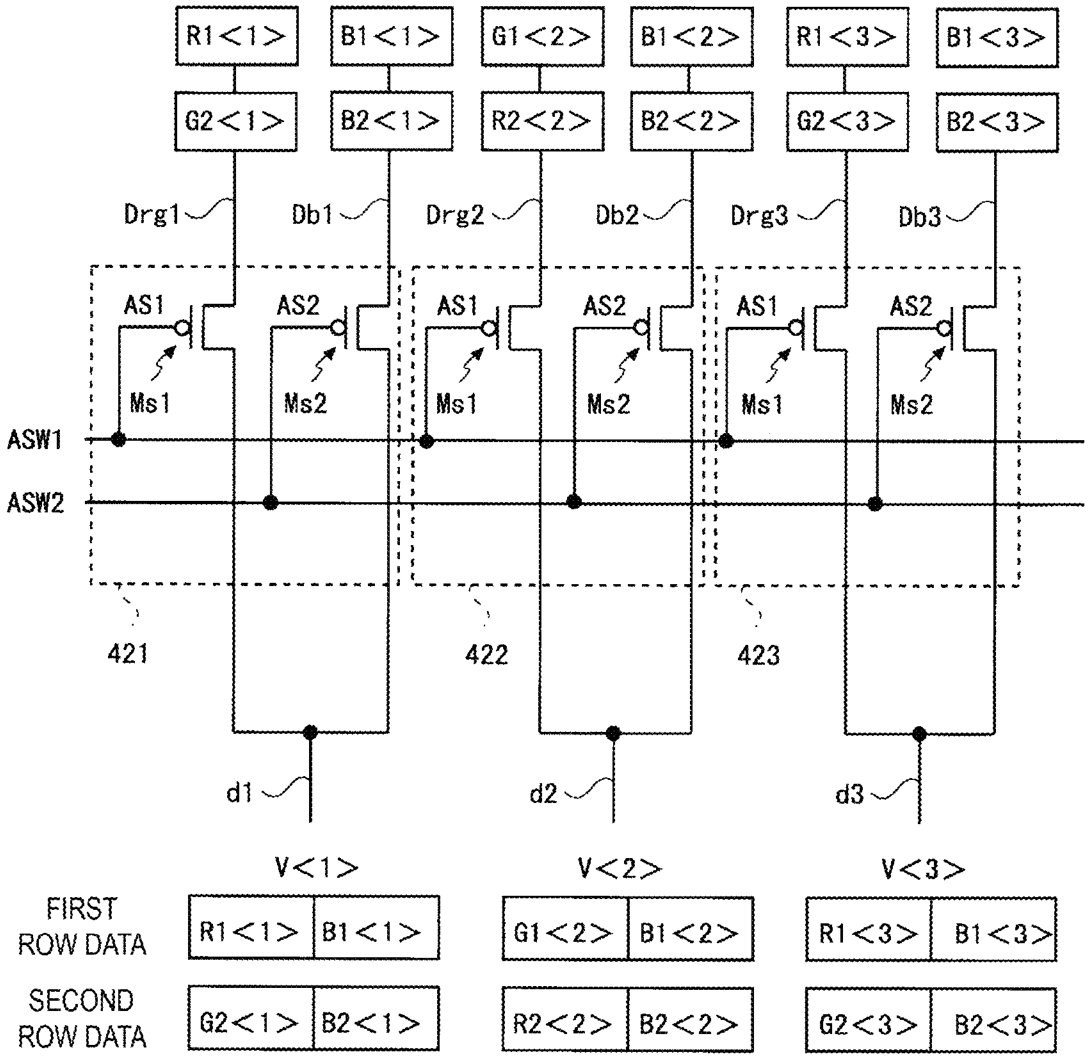
FIG. 17 is a circuit diagram illustrating another configuration of an output selecting circuit of an organic EL display device according to a fourth modification example of the first embodiment.

FIG. 17 is a circuit diagram illustrating another configuration of an output selecting circuit of an organic EL display device according to a fourth modification example of the present embodiment. Each of demultiplexers 421 to 423 included in the output selecting circuit illustrated in FIG. 17 includes a selecting transistor Ms1 and a selecting transistor Ms2. When a scanning line in the first row is selected, the selecting transistor Ms1 in the demultiplexer 421 is given the data selection signal AS1 of the L level from the data control line ASW1 to the gate terminal thereof, and then, selects a data signal R1<1> from a data signal V<1> input from the output line dl to output the selected signal to a data line Drg1. The selecting transistor Ms2 is given the data selection signal AS2 of the L level from the data control line ASW2 to the gate terminal thereof, and then, selects a data signal B1<1> from a data signal V1 input from the output line dl to output the selected signal to a data line Db1.

Similarly, the selecting transistor Ms1 in the demultiplexer 422 selects a data signal G1<2> from a data signal V<2> to output the selected signal to a data line Drg2, and the selecting transistor Ms2 selects a data signal B1<2> to output the selected signal to a data line Db2. The selecting transistor Ms1 in the demultiplexer 423 selects a data signal R1<3> from a data signal V<3> to output the selected signal to a data line Drg3, and the selecting transistor Ms2 selects a data signal B1<3> to output the selected signal to a data line Db3.

Next, when the scanning line in the second row is selected, the selecting transistor Ms1 in the demultiplexer 421 selects a data signal G2<1> from the data signal V<1> to output the selected signal to the data line Drg1, and the selecting transistor Ms2 selects a data signal B2<1> to output the selected signal to the data line Db1. The selecting transistor Ms1 in the demultiplexer 422 selects a data signal R2<2> from the data signal V<2> to output the selected signal to the data line Drg2, and the selecting transistor Ms2 selects a data signal B2<2> to output the selected signal to the data line Db2. The selecting transistor Ms1 in the demultiplexer 423 selects a data signal G2<3> from the data signal V<3> to output the selected signal to a data line Drg3, and the selecting transistor Ms2 selects a data signal B2<3> to output the selected signal to the data line Db3.

In this case, the data signal R1<1> is output to the data line Drg1, and the data signal B1<1> is output to the data line Db1. The output data signals R1<1> and B1<1> are written into a pixel circuit in the first row and first column, and a corresponding R pixel circuit and a corresponding B pixel circuit in the first row and second column. Furthermore, the data signal G1<2> is output to the data line Drg2, and the data signal B1<2> is output to the data line Db2. The output data signals G1<2> and B1<2> are written respectively into a corresponding G pixel circuit in the first row and third column and a corresponding B pixel circuit in the first row and fourth column. These R pixel circuit, G pixel circuit, and B pixel circuit are defined respectively as sub-pixel circuits, and a definition is given that two sub-pixel circuits adjacent to each other constitute one pixel circuit. Specifically, assuming that an R pixel circuit in the first row and first column and a B pixel circuit in the first row and second column are sub-pixel circuits adjacent to each other, these two sub-pixel circuits constitute one pixel circuit (RB pixel circuit), and assuming that a G pixel circuit in the first row and third column and a B pixel circuit in the first row and fourth column are sub-pixel circuits adjacent to each other, these two sub-pixel circuits constitute one pixel circuit (GB pixel circuit).

One pixel circuit originally functions as a unit for displaying an image depending on any of R, G, and B data signals. However, in the modification example, regarding a color of a sub-pixel circuit not included in the pixel circuit, a sub-pixel circuit of an adjacent pixel circuit is lighted and borrowed to display a color image of RGB colors. Specifically, the RB pixel circuit does not include a G sub-pixel circuit, and therefore, borrows a G sub-pixel circuit from a GB pixel circuit next to the RB pixel circuit and lights the G sub-pixel circuit at the same time. The GB pixel circuit does not include an R sub-pixel circuit, and therefore, borrows an R sub-pixel circuit from an RB pixel circuit next to the GB pixel circuit and lights the R sub-pixel circuit at the same time. In this way, a color image of RGB colors is displayed. Such a method is called Sub pixel Rendering (SPR), and a unit of a plurality of pixel circuits required to representing an RGB color image is defined as a pixel set.

In the modification example, one RB pixel circuit and one GB pixel circuit constitute a pixel set. By adopting the sub pixel rendering, the number of sub-pixel circuits in the entire panel can be reduced to two-thirds of a case of a real RGB (that is a method in which RGB sub-pixel circuits are arranged in a stripe in one pixel circuit), improving the resolution in a pseudo way.

A blue organic EL element has problems wherein the luminance is lower, a product life is shorter, and the like as compared with another color organic EL element. In the above description, the pixel set constituted by the RB pixel circuit and GB pixel circuit including the B sub-pixel circuit is described in order to compensate such problems. However, the pixel set is not limited to those described above, and a pixel set constituted by one RG pixel circuit and one BG pixel circuit, for example, may be used.

3. Second Embodiment 3.1 Entire Configuration

Figure 18:
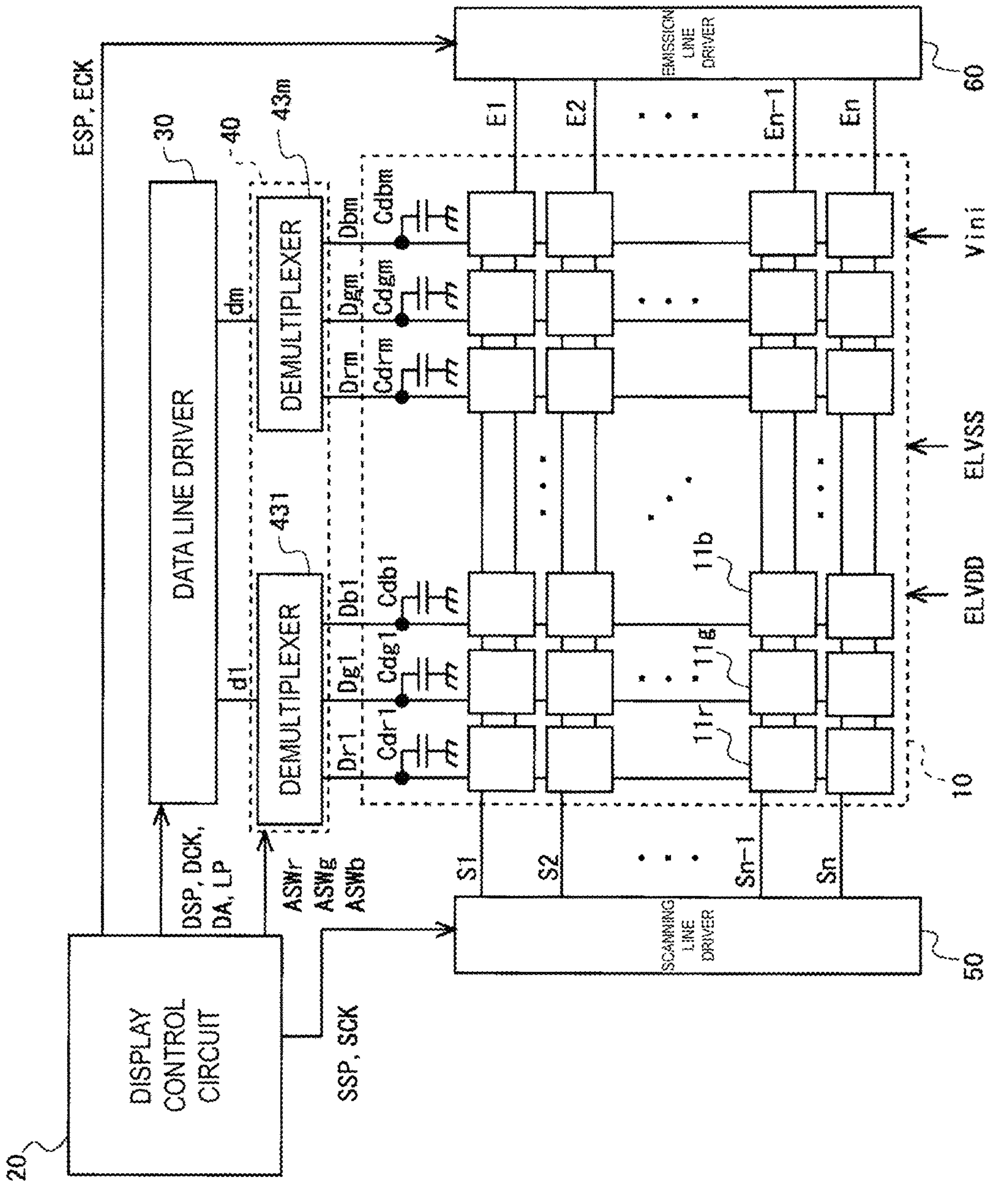
FIG. 18 is a block diagram illustrating an entire configuration of an organic EL display device according to a second embodiment.

FIG. 18 is a block diagram illustrating an entire configuration of an organic EL display device according to a second embodiment. The organic EL display device according to the present embodiment is an active matrix type display device capable of color display of RGB three-primary colors similar to the organic EL display device illustrated in FIG. 5. However, the organic EL display device is different from those in the organic EL display device illustrated in FIG. 5 in that each of demultiplexers 431 to 43*m* includes three selecting transistors (3De-Mux). The configuration is otherwise the same as the configuration of the organic EL display device illustrated in FIG. 5, and a description thereof is omitted.

3.2 Configuration of Demultiplexer

Figure 19:
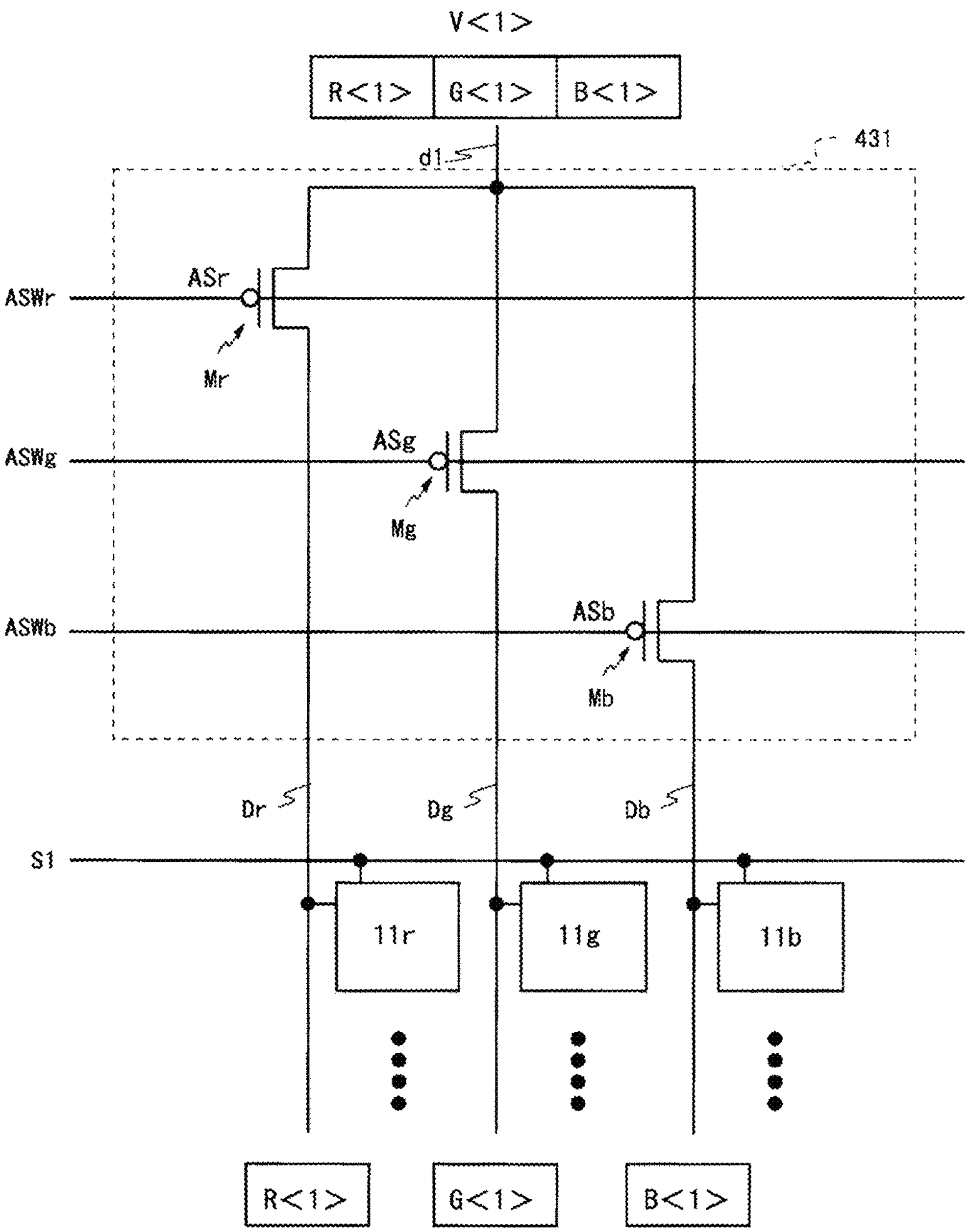
FIG. 19 is a diagram illustrating a connection relationship between respective selecting transistors and pixel circuits included in the output selecting circuit of the organic EL display device illustrated in FIG. 18.

FIG. 19 is a diagram illustrating a connection relationship between the selecting transistors Mr to Mb and the pixel circuits 11*r*, 11*g*, and 11*b* included in the output selecting circuit of the organic EL display device illustrated in FIG. 18. The demultiplexer 431 is provided between the output line dl extending from the data line driver 30 and the data lines Dr1 to Db1.

A description is given of a case that the data signal V<1> including the data signal R1, the data signal G1, and the data signal B1 which are time-divided is applied from the data line driver 30 to the demultiplexer 431, for example. As illustrated in FIG. 19, the demultiplexer 431 includes the selecting transistor Mr, the selecting transistor Mg, and the selecting transistor Mb. A gate terminal of the selecting transistor Mr is connected to a data control line ASWr, a gate terminal of the selecting transistor Mg is connected to a data control line ASWg, and a gate terminal of the selecting transistor Mb is connected to a data control line ASWb. When a data selection signal ASr of the L level is applied from the data control line ASWr to the gate terminal of the selecting transistor Mr, the selecting transistor Mr selects the data signal R<1> from the data signal V<1> to output the selected signal to the data line Dr. Similarly, the selecting transistor Mg outputs the data signal G<1> to the data line Dg, and the selecting transistor Mb the data signal B<1> outputs to the data line Db. With this configuration, the data signal R<1> is written into the pixel circuit 11*r*, the data signal G<1> is written into the pixel circuit 11*g*, and the data signal B<1> is written into the pixel circuit 11*b*.

Figure 20:
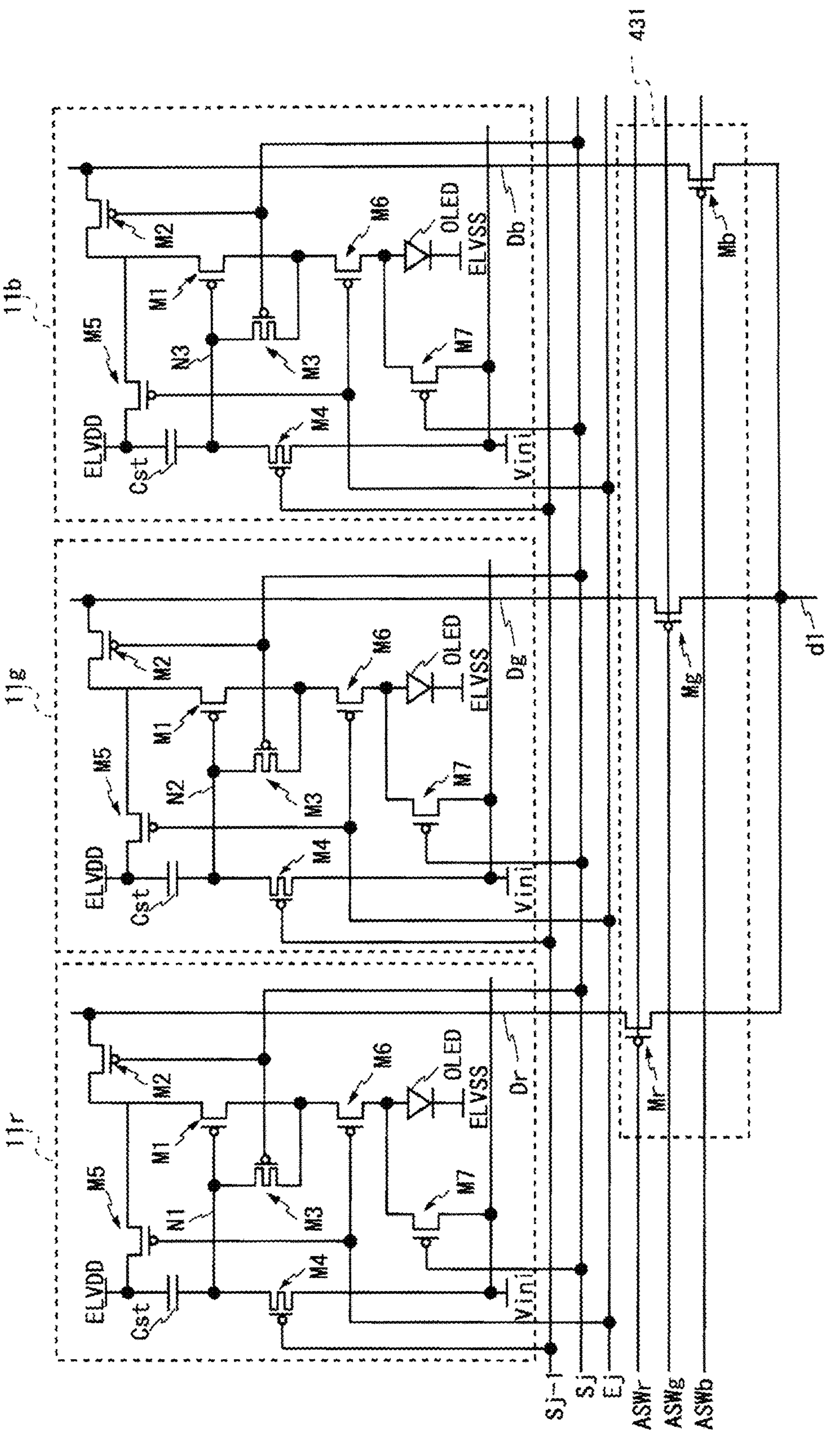
FIG. 20 is a circuit diagram illustrating a connection relationship between the pixel circuits and various wiring lines in the organic EL display device illustrated in FIG. 18.

FIG. 20 is a circuit diagram illustrating a connection relationship between three pixel circuits 11*r*, 11*g* and 11*b* connected to the demultiplexer 431 and various wiring lines. Configurations of these pixel circuits 11*r*, 11*g*, and 11*b* are the same as the case illustrated in FIG. 2, and therefore, a description thereof is omitted. Note that in FIG. 20, three data control lines ASWr, ASWg, and ASWb are arranged on the substrate correspondingly to the pixel circuits 11*r*, 11*g*, and 11*b*, differently from the case illustrated in FIG. 2. When the data selection signal ASr of the H level is applied to the data control line ASWr, the selecting transistor Mr turns to the on state so that the data line Dr in the pixel circuit 11*r* is connected to the output line dl via the selecting transistor Mr. When the data selection signal ASg of the H level is applied to the data control line ASWg, the selecting transistor Mg turns to the on state so that the data line Dg in the pixel circuit 11*g* is connected to the output line dl via the selecting transistor Mg. When the data selection signal ASb of the H level is applied to the data control line ASWb, the selecting transistor Mb turns to the on state so that the data line Db in the pixel circuit 11*b* is connected to the output line dl via the selecting transistor Mb. Note that in the present embodiment, a "prescribed number of data lines" refers to three data lines including the RGB data lines Dr, Dg, and Db, and a "prescribed number of data signals" refers to three data signals including the RGB data signals.

3.3 Driving Method

Figure 21:
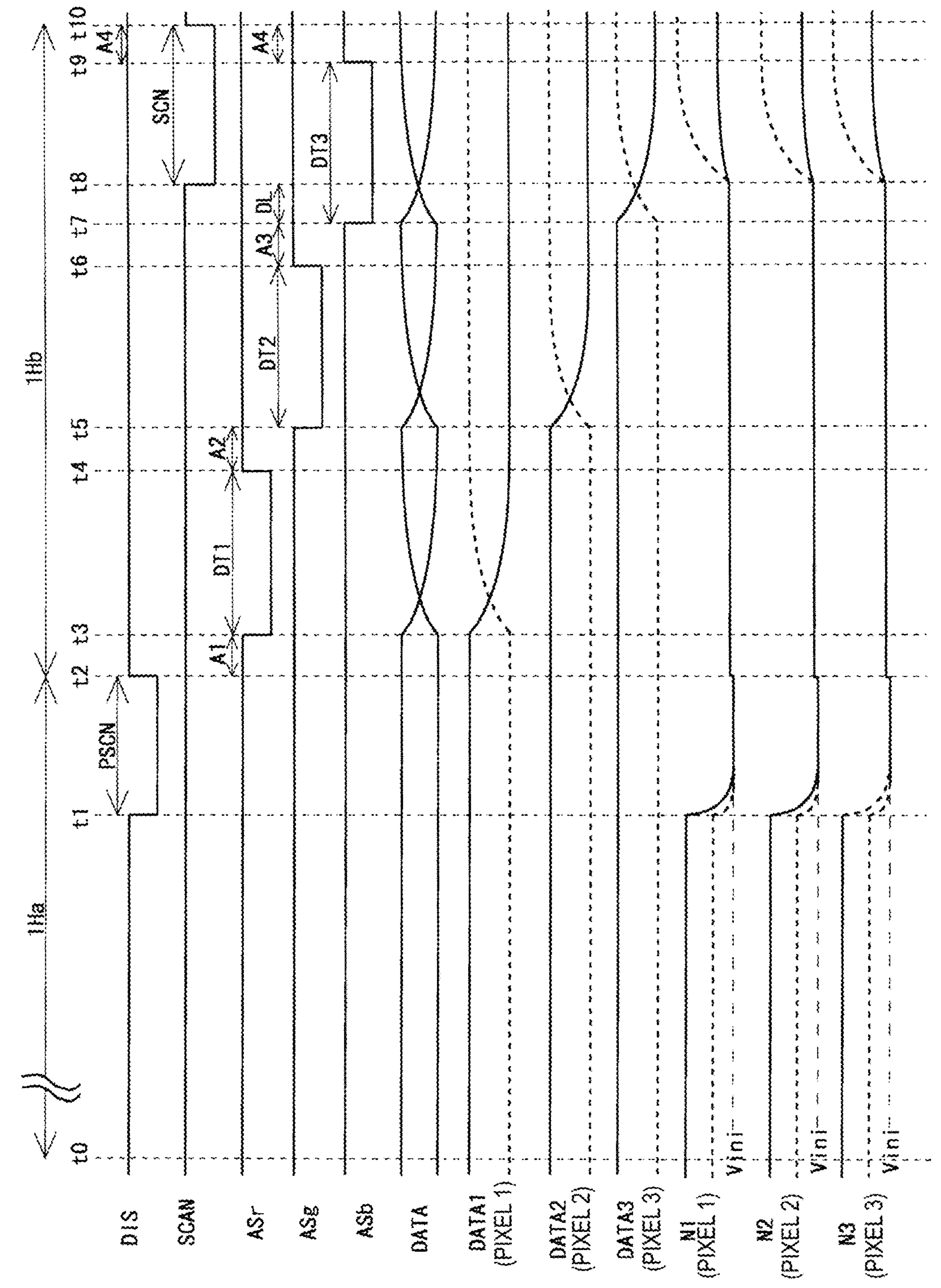
FIG. 21 is a timing chart illustrating a driving method of three pixel circuits illustrated in FIG. 19.
Figure 22:
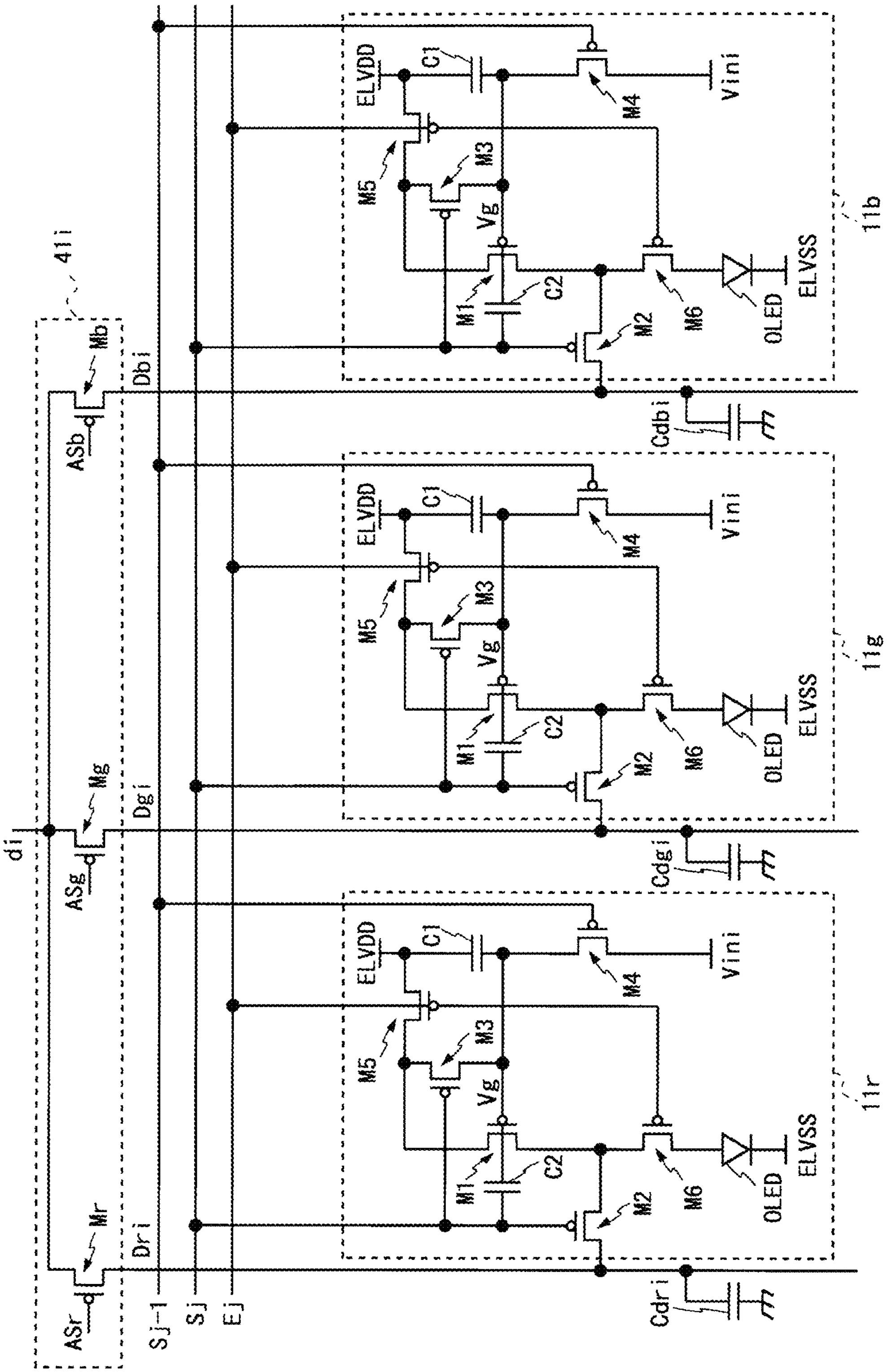
FIG. 22 is a circuit diagram illustrating a connection relationship between pixel circuits and various wiring lines in an example in the related art.
Figure 23:
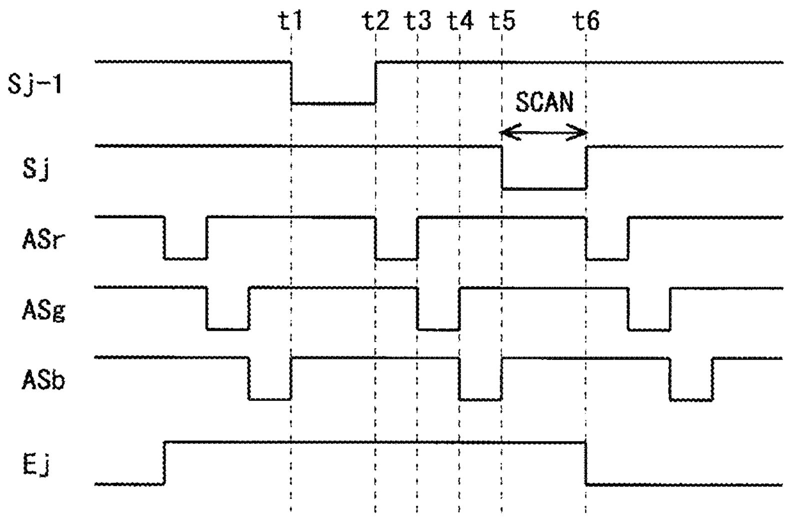
FIG. 23 is a timing chart illustrating a driving method of a pixel circuit illustrated in FIG. 22.
Figure 24:
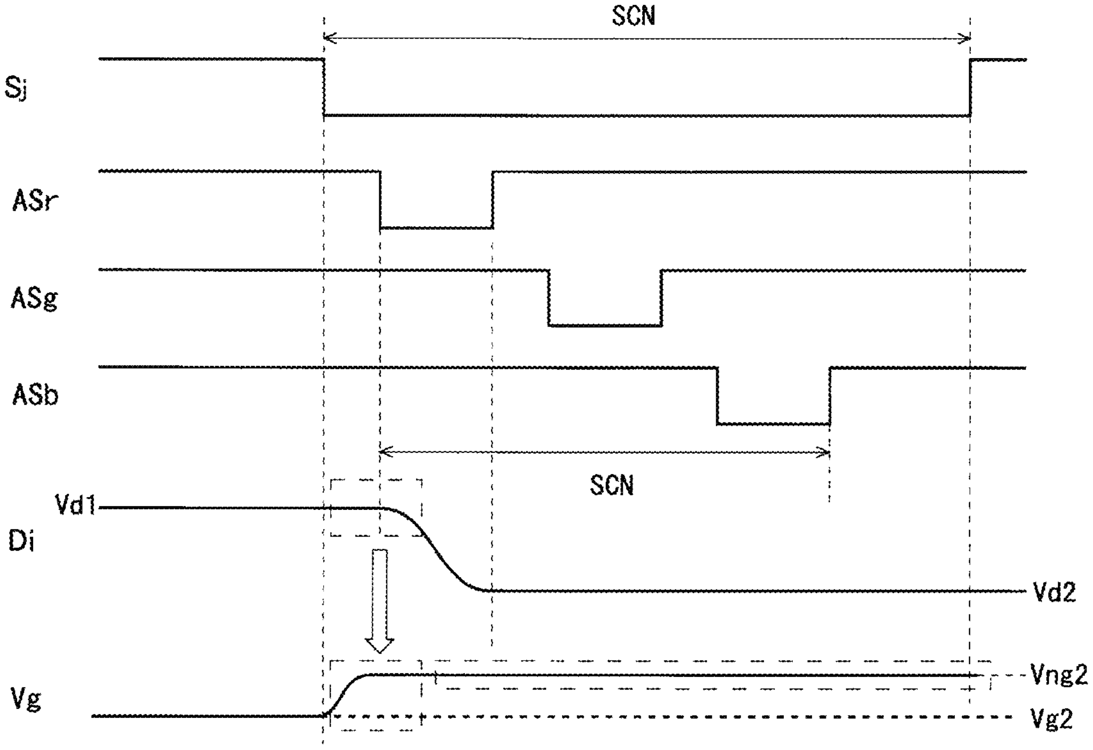
FIG. 24 is a signal waveform diagram describing a problem in a known organic EL display device.

FIG. 21 is a timing chart illustrating a driving method of the pixel circuit 11*r*, the pixel circuit 11*g*, and the pixel circuit 11*b* illustrated in FIG. 19. In the description of the driving method below, as illustrated in FIG. 19, the demultiplexer 431 includes three selecting transistors Mr, Mg, and Mb, drain terminals of the selecting transistors Mr, Mg, and Mb are connected respectively to the connected data lines Dr, Dg, and Db, and the data lines Dr, Dg, are Db are connected respectively to pixel circuits 11*r*, 11*g*, and 11*b*. In this case, a description is given of a driving method for writing the data signals into the pixel circuits 11*r*, 11*g*, and 11*b* by controlling the on/off states of the selecting transistors Mr, Mg, and Mb.

A first horizontal interval 1Ha is the same as the first horizontal interval 1Ha illustrated in FIG. 7, and therefore, a description thereof is omitted. After a first adjustment period A1 from the time point t2 to the time point t3 elapses, the data selection signal ASr changes from the H level to the L level at the time point t3. This allows the selecting transistor Mr to turn to the on state to start supplying the data signal to be written into the pixel circuit 11*r* to the data line Dr. After that, when the data selection signal ASr changes to the H level at the time point t4, the selecting transistor Mr turns to the off state, and then, the first data period DT1 ends. Therefore, the selecting transistor Mr turns to the off state, and then, the first data period DT1 ends. However, also after the time point t4, the data signal is held in the data line Dr.

After a second adjustment period A2 from the time point t4 to the time point t5 elapses, the data selection signal ASg changes from the H level to the L level at the time point t5. This allows the selecting transistor Mg to turn to the on state to start supplying the data signal to be written into the pixel circuit 11*g* to the data line Dg. After that, the data selection signal ASg changes to the H level at the time point t6. Therefore, the selecting transistor Mg turns to the off state, and then, the second data period DT2 ends. However, also after the time point t6, the data signal is held in the data line Dg. Note that in the present embodiment, the data signal to be written into the pixel circuit 11*b* is to be further supplied to the data line Db, and the scanning line select period SCN is not started during the second data period DT2. For this reason, the second data period DT2 is not provided with the delay period DL.

After a third adjustment period A3 (the same period as the second adjustment period A2) from the time point t6 to the time point t7 elapses, the data selection signal ASb changes from the H level to the L level at the time point t7. This allows the selecting transistor Mb to turn to the on state to start supplying the data signal to be written into the pixel circuit 11*b* to the data line Db. After that, the data selection signal ASb changes to the H level at the time point t9. Therefore, the selecting transistor Mb turns to the off state, and then, the third data period DT3 ends. During the third data period DT3, at the time point t8 which is later by the delay period DL than the start time point t7 of the third data period DT3, the scanning signal SCAN changes from the H level to the L level, and then, the scanning line select period SCN starts.

After that, the third data period DT3 ends at the time point t9, but the data signal to be written into the pixel circuit 11*b* is held in the data line Db after the time point t9 also. The scanning line select period SCN starting at the time point t8 continues until the time point t10 later than the end time point t9 of the third data period DT3, and during the scanning line select period SCN, the data signals held in the data lines Dg to Db are written into the pixel circuits 11*r*, 11*g*, and 11*b*, respectively. For example, the R data signal held in the data line D1 is supplied to the node N1 in the pixel circuit 11*r* so that the data voltage is applied to the gate terminal of the driving transistor M1. If the H level voltage ELVDD is supplied via the current supply transistor M5 to the first conduction terminal of the driving transistor M1, the driving transistor M1 turns to the on state. With this configuration, the driving transistor M1 supplies the drive current depending on the data signal to the organic EL element OLED so that the organic EL element OLED emits a light. Similarly, the G data signal and the B data signal held in the data line Dg and the data line Db are supplied respectively to the node N2 in the pixel circuit 11*g* and the node N3 in the pixel circuit 11*b* so that the organic EL elements OLED in the pixel circuit 11*g* and the pixel circuit 11*b* emit lights. Note that in the above description, the data signal (R data signal) written into the data line D1 during the first data period DT1 may be referred to as a "first data signal", the data signal (G data signal) written into the data line D2 during the second data period DT2 may be referred to as a "second data signal", and the data signal (B data signal) written into the data line D3 during the third data period DT3 may be referred to as a "third data signal".

In the present embodiment (3De-Mux) also, the lower limit value of the delay period DL is obtained similarly to the relationship (6) described in the first embodiment. Specifically, from the timing chart illustrated in FIG. 21, DT1=DT2≈TVD(max) holds as in the case of the first embodiment, and A2=A3 holds, then $$1H-SCN-A1-A2-A3-DT1-DT2=1H-SCN-A1-2\times A2-2\times TVD(\max)\leq DL \qquad (13)$$

The upper limit value of the delay period DL is also obtained by the following relationship (14) similarly to the above relationship (10).

$$1H-SCN(\min)-A1-2\times A2-2\times TVD(\max)\geq DL \qquad (14)$$

In consideration of the waveform dulling period TVDscan (max), the relationship (13) and the relationship (14) are replaced to the following relationship (15) and the following relationship (16).

$$1H-SCN-A1-2\times A2-2\times TVD(\max)-TVD\mathrm{scan}(\max)\leq DL \qquad (15)$$

$$1H-SCN(\min)-A1-2\times A2-2\times TVD(\max)-TVD\mathrm{scan}(\max)\geq DL \qquad (16)$$

In a case of a driving method further generalized in which the data signals generated by the data line driver are demultiplexed and supplied to n data lines (nDe-Mux: n represents an integer equal to or more than 2), from the results of the first and second embodiments, the lower limit value and upper limit value of the delay period DL are obtained by the following relationship (17) and the following relationship (18).

$$1H-SCN-A1-(n-1)\times A2-(n-1)\times TVD(\max)\leq DL \qquad (17)$$

$$1H-SCN(\min)-A1-(n-1)\times A2-(n-1)\times TVD(\max)\geq DL \qquad (18)$$

The lower limit value and upper limit value of the delay period DL in consideration of the waveform dulling period TVDscan(max) are obtained respectively by the following relationship (19) and the following relationship (20).

$$1H-SCN-A1-(n-1)\times A2-(n-1)\times TVD(\max)-TVD\mathrm{scan}(\max)\leq DL \qquad (19)$$

$$1H-SCN(\min)-A1-(n-1)\times A2-(n-1)\times TVD(\max)-TVD\mathrm{scan}(\max)\geq DL \qquad (20)$$

Note that effects of the second embodiments are substantially the same as the first embodiment, and therefore, a description thereof is omitted. In the above relationship (13) to the relationship (20), the adjustment period A1 and a plurality of adjustment periods A2 can be collectively the "adjustment period A".

5. Others

A display in the present embodiment is not limited to the display panel including the organic EL element OLED, but a display device including a display element driven by a current may be a display provided with the display element of which the luminance or transmittance is controlled by a current. Examples of the display like this provided with an electro-optical element controlled by a current includes an EL display such as an organic EL display provided with an Organic Light Emission Diode (OLED) and an inorganic EL display provided with an inorganic light emission diode, and a QLED display provided with a Quantum dot Light Emission Diode.

4. Supplementary Notes

A display device described in Supplementary Note 1 is a display device including a plurality of data lines configured to transmit a plurality of data signals indicating an image to be displayed, a plurality of scanning lines intersecting the plurality of data lines, and a plurality of pixel circuits arranged in a matrix along the plurality of data lines and the plurality of scanning lines, the display device comprising:

a data line drive circuit including a plurality of output terminals respectively corresponding to a plurality of sets of data line groups, the data line group being obtained by grouping the plurality of data lines with a prescribed number of two or more data lines being used as a set, the data line drive circuit being configured to time-divisionally output a prescribed number of data signals to be transmitted from each output terminal through a prescribed number of data lines corresponding to the output terminal;

an output selecting circuit including a plurality of demultiplexers respectively connected to the plurality of output terminals of the data line drive circuit and respectively corresponding to the plurality of sets of data line groups; and a scanning line drive circuit selectively configured to drive the plurality of scanning lines, wherein each of the plurality of pixel circuits corresponds to any one of the plurality of data lines and corresponds to any one of the plurality of scanning lines, each pixel circuit includes a display element driven by a current, a holding capacitor configured to hold a voltage controlling a drive current for the display element, and a driving transistor configured to apply the drive current corresponding to the voltage held by the holding capacitor to the display element, and is configured to apply a voltage of a corresponding data line via the driving transistor to the holding capacitor due to the driving transistor in a diode-connected state in a case where a corresponding scanning line is in a select state, a prescribed period included in a period from a time point when to start supplying a data signal output in each of horizontal intervals last among the prescribed number of data signals to a time point before a time point when to end supplying the data signal is set in advance as a delay period, each demultiplexer demultiplexes the prescribed number of data signals output in each of the horizontal intervals during the horizontal interval and supplies the demultiplexed data signals respectively to the prescribed number of data lines, and the scanning line drive circuit starts to select a scanning line corresponding to the pixel circuit to which the prescribed number of data signals are supplied, when the delay period of each of the horizontal intervals ends.

According to a display device described in Supplementary Note 2, in the display device described in Supplementary Note 1, a time point when to end selecting the scanning line is preferably a time point after the time point when to end supplying the data signal.

According to the display device described in Supplementary Note 2 above, the scanning line select periods during which the data signals are written into the pixel circuits are the same and the scanning line select period is lengthened, and therefore, variation in the flowing drive current are reduced regardless of the pixel circuits adjacent to each other and the position inside the display surface. This reduces the luminance unevenness between the pixel circuits adjacent to each other and owing to the position inside the display surface.

According to a display device described in Supplementary Note 3, in the display device described in Supplementary Note 1, the delay period preferably satisfies the following relationship, $$DL \geq 1H - SCN - A - (n-1) \times TVD(\max)$$

where DL represents the delay period, 1H represents one horizontal interval, SCN represents a scanning line reversal period, n represents the number of multiplexed data signals, TVD(max) represents a maximum video settling time, and A represents a total period of adjustment periods.

According to the display device described in Supplementary Note 3 above, even if a data voltage of the high level is written into the data line during the last horizontal interval, a data voltage of the low level can be written into the pixel circuit connected to the data line during the scanning line select period SCN in the next horizontal interval. With this configuration, regardless of the level of the data signal, each pixel circuit can be made to emit a light with a luminance depending on the data signal.

According to a display device described in Supplementary Note 4, in the display device described in Supplementary Note 3, the delay period is preferably at least equal to or more than 0.4 μs.

According to the display device described in Supplementary Note 4 above, the delay period is at least equal to or more than 0.4 μs, and thus a data signal of a target voltage value can be written into the pixel circuit regardless of the level of the data signal.

According to a display device described in Supplementary Note 5, in the display device described in Supplementary Note 1, the delay period preferably satisfies the following relationship, $$DL \leq 1H - SCN(\min) - A - (n-1) \times TVD(\max)$$

where DL represents the delay period, 1H represents one horizontal interval, SCN(min) represents a shortest scanning line reversal period required for writing the data signals applied in one horizontal interval into a corresponding pixel circuit, n represents the number of multiplexed data signals, TVD(max) represents a maximum video settling time, and A represents a total period of adjustment periods.

According to the display device described in Supplementary Note 5 above, the multiplexed data signals can be written into the corresponding pixel circuits in one horizontal interval.

According a display device Supplementary Note 6, in the display device described in Supplementary Note 1, it is preferable that the prescribed number of data signals includes a first data signal and a second data signal, the demultiplexer includes a first selecting transistor configured to select the first data signal from the prescribed number of data signals output during the horizontal intervals to supply to a first data line, and a second selecting transistor configured to select the second data signal to supply to a second data line, and the first selecting transistor is configured to supply the first data signal to the first data line, and the second selecting transistor is configured to supply the second data signal to the second data line after the first data signal is supplied to the first data line.

According to the display device described in Supplementary Note 6 above, in Supplementary Note 1, in a case where the prescribed number is "2", the delay period is a period from a time point when to start supplying the second data signal to the second data line to time point when to start selecting the scanning line. This provides a similar effect to the case of Supplementary Note 1 also in the case where the prescribed number is "2".

According to a display device described in Supplementary Note 7, in the display device described in Supplementary Note 6, it is preferable that wherein the prescribed number of data signals further includes a third data signal, the demultiplexer further includes a third selecting transistor configured to select the third data signal for each of the horizontal intervals to supply to a third data line, and the third selecting transistor is configured to supply the third data signal to the third data line after the second data signal is supplied to the second data line.

According to the display device described in Supplementary Note 7 above, in Supplementary Note 1, in a case where the prescribed number is "3", the delay period is a period from a time point when to start supplying the third data signal to the third data line to time point when to start selecting the scanning line. This provides a similar effect to the case of Supplementary Note 1 also in the case where the prescribed number is "3".

According to a display device described in Supplementary Note 8, in the display device described in Supplementary Note 6 or 7, the demultiplexer is preferably configured to change an order of the data signals selected from the prescribed number of data signals for each of the horizontal intervals.

According to the display device described in Supplementary Note 8 above, an order of the data signals supplied is changed for each cycle so that the variation in the luminance is unlikely to be noticeable.

According to a display device described in Supplementary Note 9, in the display device described in Supplementary Note 6 or 7, the demultiplexer is preferably configured to change an order of the data signals selected from the prescribed number of data signals for each of vertical intervals.

According to the display device described in Supplementary Note 9 above, an order of the data signals supplied is changed for each cycle so that the variation in the luminance is unlikely to be noticeable, similar to the case of the display device described in Supplementary Note 8.

According to a display device described in Supplementary Note 10, in the display device described in Supplementary Note 6 or 7, the demultiplexer is preferably configured to change an order of the data signals selected from the prescribed number of data signals for each of the horizontal intervals and for each of vertical intervals.

According to the display device described in Supplementary Note 10 above, an order of the data signals supplied is changed for each cycle so that the variation in the luminance is further unlikely to be noticeable.

According to a display device described in Supplementary Note 11, in the display device described in Supplementary Note 6, it is preferable that the first data signal includes two kinds of data signals respectively expressing images of two kinds of colors, and the second data signal is a data signal expressing an image of a color different from the first data signal, and the first selecting transistor is configured to supply alternately the two kinds of data signals included in the first data signal to the first data line for each of the horizontal intervals, and the second selecting transistor is configured to supply the second data signal to the second data line for each of the horizontal intervals.

According to the display device described in Supplementary Note 11 above, by adopting the sub pixel rendering, the number of sub-pixel circuits in the entire panel can be reduced to two-thirds of a case of a real RGB, improving the resolution in a pseudo way.

According to a display device described in Supplementary Note 12, in the display device described in Supplementary Note 1, it is preferable that in a case where a delay of the data signal is larger than a delay of a scanning signal, the delay period is set to be longer as a distance from the demultiplexer to a scanning line connected to the pixel circuit into which the prescribed number of data signals are to be written is longer.

According to the display device described in Supplementary Note 12 above, in the case where the delay of the scanning signal is larger than the delay of the data signal, the longer the distance from the demultiplexer to the scanning line connected to the pixel circuit into which the prescribed number of data signals are to be written, the shorter the delay period is set to be. This is because a waveform of the scanning signal dulls as the distance from the demultiplexer is longer, and therefore, a time for writing data signal into the node N1 is required to be longer. In this way, by shortening the delay period, the data writing period for the pixel circuit can be lengthened and shortage of writing the data signal into the node N1 can be resolved.

According to a display device described in Supplementary Note 13, in the display device described in Supplementary Note 1, it is preferable that in a case where a delay of the data signal is larger than a delay of the scanning signal, the delay period is set to be longer as a distance from the demultiplexer to a scanning line connected to the pixel circuit into which the prescribed number of data signals are to be written is longer.

According to the display device described in Supplementary Note 13 above, in the case where the delay of the data signal is larger than the delay of the scanning signal, the longer the distance from the demultiplexer to the scanning line connected to the pixel circuit into which the prescribed number of data signals are to be written, the longer the delay period is set to be. This is because a waveform of the data signal dulls as the distance from the demultiplexer is longer, and therefore, a time for charge of the data signal to the data line is required to be longer. Then, by lengthening the delay period, a period for charge of the data signal to the data line can be lengthened, and the charge shortage of the data signal can be resolved.

REFERENCE SIGNS LIST

10 Display portion
11*x* Pixel circuit (x=a, b or x=r, g, b)
Pa1, Pa2, Pb1, Pb2 Pixel circuit
20 Display control circuit
30 Data line driver (data line drive circuit)
40 Output selecting circuit
411 to 41*m*, 421 to 423, 431 to 43*m* Demultiplexer
50 Scanning line driver (scanning line drive circuit)
60 Emission line driver
di Output line (i=1 to m)
Dx Data line (x=1, 2, 3 or x=r, g, b)
Sj Scanning line (j=1 to n)
Ej Emission line (control line) (j=1 to n)
M1 to M7 Transistor
Cst Storage capacitor (holding capacitor element)
Cdri, Cdgi, Cdbi Data capacitor (i=1 to m)
11*a*, 11*b* Pixel circuit
11*r*, 11*g*, 11*b* Pixel circuit
Ms1, Ms2, Mr, Mg, Mb Selecting transistor
M1 Driving transistor
M2 Write transistor
M3 Compensation transistor
M4, M7 Initialization transistor
M5 Current supply transistor
M6 Light emission control transistor
DT1, DT2, DT3 Data period
SCN Scanning line select period
DL Delay period
PSCN Initialization period
Vini Initialization line and initialization voltage
ASWx Data control line (x=1, 2 or x=r, g, b)
ASx Data selection signal (x=1, 2 or r, g, b)

The invention claimed is:

1. A display device including a plurality of data lines that transmit a plurality of data signals indicating an image to be displayed, a plurality of scanning lines intersecting the plurality of data lines, and a plurality of pixel circuits arranged in a matrix along the plurality of data lines and the plurality of scanning lines, the display device comprising:

a data line drive circuit including a plurality of output terminals respectively corresponding to a plurality of sets of data line groups, the data line groups being obtained by grouping the plurality of data lines with a prescribed number of two or more data lines being used as a set, the data line drive circuit time-divisionally outputting a prescribed number of data signals to be transmitted from each of the plurality of output terminals through a prescribed number of data lines corresponding to the each of the plurality of output terminals;

an output selecting circuit including a plurality of demultiplexers respectively connected to the plurality of output terminals of the data line drive circuit and respectively corresponding to the plurality of sets of data line groups; and a scanning line drive circuit selectively driving the plurality of scanning lines, wherein each of the plurality of pixel circuits corresponds to any one of the plurality of data lines and corresponds to any one of the plurality of scanning lines, each pixel circuit includes a display element driven by a current, a holding capacitor that holds a voltage controlling a drive current for the display element, and a driving transistor that applies the drive current corresponding to the voltage held by the holding capacitor to the display element, and applies a voltage of a corresponding data line via the driving transistor to the holding capacitor due to the driving transistor in a diode-connected state in a case where a corresponding scanning line is in a select state, a period included in a period from or after a time point when supplying a data signal output starts in each of horizontal intervals last among the prescribed number of data signals to a time point before a time point when supplying the data signal ends is set in advance as a delay period, each demultiplexer demultiplexes the prescribed number of data signals output in each of the horizontal intervals during the horizontal interval and supplies the demultiplexed data signals respectively to the prescribed number of data lines, the scanning line drive circuit starts to select a scanning line corresponding to the pixel circuit to which the prescribed number of data signals are supplied, when the delay period of each of the horizontal intervals ends, and in a case where a delay of a scanning signal is larger than a delay of the data signal, the delay period is set to be shorter as a distance from the demultiplexer to a scanning line connected to the pixel circuit into which the prescribed number of data signals are to be written is longer.

2. The display device according to claim 1, wherein a time point when selecting the scanning line ends is a time point after the time point when supplying the data signal ends.

3. The display device according to claim 1, wherein the delay period has a value satisfying a following relationship, $$DL \geq 1H - SCN - A - (n-1) \times TVD(\max)$$

where DL represents the delay period, 1H represents one horizontal interval, SCN represents a scanning line reversal period, n represents a number of multiplexed data signals, TVD(max) represents a maximum video settling time, and A represents a total period of adjustment periods between signals.

4. The display device according to claim 3, wherein the delay period is at least equal to or more than 0.4 μs.

5. The display device according to claim 1, wherein the delay period has a value satisfying a following relationship, $$DL \leq 1H - SCN(\min) - A - (n-1) \times TVD(\max)$$

where DL represents the delay period, 1H represents one horizontal interval, SCN(min) represents a shortest scanning line reversal period required for writing the data signals applied in one horizontal interval into a corresponding pixel circuit, n represents a number of multiplexed data signals, TVD(max) represents a maximum video settling time, and A represents a total period of adjustment periods between signals.

6. The display device according to claim 1, wherein the prescribed number of data signals includes a first data signal and a second data signal, the demultiplexer includes a first selecting transistor that selects the first data signal from the prescribed number of data signals output during the horizontal intervals to supply to a first data line, and a second selecting transistor that selects the second data signal to supply to a second data line, and the first selecting transistor supplies the first data signal to the first data line, and the second selecting transistor supplies the second data signal to the second data line after the first data signal is supplied to the first data line.

7. The display device according to claim 6, wherein the demultiplexer changes an order of the data signals selected from the prescribed number of data signals for each of the horizontal intervals.

8. The display device according to claim 6, wherein the demultiplexer changes an order of the data signals selected from the prescribed number of data signals for each vertical interval.

9. The display device according to claim 6, wherein the first data signal includes two kinds of data signals respectively expressing images of two kinds of colors, and the second data signal is a data signal expressing an image of a color different from the first data signal, and the first selecting transistor alternately supplies the two kinds of data signals included in the first data signal to the first data line for each of the horizontal intervals, and the second selecting transistor supplies the second data signal to the second data line for each of the horizontal intervals.

10. The display device according to claim 1, wherein in the case where the delay of the scanning signal is larger than the delay of the data signal, as the distance from the demultiplexer to the scanning line connected to the pixel circuit into which the prescribed number of data signals are to be written is longer, a corresponding scanning line select period is set to be longer.

11. A display device including a plurality of data lines that transmit a plurality of data signals indicating an image to be displayed, a plurality of scanning lines intersecting the plurality of data lines, and a plurality of pixel circuits arranged in a matrix along the plurality of data lines and the plurality of scanning lines, the display device comprising:

a data line drive circuit including a plurality of output terminals respectively corresponding to a plurality of sets of data line groups, the data line groups being obtained by grouping the plurality of data lines with a prescribed number of two or more data lines being used as a set, the data line drive circuit time-divisionally outputting a prescribed number of data signals to be transmitted from each of the plurality of output terminals through a prescribed number of data lines corresponding to the each of the plurality of output terminals;

an output selecting circuit including a plurality of demultiplexers respectively connected to the plurality of output terminals of the data line drive circuit and respectively corresponding to the plurality of sets of data line groups; and a scanning line drive circuit selectively driving the plurality of scanning lines, wherein each of the plurality of pixel circuits corresponds to any one of the plurality of data lines and corresponds to any one of the plurality of scanning lines, each pixel circuit includes a display element driven by a current, a holding capacitor that holds a voltage controlling a drive current for the display element, and a driving transistor that applies the drive current corresponding to the voltage held by the holding capacitor to the display element, and applies a voltage of a corresponding data line via the driving transistor to the holding capacitor due to the driving transistor in a diode-connected state in a case where a corresponding scanning line is in a select state, a period included in a period from or after a time point when supplying a data signal output starts in each of horizontal intervals last among the prescribed number of data signals to a time point before a time point when supplying the data signal ends is set in advance as a delay period, each demultiplexer demultiplexes the prescribed number of data signals output in each of the horizontal intervals during the horizontal interval and supplies the demultiplexed data signals respectively to the prescribed number of data lines, the scanning line drive circuit starts to select a scanning line corresponding to the pixel circuit to which the prescribed number of data signals are supplied, when the delay period of each of the horizontal intervals ends, and in a case where a delay of the data signal is larger than a delay of the scanning signal, the delay period is set to be longer as a distance from the demultiplexer to a scanning line connected to the pixel circuit into which the prescribed number of data signals are to be written is longer.

12. The display device according to claim 11, wherein a time point when selecting the scanning line ends is a time point after the time point when to end supplying the data signal.

13. The display device according to claim 11, wherein the delay period has a value satisfying a following relationship, $$DL \geq 1H - SCN - A - (n-1) \times TVD(\max)$$

where DL represents the delay period, 1H represents one horizontal interval, SCN represents a scanning line reversal period, n represents a number of multiplexed data signals, TVD(max) represents a maximum video settling time, and A represents a total period of adjustment periods between signals.

14. The display device according to claim 13, wherein the delay period is at least equal to or more than 0.4 μs.

15. The display device according to claim 11, wherein the delay period has a value satisfying a following relationship, $$DL \leq 1H - SCN(\min) - A - (n-1) \times TVD(\max)$$

where DL represents the delay period, 1H represents one horizontal interval, SCN(min) represents a shortest scanning line reversal period required for writing the data signals applied in one horizontal interval into a corresponding pixel circuit, n represents a number of multiplexed data signals, TVD(max) represents a maximum video settling time, and A represents a total period of adjustment periods between signals.

16. The display device according to claim 11, wherein the prescribed number of data signals includes a first data signal and a second data signal, the demultiplexer includes a first selecting transistor that selects the first data signal from the prescribed number of data signals output during the horizontal intervals to supply to a first data line, and a second selecting transistor that selects the second data signal to supply to a second data line, and the first selecting transistor supplies the first data signal to the first data line, and the second selecting transistor supplies the second data signal to the second data line after the first data signal is supplied to the first data line.

17. The display device according to claim 16, wherein the demultiplexer changes an order of the data signals selected from the prescribed number of data signals for each of the horizontal intervals.

18. The display device according to claim 16, wherein the demultiplexer changes an order of the data signals selected from the prescribed number of data signals for each vertical interval.

19. The display device according to claim 16, wherein the first data signal includes two kinds of data signals respectively expressing images of two kinds of colors, and the second data signal is a data signal expressing an image of a color different from the first data signal, and the first selecting transistor alternately supplies the two kinds of data signals included in the first data signal to the first data line for each of the horizontal intervals, and the second selecting transistor supplies the second data signal to the second data line for each of the horizontal intervals.

20. The display device according to claim 11, wherein in the case where the delay of the data signal is larger than the delay of the scanning signal, as the distance from the demultiplexer to the scanning line connected to the pixel circuit into which the prescribed number of data signals are to be written is longer, a corresponding scanning line select period is set to be shorter.

* * * * *